(12) United States Patent
Takeuchi et al.

(10) Patent No.: US 7,109,962 B2
(45) Date of Patent: Sep. 19, 2006

(54) DISPLAY DEVICE

(75) Inventors: Yukihisa Takeuchi, Nishikamo-gun (JP); Tsutomu Nanataki, Toyoake (JP); Iwao Ohwada, Nagoya (JP); Yasuharu Kuno, Nagoya (JP); Takayoshi Akao, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 344 days.

(21) Appl. No.: 10/397,043

(22) Filed: Mar. 25, 2003

(65) Prior Publication Data

US 2003/0231156 A1 Dec. 18, 2003

Related U.S. Application Data

(63) Continuation-in-part of application No. 10/163,069, filed on Jun. 5, 2002, now abandoned.

(30) Foreign Application Priority Data

| Jun. 4, 2002 | (JP) | ............................. 2002-163194 |
| Aug. 15, 2002 | (JP) | ............................. 2002-237094 |
| Mar. 24, 2003 | (JP) | ............................. 2003-081515 |

(51) Int. Cl.
  *G09G 3/36* (2006.01)

(52) U.S. Cl. ......................................... 345/92; 345/98

(58) Field of Classification Search ................. 345/80, 345/83, 87, 90, 92, 94, 96, 98, 99, 100, 204, 345/88, 84, 93
See application file for complete search history.

(56) References Cited

U.S. PATENT DOCUMENTS

| 5,757,008 | A | 5/1998 | Akagawa et al. |
| 5,862,275 | A | 1/1999 | Takeuchi et al. |
| 6,281,868 | B1 | 8/2001 | Takeuchi et al. |
| 6,323,833 | B1 | 11/2001 | Takeuchi et al. |
| 6,426,734 | B1 | 7/2002 | Sano |
| 6,437,764 | B1 * | 8/2002 | Suzuki et al. .................. 345/87 |
| 6,452,583 | B1 | 9/2002 | Takeuchi et al. |
| 6,483,492 | B1 | 11/2002 | Takeuchi et al. |
| 6,628,258 | B1 | 9/2003 | Nakamura |
| 6,707,438 | B1 | 3/2004 | Ishizuka et al. |
| 6,720,958 | B1 | 4/2004 | Walsh |
| 6,724,378 | B1 | 4/2004 | Tamura et al. |
| 6,778,162 | B1 | 8/2004 | Kimura et al. |
| 6,819,317 | B1 | 11/2004 | Komura et al. |

(Continued)

FOREIGN PATENT DOCUMENTS

EP 0 675 477 A1 10/1995

(Continued)

OTHER PUBLICATIONS

U.S. Appl. No. 09/570,697, filed May 12, 2000, Takeuchi et al.

*Primary Examiner*—Vijay Shankar
*Assistant Examiner*—Nitin Patel
(74) *Attorney, Agent, or Firm*—Burr & Brown

(57) ABSTRACT

A display device has drive circuits each having a logic gate for inhibiting the inputting of a data signal from a signal line when unselected and permitting the inputting of a data signal from the signal line when selected, based on a drive signal (select voltage) applied from a select line, a capacitor for holding the output of the logic gate when selected and outputting the held output as a control voltage, and a drive voltage generating circuit for generating a drive voltage for displacing the actuator based on the control voltage from the capacitor.

19 Claims, 49 Drawing Sheets

U.S. PATENT DOCUMENTS

2002/0030779 A1* 3/2002 Takahashi et al. .......... 349/139
2003/0016202 A1 1/2003 Edwards et al.
2003/0201986 A1 10/2003 Willis et al.

FOREIGN PATENT DOCUMENTS

| GB | 2 251 511 A | 7/1992 |
| JP | 7-287176 | 10/1995 |
| JP | 10-78549 | 3/1998 |
| WO | WO98/54609 | 12/1998 |

* cited by examiner

FIG. 11

| Ss | Sd | VG (M1) | M1 | VG (M2) | M2 | VC1 | M3 | Vd | PIXEL |
|---|---|---|---|---|---|---|---|---|---|
| 0 | 0 | 1 | OFF | 0 | OFF | – | – | – | – |
| 0 | 1 | 1 | OFF | 0 | OFF | – | – | – | – |
| 1 | 0 | 1 | OFF | 1 | ON | 0 | OFF | 60V | ON |
| 1 | 1 | 0 | ON | 0 | OFF | 1 | ON | 0V | OFF |

FIG. 14

| Ss | Sd | VG1 | VG(M4) | M4 | VG(M3) | M3 | Vd | PIXEL |
|---|---|---|---|---|---|---|---|---|
| 0 | 0 | – | – | – | – | – | – | – |
| 0 | 1 | – | – | – | – | – | – | – |
| 1 | 0 | 0 | 0 | ON | 0 | OFF | 60V | ON |
| 1 | 1 | 1 | 1 | OFF | 1 | ON | 0V | OFF |

FIG. 17

| Ss | Sd | VC1 | VG (M4) | M4 | VG (M3) | M3 | Vd | PIXEL |
|---|---|---|---|---|---|---|---|---|
| 0 | 0 | – | – | – | – | – | – | – |
| 0 | 1 | – | – | – | – | – | – | – |
| 1 | 0 | 0 | 0 | ON | 0 | OFF | 60V | ON |
| 1 | 1 | 1 | 1 | OFF | 1 | ON | 0V | OFF |

FIG. 45

| | | DRIVE TIME [hr] | 0 | 16 | 52 | 64 | 78 | 90 | 150 | 162 | 303 | 363 | 451 |
|---|---|---|---|---|---|---|---|---|---|---|---|---|---|
| COMPARATIVE EXAMPLE | WITHOUT VENT HOLES | LEAKAGE CURRENT [mA] | 0.0 | 7.5 | 2000 | 6700 | (FINISHED) | | | | | | |
| | | DEFECTIVE ELEMENT GROWTH RATE [%] | 0 | | 0.05 | 16.0 | | | | | | | |
| INVENTIVE EXAMPLE | DIAMETER:100, TWO VENT HOLES | LEAKAGE CURRENT [mA] | 0.1 | 0.2 | 5 | 16 | 36 | 59 | 93 | 12 | 43 | 108 | 196 |
| | | DEFECTIVE ELEMENT GROWTH RATE [%] | 0 | | | 0 | | | | | 0.5 | 0.7 | 1.3 |

DISPLAY DEVICE

CROSS REFERENCE TO RELATED APPLICATION

This application is a continuation-in-part application of U.S. application Ser. No. 10/163,069 filed Jun. 5, 2002 now abandoned, the entirety of which is incorporated herein by reference.

BACKGROUND OF THE INVENTION

1. Field of the Invention

The present invention relates to a display device comprising a display unit which has an array of capacitive elements arranged at respective pixels and displaceable for turning on and off the corresponding pixels, and a drive unit which has an array of drive circuits arranged at respective pixels for driving the corresponding capacitive elements in response to input signals.

2. Description of the Related Art

The applicant of the present application has proposed a display device employing ceramic components as disclosed in Japanese laid-open patent publication No. 7-287176, for example. As shown in FIG. 46 of the accompanying drawings, the proposed display device has an array of actuators 200 associated with respective pixels. Each of the actuators 200 has an actuator unit 208 comprising a piezoelectric/electrostrictive layer 202, an upper electrode 204 mounted on an upper surface of the piezoelectric/electrostrictive layer 202, and a lower electrode 206 mounted on a lower surface of the piezoelectric/electrostrictive layer 202, and a base body 214 comprising a vibrator 210 disposed underneath the actuator unit 208 and a stationary block 212 joined to the vibrator 210. The lower electrode 206 is held against the vibrator 210, which supports the actuator unit 208 thereon.

The vibrator 210 and the stationary block 212 are integrally formed of ceramics. The base body 214 has a recess 216 defined therein beneath the vibrator 210 so that the vibrator 210 is thinner than the stationary block 212.

A displacement transfer element 220 for providing a predetermined area of contact with an optical waveguide panel 218 is joined to the upper electrode 204. In FIG. 46, when the actuator 200 is in a normal state in which it is held at rest, the displacement transfer element 220 is positioned in the vicinity of the optical waveguide panel 218, and when the actuator 200 is in an energized state, the displacement transfer element 220 is brought into contact with the optical waveguide panel 218 by a distance equal to or smaller than the wavelength of light.

Light 222 is introduced into the optical waveguide panel 218 from a lateral end thereof, for example. The optical waveguide panel 218 has its refractive index pre-adjusted to cause all the light 222 to be totally reflected within the optical waveguide panel 218 without passing through front and rear surfaces thereof. When a voltage signal depending on the attributes of an image signal is selectively applied to the actuator 200 via the upper electrode 204 and the lower electrode 206 to hold the actuator 200 in the normal state or displace the actuator 200 in the energized state, for thereby controlling the movement of the displacement transfer element 220 into or out of contact with optical waveguide panel 218. Thus, dispersed light (leaking light) 224 from a given area, aligned with the actuator 200, of the optical waveguide panel 218 is controlled to display an image depending on the image signal on the optical waveguide panel 218.

The proposed display device is advantageous in that (1) the power consumption thereof can be reduced, (2) the illuminance of the display screen can be increased, and (3) when it is used in color display applications, it does not need to have more pixels than black-and-white display apparatus.

FIG. 47 of the accompanying drawings shows the above display device including peripheral circuits. The display device includes a display unit 230 having a matrix of pixels, and the peripheral circuits include a vertical shift circuit 234 from which there extend as many vertical select lines 232 as the number of rows of pixels, each of the vertical select lines 232 being shared by a number of pixels (a group of pixels) making up one row, and a horizontal shift circuit 238 from which there extend as many horizontal signal lines 236 as the number of columns of pixels, each of the horizontal signal lines 236 being shared by a number of pixels (a group of pixels) making up one column.

Display information (output voltage) outputted from horizontal shift circuit 238 to a group of pixels in a selected row is also applied to a group of pixels in unselected rows, resulting in the driving of unnecessary pixels (actuators). Therefore, the display device consumes an unwanted amount of electric energy, and is not suitable for low power consumption designs.

When all the rows are selected in a vertical scanning period, the display screen fails to produce images of high illuminance because the pixels emit light only in a period of time represented by (vertical scanning period/required number of selected rows).

As shown in FIG. 48 or the accompanying drawings, one solution would be to use horizontal shift circuits 238 associated with the respective rows. The solution, however, is disadvantageous in that the resultant circuit arrangement would be very complex.

The applicant has proposed a new display device in order to solve the above problems (see the International Publication No. WO98/54609).

As shown in FIG. 49 of the accompanying drawings, the proposed display device, denoted by 300, has a switching thin film transistor (TFT) 308 disposed in the vicinity of an actuator 306 which comprises a lower electrode 302b, a shape holding layer 304, and an upper electrode 302a that are disposed on a drive unit.

The upper electrode 302a of the actuator 306 and a source/drain region 310 of the TFT 308 are electrically connected to each other by a contact 312. A select line 314 and a gate electrode of the TFT 308 are electrically connected to each other by a contact 316. A signal line 318 and a source/drain region 320 of the TFT 308 are electrically connected to each other by a contact 322.

With the above arrangement, it is possible to lower the power consumption, increase the illuminance, and simplify the formation of interconnections of the display device 300 which employs the actuator 306 including the shape holding layer 304.

The actuator 306 has a capacitor structure having a pair of electrodes and needs to be energized under a high voltage with a large current because the electrodes have a large electrostatic capacitance. The TFT 308 used as a switching element has to be large in size in order to increase its withstand voltage and output current.

Therefore, the actuator 306 fails to provide a sufficient area for use as a pixel, or the pixel provided by the actuator 306 has a small aperture ratio.

If switching elements are constructed separately as an IC, then a number of interconnections need to be provided between a drive circuit which has as many switching elements as the number of pixels and a board on which actuators 306 are formed (actuator board). The proposal thus poses a new problem in that it is difficult to form interconnection patterns on the actuator board.

SUMMARY OF THE INVENTION

The present invention has been made in view of the above problems. It is an object of the present invention to provide a display device which allows circuits for applying drive voltages to capacitive elements (such as actuators, etc.) to be operated at signal levels that are used in general logic circuits, and which makes it possible to reduce the size of a drive circuit system.

Another object of the present invention is to provide a display device which allows TFTs, for example, used as circuits for applying drive voltages to capacitive elements to be reduced in size, and hence allows TFTs that have a high withstand voltage and a large output current to be constructed in spaces corresponding to the respective areas of capacitive elements.

Still another object of the present invention is to provide a display device which prevents circuits for applying drive voltages to capacitive elements from reducing pixel areas, thereby allowing the pixels to have a desired aperture ratio.

According to the present invention, a display device comprises a display unit having capacitive elements arrayed at respective pixels and displaceable for turning on and off the corresponding pixels, a plurality of select lines for supplying instructions to select and unselect the pixels, a plurality of signals lines for supplying pixel signals to the pixels which have been selected, and a drive unit having drive circuits arrayed at respective pixels each for driving the corresponding capacitive element in response to an instruction from one of the select lines and a signal from one of the signal lines, each of the drive circuits having a logic gate for inhibiting the inputting of a signal from the signal line when unselected and permitting the inputting of a signal from the signal line when selected, based on a select voltage applied from one of the select lines, a capacitor for holding the output of the logic gate when selected and outputting the held output as a control voltage, and a drive voltage generating circuit for generating a drive voltage for displacing the capacitive element based on the control voltage.

When a pixel is selected, a signal from a signal line inputted through the logic gate is held by the capacitor. When the pixel is unselected, the signal supplied when it was previously selected remains held by the capacitor. The signal held by the capacitor is applied as a control voltage to the drive voltage generating circuit at a later stage.

Specifically, when a first row of pixels are selected, signals from the signal lines are held by the respective capacitors associated with those pixels. When the pixels are subsequently unselected, the signals from the signal lines are not supplied to the capacitors as the inputting thereof is inhibited by the logic gates, and the capacitors hold the signals applied when the first row of pixels were selected. When the first row of pixels are selected again in a next frame (or a next field), the signals from the signal lines are supplied through the logic gates to the capacitors and held thereby.

The signal held by the capacitor is applied as the control voltage to the drive voltage generating circuit, which generates a drive voltage for displacing the capacitive element based on the control voltage. When selected, the capacitive element is displaced based on the control voltage depending on the signal from the signal line, and when unselected, the capacitive element remains displaced in the same manner as when previously selected.

The above operation is repeated in each frame (or field) to display an image on the display unit.

As described above, the drive voltage generating circuit generates a drive voltage for displacing the capacitive element based on the control voltage from the capacitor. The capacitor holds the output voltage of the logic gate, and applies the held voltage as the control voltage to the drive voltage generating circuit.

Therefore, signal levels used in general logic circuits are applied to the drive voltage generating circuit. The signal levels include a 5 V logic level such as a 5 V TTL level or a 5 V CMOS level, or a low logic voltage such as 3.3 V logic level.

Since the drive voltage generating circuit for applying the drive voltage to the capacitive element can be operated at signal levels used in general logic circuits, the drive circuit system can be reduced in size.

A binary output of a low logic voltage may be used as the control voltage and the select voltage.

In the above arrangement, each of the capacitive elements may have a capacitive structure having a pair of electrodes, and the drive voltage generating circuit may have a thin film transistor having a gate to which the control voltage is applicable and a drain connected to one of the electrodes of the capacitive element.

When the thin film transistor is turned off, a high-level potential of a power supply connected to the drain is applied to one of the electrodes of the capacitive element. When the thin film transistor is turned on, a low-level potential of a power supply connected to the source is applied to one of the electrodes of the capacitive element. The turning on and off of thin film transistor is controlled by the voltage (control voltage) held by the capacitor and applied to the gate.

Because a signal level used in general logic circuits is applied to the gate of the thin film transistor, the withstand voltage of the gate may be similar to those of thin film transistors used as ordinary switching elements. It is not necessary to design the film transistor for a high-withstand-voltage structure for use with a voltage of 50 V or higher to be applied to the gate. The size of the thin film transistor may be smaller than those thin film transistors customized for high-withstand-voltage designs. This is advantageous in forming the thin film transistor in a space corresponding to the area of the capacitive element.

The drive voltage generating circuit may comprise a push-pull circuit having a first thin film transistor and a second thin film transistor having respective gates to which the control voltage is applicable and connected in series to each other at a junction which is connected to one of the electrodes of the capacitive element.

With this arrangement, since a signal level used in general logic circuits is also applied to the gate of the thin film transistor, the size of the thin film transistors may be smaller than those thin film transistors customized for high-withstand-voltage designs.

The first thin film transistor and the second thin film transistor are connected in series between a power supply of a high voltage, and a power supply of a low voltage. As for the second thin film transistor, it is desirable to have four terminals. Namely, as for the second thin film transistor, power supply of the high voltage is connected. A bias terminal is connected to the semiconductor substrate of the second thin film transistor. The bias terminal is electrically separated from the source of the said second thin film transistor.

A push pull circuit has a series circuit to which the p-channel thin film transistor and the n-channel thin film transistor were connected in series. The push pull circuit obtains an output from the common drain of the p-channel thin film transistor and n-channel thin film transistor. In this case, the source of the p-channel thin film transistor is electrically connected to the power supply of the high voltage. The source of the n-channel thin film transistor is electrically connected to the power supply of the low voltage. And the voltage more than the high voltage is applied to the gate of the p-channel thin film transistor. Therefore, in the gate of the p-channel thin film transistor, it is desirable to connect a protection circuit. However, since this protection circuit has a capacitor and a Zener diode, it is complicated.

On the other hand, the second thin film transistor of this invention has the bias terminal connected to a semiconductor substrate. The bias terminal is electrically separated from source. That is, the second thin film transistor has four terminals. Therefore, the gate voltage of the second thin film transistor is controllable based on the bias voltage (independent fixed voltage) supplied to the semiconductor substrate.

Therefore, the voltage, which is unrelated to the high voltage, can be supplied to the gate of the second thin film transistor. That is, a signal level used for the ordinary logic circuit can be supplied to the gate of the second thin film transistor. Therefore, a protection circuit is omissible. The circuit using the push pull circuit is simple.

The first thin film transistor is n-channel thin film transistor or p-channel thin film transistor. The second thin film transistor is n-channel thin film transistor or p-channel thin film transistor. For example, the first thin film transistor is n-channel thin film transistor. The second thin film transistor is n-channel thin film transistor. In this case, a control voltage is supplied to the gate of the second thin film transistor through an inverter.

Generally, the push pull circuit has p-channel thin film transistor and n-channel thin film transistor. However, this invention can constitute the push pull circuit from two n-channel thin film transistors or two p-channel thin film transistors as mentioned above. Therefore, this invention can produce the circuit which has the push pull circuit by the material (for example, CdSe material etc.) which can form only n-channel.

Of course, the p-channel thin film transistor is sufficient as the second thin film transistor. In this case, the control voltage can be directly supplied to the gate of the second thin film transistor, without using an inverter. Therefore, the drive voltage generating circuit is simple.

The drive voltage generating circuit has the first thin film transistor and a second thin film transistor. The second thin film transistor is used as a pull-up resistance. In this case, the control voltage is supplied to the gate of the first thin film transistor. The second thin film transistor is connected between the first thin film transistor and the power supply. This second thin film transistor controls a output current supplied to the capacitive element.

The second thin film transistor of this invention has the bias terminal connected to a semiconductor substrate. The bias terminal is electrically separated from source. That is, the second thin film transistor has four terminals. Therefore, the gate voltage of the second thin film transistor is controllable based on the bias voltage (independent fixed voltage) supplied to the semiconductor substrate.

Here, the conditions of the voltage (threshold voltage) Vt required in order to pass drain current are explained. When the second thin film transistor is a n-channel depletion mode FET, the above-mentioned conditions are Vg−Vsg>Vt. The Vg is the gate voltage of the second thin film transistor and the Vsg is the bias voltage. When the second thin film transistor is a p-channel enhancement mode FET, the above-mentioned conditions are Vg−Vsg<Vt. If it is Vg=Vsg=Vss (grounding voltage), it is not necessary to prepare a new power supply line. The design of the display becomes easy. The manufacture cost of the display is also reduced.

On the other hand, when the second thin film transistor is a p-channel depletion mode FET, the above-mentioned conditions are Vg−Vsg<Vt. When the second thin film transistor is a n-channel enhancement type FET, the above mentioned conditions are Vg−Vsg>Vt. If it is Vg−Vsg−Vdd (logic voltage), it is not necessary to prepare a new power supply line. The design of a drive voltage generating circuit becomes easy. The manufacture cost of a drive voltage generating circuit is also reduced.

Furthermore, as for the second thin film transistor, it is desirable that the gate and the source are connected electrically.

That is, the source voltage of the second thin film transistor is set to the power supply voltage level in the period of OFF of the first thin film transistor. This source voltage is applied to the gate of the second thin film transistor. The drain current of the second thin film transistor increases. That is, the resistance of the second thin film transistor becomes low. The time constant of CR by the capacity of the capacitive element and the resistance of the second thin film transistor becomes small. The Charging of the capacitive element is performed at high speed.

On the other hand, the source voltage of the second thin film transistor is set to the source voltage level (for example, grounding voltage level) of the first thin film transistor in the period of ON of the first thin film transistor. This voltage is applied to the gate of the second thin film transistor. The drain current of the second thin film transistor decreases. That is, the resistance of the second thin film transistor becomes high. The second thin film transistor functions as the pull-up resistance. In this case, the potential of one electrode of the capacitive element turns into the source potential (for example, grounding potential) of the first thin film transistor by a voltage-drop in the second thin film transistor. That is, the power consumption by the power supply voltage applied to the second thin film transistor becomes low.

The logic gate may comprise an analog switch. Therefore, the overall size of the logic circuit may be reduced, resulting in an advantage in forming the logic gate within a space corresponding to the area of the capacitive element with a thin film transistor together with the drive voltage generating circuit.

The logic gate may alternatively comprise a transfer gate. In this case, the logic gate may be constructed of one transistor, allowing the logic gate within a space corresponding to the area of the capacitive element with a thin film transistor together with the drive voltage generating circuit.

If the drive circuit comprises a thin film transistor, then the transistors can be fabricated in one conductivity type (e.g., an n channel).

If the drive voltage generating circuit employs the push-pull circuit as described above, then it can provide an area where the thin film transistor is to be formed, but requires two conductivity types, i.e., a p channel and an n channel. If the drive voltage generating circuit comprises a single thin film transistor (n channel) and a voltage drop resistor connected between the drain of the thin film transistor and the power supply, then the drive voltage generating circuit needs only one conductivity type, but may fail to provide an area where the thin film transistor is to be formed because a thin film resistor requires a large area.

If depletion thin film transistor is used as the resistor, then all the thin film transistors can be constructed of one conductivity type (e.g., an n channel), making it possible to use a material such as a CdSe material which can produce an n channel only.

According to the present invention, another display device comprises a plurality of capacitive elements arrayed at respective pixels and displaceable for turning one and off the corresponding pixels, a plurality of select lines for supplying select and unselect signals to the pixels, a plurality of signals lines for supplying pixel signals to the pixels which have been selected, and a drive unit having drive circuits arrayed at respective pixels each for driving the corresponding capacitive element in response to an instruction from one of the select lines and a signal from one of the signal lines, each of the drive circuits having a transistor having a drain for being supplied with a signal from one of the signal lines and a gate for being supplied with a signal from one of the select lines, for applying a drive voltage to displace the capacitive element, a capacitor for keeping the drive voltage when unselected at a constant level, the gate of the transistor and the select line being AC-coupled by the capacitor, and a resistor connected between a junction between the gate of the transistor and the capacitor and the source of the transistor.

When a pixel is selected, the transistor is turned on, applying a drive voltage based on a signal from a signal line to the capacitive element. When the pixel is unselected, the drive signal supplied when it was previously selected remains applied to the capacitive element.

Inasmuch as the gate of the transistor and the select line are AC coupled, the voltage of the source is reflected in the gate by a resistor connected between the junction between the gate of the transistor and the capacitor and the source of the transistor. Consequently, the voltage supplied to the select line may be a binary output of a low logic voltage irrespective of the voltage applied to the source of the transistor.

Furthermore, since the withstand voltage of the gate of the transistor may be considered based on a low logic voltage, the size of a drive circuit system may be reduced, offering an advantage for the fabrication of the transistor in a space corresponding to the area of the capacitive element.

If a transistor (including a thin film transistor) is used as the drive voltage generating circuit, then the channel length of the transistor determines the withstand voltage, and the channel width thereof determines the drain current.

As the capacitive element is electrostatically capacitive, it is important to supply a large drain current for charging and discharging the capacitive element at a high speed. To supply a large drain current, it is necessary to increase the channel width, resulting in a need for a transistor having a channel width which is extremely large as compared with its channel length.

This suggests that there is a limitation on the formation of a transistor in a limited space with a prescribed aspect ratio, in view of the fact that the aspect ratio of the planar shape of the capacitive element as the pixel is prescribed. According to the present invention, each of the thin film transistors comprises an array of small-size transistors, the small-size transistors having respective sources and drains connected in common and constructed as a single module for performing switching operation with a common gate signal.

Specifically, the single module comprising an array of small-size transistors each having a small channel width is used as the transistor of the drive voltage generating circuit. These small-size transistors have their sources and drains connected in common (current paths of the drains and the sources are parallel to each other), and are energized by a common gate signal.

With this arrangement, it is possible to make flexible the layout of the area where the transistor is to be formed.

According to the present invention, still another display device comprises a plurality of capacitive elements arrayed at respective pixels and displaceable for turning on and off the corresponding pixels, a plurality of select lines for supplying reset, select, and unselect signals to the pixels, a plurality of signals lines for supplying pixel signals to the pixels which have been selected, and a drive unit having drive circuits arranged at respective pixels each for driving the corresponding capacitive element in response to an instruction from one of the select lines and a signal from one of the signal lines, each of the capacitive elements having a capacitive structure having a pair of electrodes, one of the electrodes being connected to one of the select lines, and each of the drive circuits having a two-terminal nonlinear device connected between the other electrodes of one of the capacitive elements and one of the signal lines.

When the select line outputs reset, select, and unselect signals whose levels are a reset level, each pixels is reset, i.e., extinguished.

The drive circuit operates in five modes, i.e., a reset mode (OFF), a select mode (ON), a select mode (OFF), an unselect mode (ON), and an unselect mode (OFF), based on some regularity, depending on the level of the reset, select, and unselect signals from the select line and the levels (ON/OFF) of the data signal from the signal line.

Specifically, when the levels of the reset, select, and unselect signals from the select line are a reset level, the drive voltage depending on the reset state is applied to each of the capacitive elements in the selected row. At this time, the pixels in the selected row are extinguished.

Thereafter, the row is supplied with a signal of an unselect level and a signal of an OFF level from the signal line. Therefore, a drive voltage depending on the unselect level and the OFF level is applied to each of the capacitive elements in the row. At this time, the pixels in the row remain extinguished.

Thereafter, when the row is supplied with a signal of a select level from the select lines, the pixels are supplied with a signal of an OFF level or a signal of an ON level from the signal line.

A drive signal depending on the select level and the OFF level is applied to those capacitive elements supplied with the signal of the OFF level. At this time, the pixels remain extinguished. A drive signal depending on the select level and the ON level is applied to those capacitive elements supplied with the signal of the ON level. At this time, the pixels are energized.

Thereafter, when the row is supplied with a signal of an unselect level from the select lines, the drive voltage supplied when previously selected remains applied to the capacitive elements in the row. Those pixels which were turned ON when selected remain energized, and those pixels which were turned OFF when selected remain extinguished.

Thereafter, when the row is supplied again with a signal of a select level from the select lines, the pixels are supplied with a signal of an OFF level or a signal of an ON level from the signal line. If the pixels are repeatedly turned on or off as when previously selected, the drive voltage supplied when previously selected remains applied to the capacitive elements in the row.

If a certain pixel which was turned off when previously selected is to be turned on when selected next time, then a drive voltage depending on the select level and the ON level is applied. At this time, the pixel is energized, for example.

If a certain pixel which was turned on when previously selected is to be turned off when selected next time, then at least the pixel has to be reset and unselected (turned off), and selected (turned off) in a state prior to the selection, resulting in a timing misalignment.

To avoid the above shortcoming, the continuation of an energized state following the continuation of an extinguished state may be carried out as a gradation expressing process for each frame as by (1) resetting the pixels in each frame to express a gradation starting from the reset state, i.e., the extinguished state, and (2) controlling the timing to change from the unselected (turned off) state to the selected (turned on) state depending on the gradation, and once the pixels are energized when selected (turned on), the energization is maintained until the pixels are reset.

At least the capacitive elements are preferably disposed on a first board and at least the drive unit is preferably disposed on a second board, the first board and the second board being bonded to each other.

With this arrangement, the capacitive elements which are directly involved in the aperture ratio of the pixels can be formed in an array without taking into account the area in which the drive circuits are formed, and the drive circuits can be formed in an array without taking into account the area in which the capacitive elements are formed.

Accordingly, the aperture ratio of the pixels can greatly be increased, and the layout of the drive circuits can freely be established, resulting in an increase in the selectivity of circuit components and an increase in the freedom of design. These advantages lead to a reduction in the cost of manufacture of the display device and an ability to fabricate the display device in a wide variety of arrangements depending on modes of use of the display device (environments in which the display device is installed and purposes for which the display device is used).

The select lines and the signal lines may be disposed on the second board. When the select lines and the signal lines are to be formed on the capacitive element board with the capacitive elements formed thereon, it is necessary to position the select lines and the signal lines along tortuous paths between the capacitive elements, and such a tortuous layout of the select lines and the signal lines tends to lower the freedom of interconnection design and produce parasitic inductances and parasitic resistances.

However, because the select lines and the signal lines, together with the drive circuits, are formed on the circuit board, the select lines and the signal lines can freely be laid out and formed irrespective of the layout of the capacitive elements, the freedom of interconnection design is increased, and it is expected that parasitic inductances and parasitic resistances can be reduced.

The drive voltage generating circuit of the drive unit may have an open-drain circuit arrangement and have a pull-up resistor disposed on the first substrate. With this structure, the number of thin film transistors or transistors formed on the second board can greatly be reduced.

And the following effects can be acquired by preparing the pull-up resistance in the first substrate. When adjusting the resistance of the pull-up resistance to the resistance which suits the electrostatic capacity of the capacitive element, it can carry out regardless of a circuit manufacture process prepared in the second substrate. Therefore, in the circuit manufacture to the second substrate, the troublesomeness of changing the pattern of the pull-up resistance separately is lost. The circuit which communalized specification to the electrostatic capacity of the capacitive elements can be manufactured. The design of the display becomes easy. The manufacture cost of the display is also reduced.

According to the present invention, still another display device comprises a display unit disposed on a first board and having capacitive elements arrayed at respective pixels and displaceable for turning on and off the corresponding pixels, and a drive unit disposed on a second board and having drive circuits arrayed at respective pixels each for driving the corresponding capacitive element in response to an input signal, the first board and the second board being bonded to each other, the second board having at least one vent hole defined therein.

In the above display device, the durability of the capacitive elements and the durability of the display device are greatly increased.

Specifically, the capacitive element may have its displacement capability (a displacement to be achieved under a given voltage) lowered due to usages over a long period of time, possibly failing to display an image properly. It has become clear that the reduction of the displacement capability is accelerated in the presence of moisture. It is generally known in the semiconductor and packaging technology that various defects are produced by moisture. In the display device based on the displacement control of the capacitive element, various defects such as insulation failures or interconnection breaks due to a peel-off between the electrodes and the piezoelectric/electrostrictive layer, cracks in the piezoelectric/electrostrictive layer, and a migration of the electrodes, the generation of leakage currents, and internal pressure changes and shape changes due to heating, electrolysis and chemical combination.

In order to reduce defects caused due to moisture, it is also generally practiced to use a vacuum seal and a seal in the presence of an inactive gas or nitrogen as effective methods. The vent holes can be used as a simple and highly effective method if it is difficult to use the above methods (using a vacuum seal and a seal in the presence of an inactive gas or nitrogen) or if it is difficult to achieve a complete seal.

Moisture may be present in the vicinity of the capacitive elements by being contained in the materials of the capacitive elements, absorbed in resin materials among those materials, or attached thereto in the fabrication process.

If the capacitive elements are sealed as they are, such moisture is confined in a closed space and remains present in the vicinity of the capacitive elements at all times.

Generally, resin materials are generally known for their property of adsorbing and holding moisture against separation. If such a material is used as a sealing material or board, then it is considered to have moisture permeability for allowing moisture to be introduced into the sealed internal space when placed in a highly humid environment. When the external space is lowered in moisture, the material is less liable to discharge the moisture in the sealing material and the boards into the external space.

As a result, the internal space is kept at a high level of humidity for a long period of time, accelerating degradation of the capacitive elements. Even when the temperature and humidity changes to the extent that no moisture condensation takes place the external space, moisture condensation may possibly take place in the sealed internal space, thus further accelerating degradation of the capacitive elements.

The vent holes are effective to discharge moisture in the internal space quickly into the external space, preventing the capacitive elements from being exposed to a highly humid environment for a long period of time. When the capacitive elements and their peripheral circuits are heated by being energized, the temperature in the vicinity of the capacitive elements rises higher than the ambient temperature, accelerating the discharge of moisture into the external space and making the capacitive elements drier against degradation.

Even if electrolysis and chemical combination occur in the presence of moisture, producing gases and combinations, the vent holes prevent pressure differences between the external space and the internal space. Consequently, it is possible to prevent shapes and dimensions from being changed due to pressure differences between the external space and the internal space, and also to prevent defects due to such changes in shapes and dimensions.

The second board may have one or more vent holes. Alternatively, the second board may comprise a porous board to provide the function of vent hole or holes. The vent hole or holes may be covered with a moisture-permeable film or mesh for the purpose of providing a dust-proof structure. The diameter of the vent hole or holes may be selected within a range which can serve the purpose of ventilation.

The display unit may have a light waveguide panel for introducing therein light from a light source, and may have a function to display an image depending on an image signal inputted thereto on the light waveguide panel by controlling the capacitive elements to be displaced into contact with and away from the light waveguide panel depending on an attribute of the image signal, thereby to control leakage light from regions of the light waveguide panel. For example, an actuator, a liquid crystal cell, a PDP cell, etc. can be used for the capacitive element.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 11 is a diagram showing the levels at points in the drive circuit according to the first specific example;

FIG. 14 is a diagram showing the levels at points in the drive circuit according to the second specific example;

FIG. 17 is a diagram showing the levels at points in the drive circuit according to the third specific example;

FIG. 27A is a circuit diagram showing a part of the third modification of the drive circuit according to the fifth specific example.

FIG. 45 is a table showing the results of experiments (measuring leak currents and defective element growth rates against drive hours);

DESCRIPTION OF THE PREFERRED EMBODIMENTS

Embodiments of display devices according to the present invention will be described below with reference to FIGS. 1 through 45.

Figure 1:
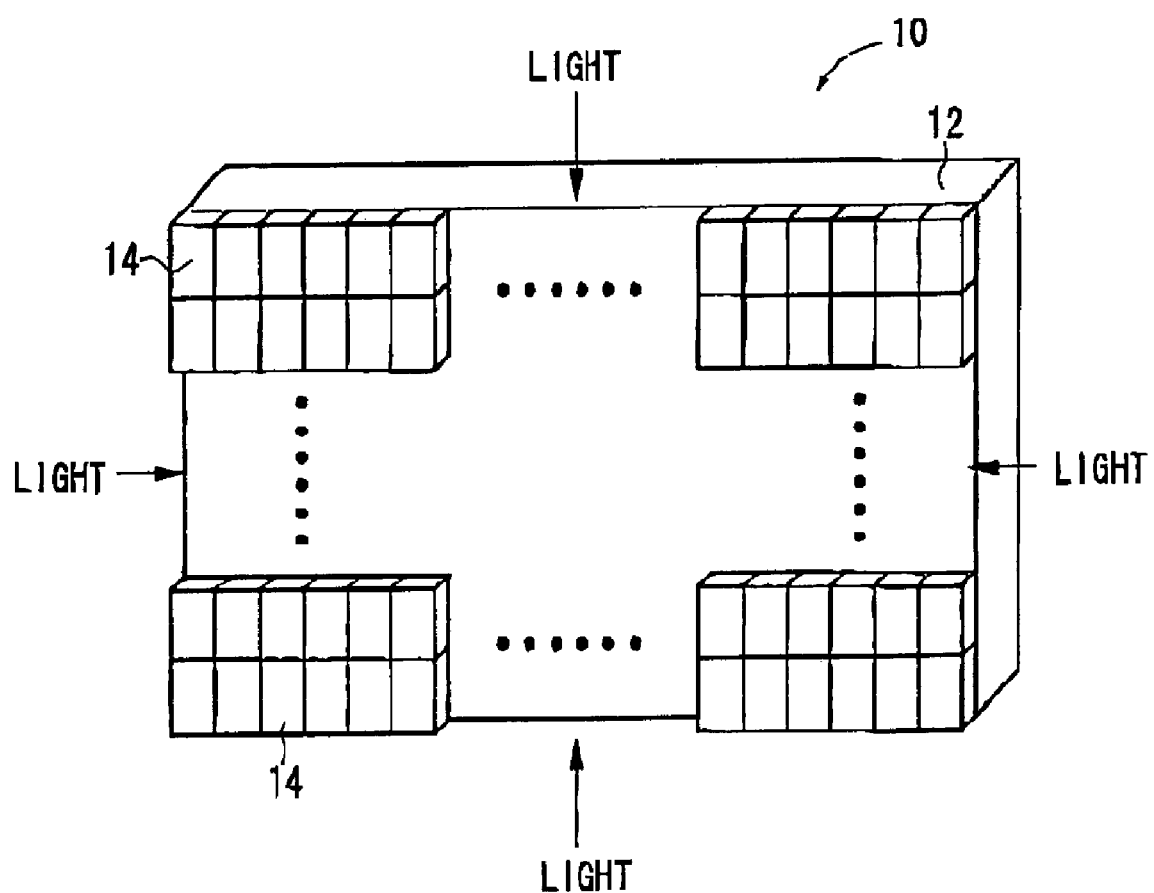
FIG. 1 is a perspective view of a display device according to an embodiment of the present invention.

As shown in FIG. 1, a display device 10 according to an embodiment of the present invention comprises a light guide panel 12 having a display area for the display device 10 and a plurality of display elements 14 mounted as a matrix on a rear surface of the light guide panel 12.

Figure 2:
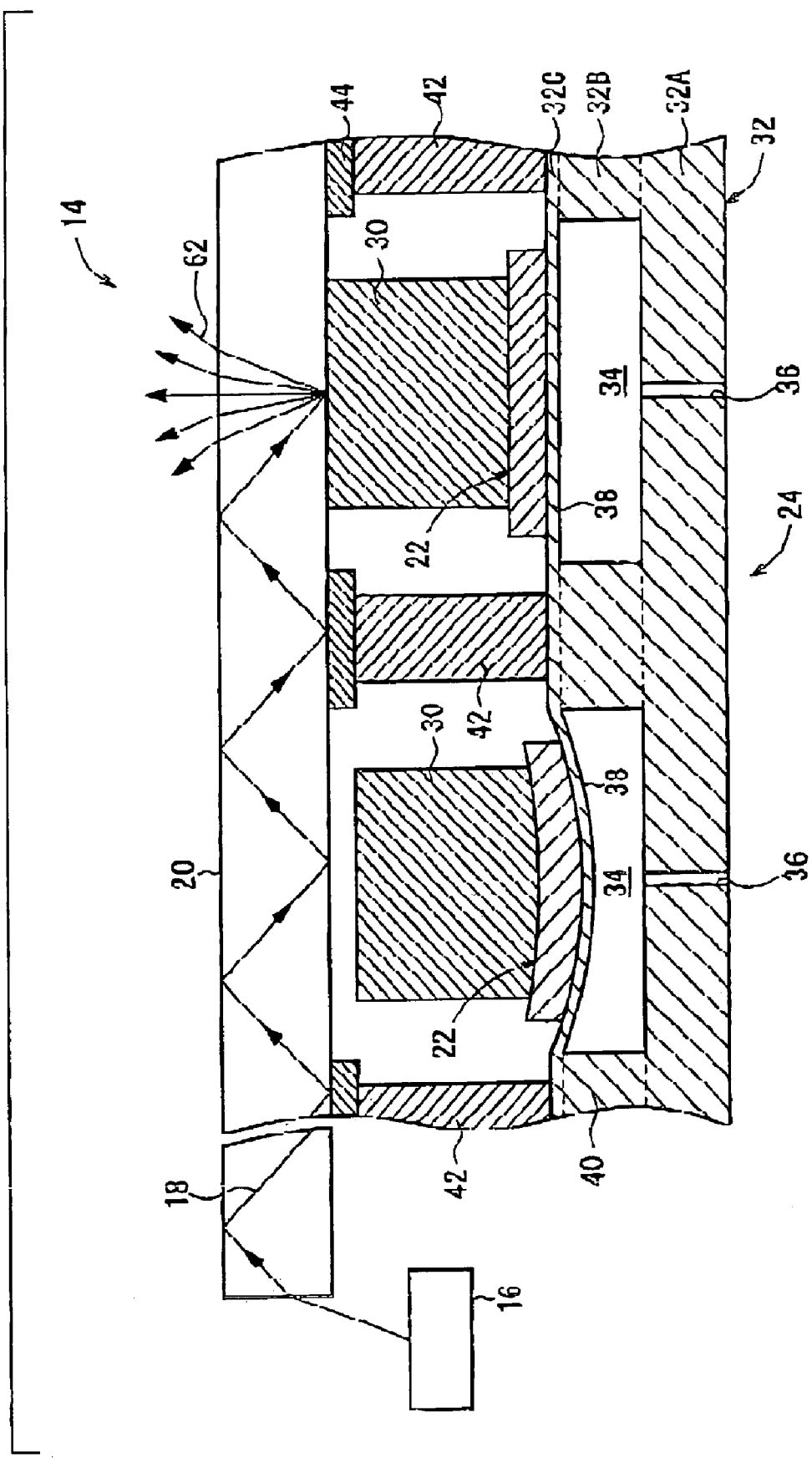
FIG. 2 is a fragmentary cross-sectional view of a display element.

As shown in FIG. 2, each of the display elements 14 comprises an optical waveguide panel 20 into which light 18 emitted from a light source 16 is introduced, and a display unit 24 disposed in confronting relation to a rear surface of the optical waveguide panel 20 and having a matrix or staggered array of capacitive elements 22 aligned with respective pixels. This embodiment is the example which applied the capacitive element 22 to the actuator. Therefore, the following explanation describes "the capacitive element 22" "the actuator 22."

Figure 3:
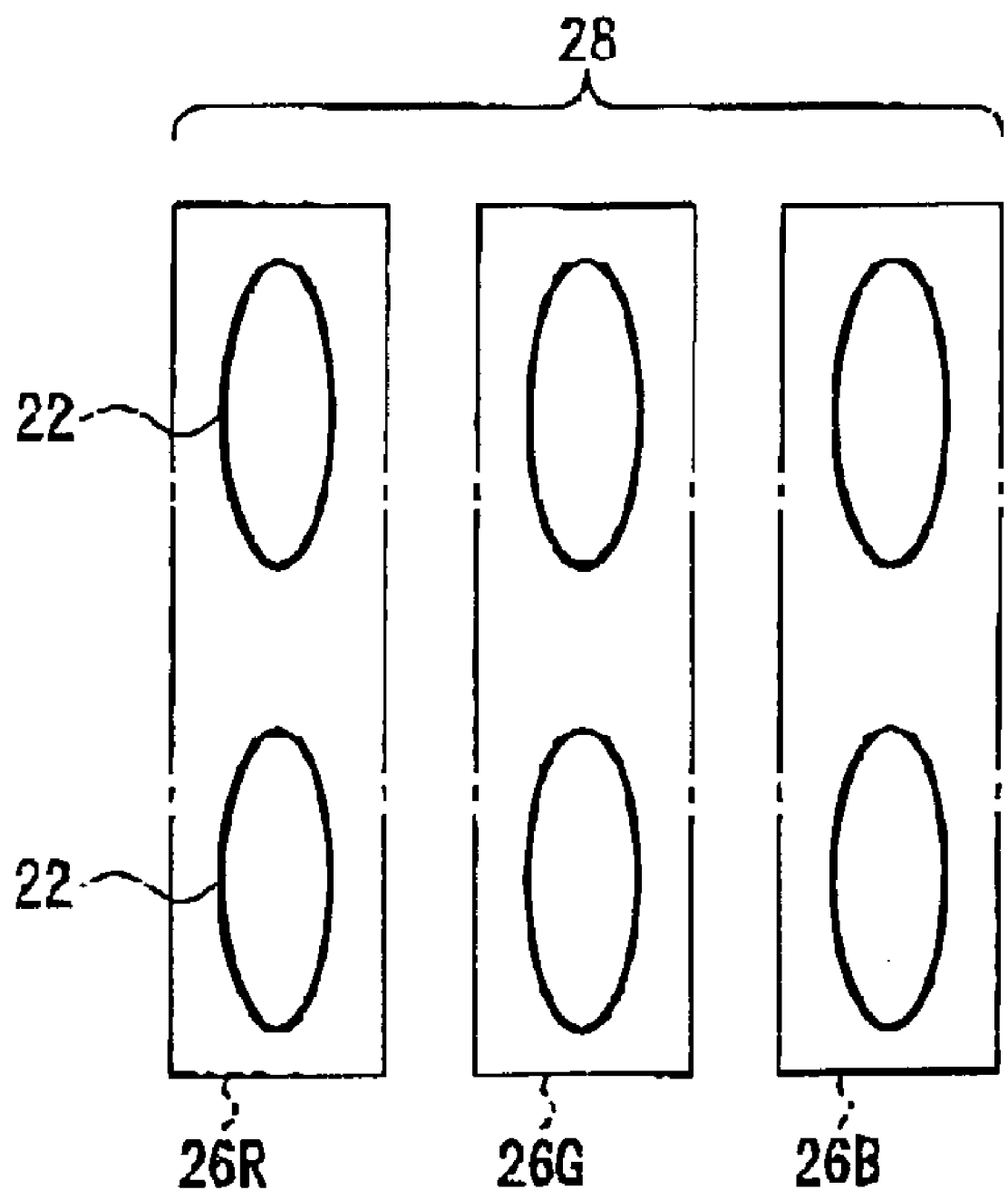
FIG. 3 is a view showing a pixel arrangement of the display element.

As shown in FIG. 3, two actuators 22 arrayed in a vertical direction make up a single dot, and three dots including a red dot 26R, a green dot 26G, and a blue dot 26B which are arrayed in a horizontal direction make up a single pixel 28. The pixels 28 of the display elements 14 shown in FIG. 1 are arranged in horizontal rows each containing 32 pixels (96 dots) and vertical columns each containing 32 pixels (32 dots).

As shown in FIG. 1, the display elements 14 of the display apparatus 10 are arranged on the rear surface of the light guide panel 12 in horizontal rows each containing 20 display elements 14 and vertical columns each containing 15 display elements 14, so that 640 pixels (1920 dots) are arrayed horizontally and 480 pixels (480 dots) are arrayed vertically according to VCA standards.

The light guide panel 12 comprises a panel such as a glass panel, an acrylic panel, or the like whose light transmittance in the visible light wavelength range is large and uniform. The display elements 14 are connected by wire bonding or soldering using end connectors, rear connectors, or the like, so that they can be supplied with necessary signals through connections therebetween.

The light guide panel 12 and the optical waveguide panel 20 of the display elements 14 should preferably be made of materials having similar refractive indexes. The light guide panel 12 and the optical waveguide panel 20 may be bonded to each other by a transparent adhesive or liquid that should preferably have a high and uniform light transmittance in the visible light wavelength range. The refractive index of the transparent adhesive or liquid should preferably be close to the refractive indexes of the light guide panel 12 and the optical waveguide panel 20 for achieving a desired level of brightness on the display screen of the display device 10.

As shown in FIG. 2, each display element 14 also includes pixel assemblies 30 disposed respectively on the actuators 22.

The display unit 24 has an actuator board 32 made of ceramics, for example, with the actuators 22 disposed on the actuator board 32 at respective positions corresponding to the pixels 28. The actuator board 32 has one continuous flat principal surface facing the rear surface of the optical waveguide panel 20. The actuator board 32 has a plurality of cavities 34 defined in the respective positions corresponding to the pixels 28 and serving part of vibrators (described below). The cavities 34 communicate with the space around the display element 14 via small-diameter through holes 36 which are defined in the opposite surface of the actuator board 32.

The actuator board 32 includes thin-wall portions lying over the respective cavities 34 and thick-wall portions extending between the thin-wall portions. The thin-wall portions function as vibrators 38 which can easily be vibrated under external stresses applied thereto. The thick-wall portions function as stationary blocks 40 supporting the vibrators 38 therebetween over the cavities 34.

The actuator board 32 thus constructed may be regarded as a unitary laminated structural body having a lowermost board layer 32A, an intermediate spacer layer 32B, and an uppermost thin layer 32C, with the cavities 34 defined in the spacer layer 32B in alignment with the respective actuators 22. The board layer 32A functions as both a stiffening board and a wiring board. The actuator board 32 may be of an integrally sintered structure or may be made up of separate layers which are combined together.

The board layer 32A, the spacer layer 32B, and the thin layer 32C should preferably be made of a material which is highly heat-resistant, highly strong, and highly tough, such as stabilized zirconium oxide, partially stabilized zirconium oxide, aluminum oxide, magnesium oxide, titanium oxide, spinel, mullite, or the like. The board layer 32A, the spacer layer 32B, and the thin layer 32C may be made of one material or different materials, respectively.

The thickness of the thin layer 32C is usually of 50 μm or smaller, and preferably in the range from 3 to 20 μm, in order to allow the actuator 22 to be displaced greatly.

Figure 4:
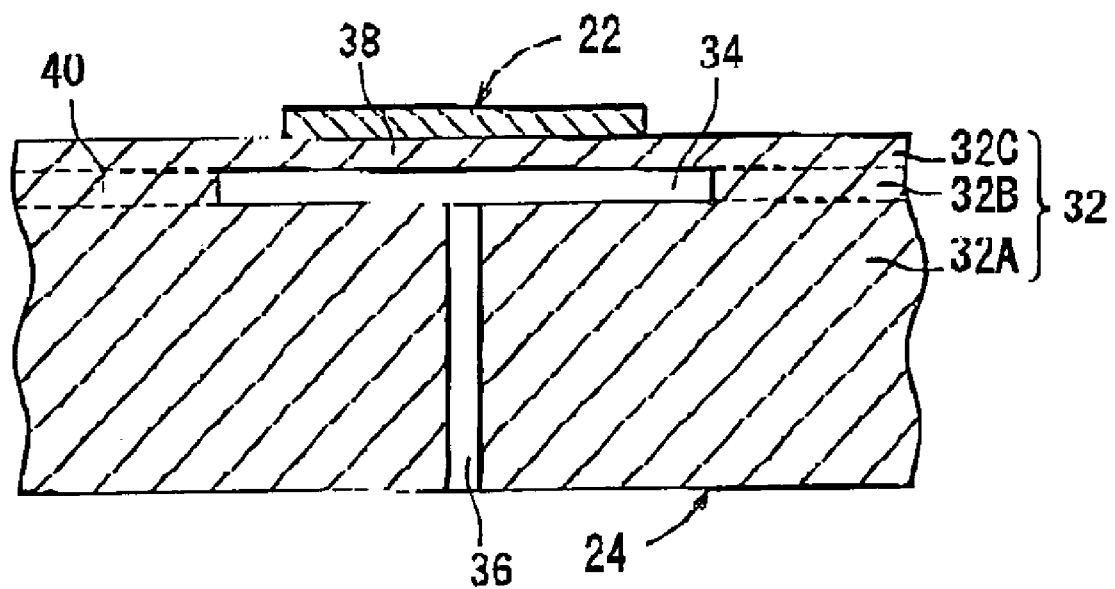
FIG. 4 is a fragmentary cross-sectional view of a display element with a thin spacer layer.

The spacer layer 32B may be present only for providing the cavities 34 in the actuator board 32, and is not limited to any particular thickness. The thickness of the spacer layer 32B may be determined depending on the purpose of the cavities 34. The spacer layer 32B should preferably be thin, as shown in FIG. 4, so that it does not have a thickness greater than necessary for the actuators 22 to function. For example, the thickness of the spacer layer 32B is preferably commensurate with the magnitude of the displacement of the actuators 22.

With the above arrangement, the flexing of the thin-wall portions (the vibrators 38) is limited by the board layer 32A which is positioned closely thereto in the direction in which the thin-wall portions are flexible. Therefore, the thin-wall portions are prevented from being broken under unexpected external forces. It is possible to stabilize the displacement of the actuators 22 to a certain value based on the ability of the board layer 32A to limit the flexing of the thin-wall portions.

With the spacer layer 32B being thin, the thickness of the actuator board 32 may be reduced and its flexural rigidity may be reduced. In bonding and fixing the actuator board 32 to another member (e.g., the optical waveguide panel 20), for example, the actuator board 32 is effectively corrected out of its warpage with respect to the optical waveguide panel 20. Therefore, the actuator board 32 can be bonded and fixed with increased reliability.

Since the actuator board 32 is thin as a whole, the amount of stock can be reduced in the manufacture of the actuator board 32. Thus, the actuator board 32 is of an advantageous structure from the standpoint of the manufacturing cost. Specifically, the thickness of the actuator board 32 should preferably be in the range from 3 to 50 μm and more preferably be in the range from 3 to 20 μm.

As the spacer layer 32B is thin, the thickness of the board layer 32A is generally of 50 μm or more and preferably is in the range from 80 to 300 μm for the purpose of stiffening the actuator board 32 in its entirety.

Figure 5:
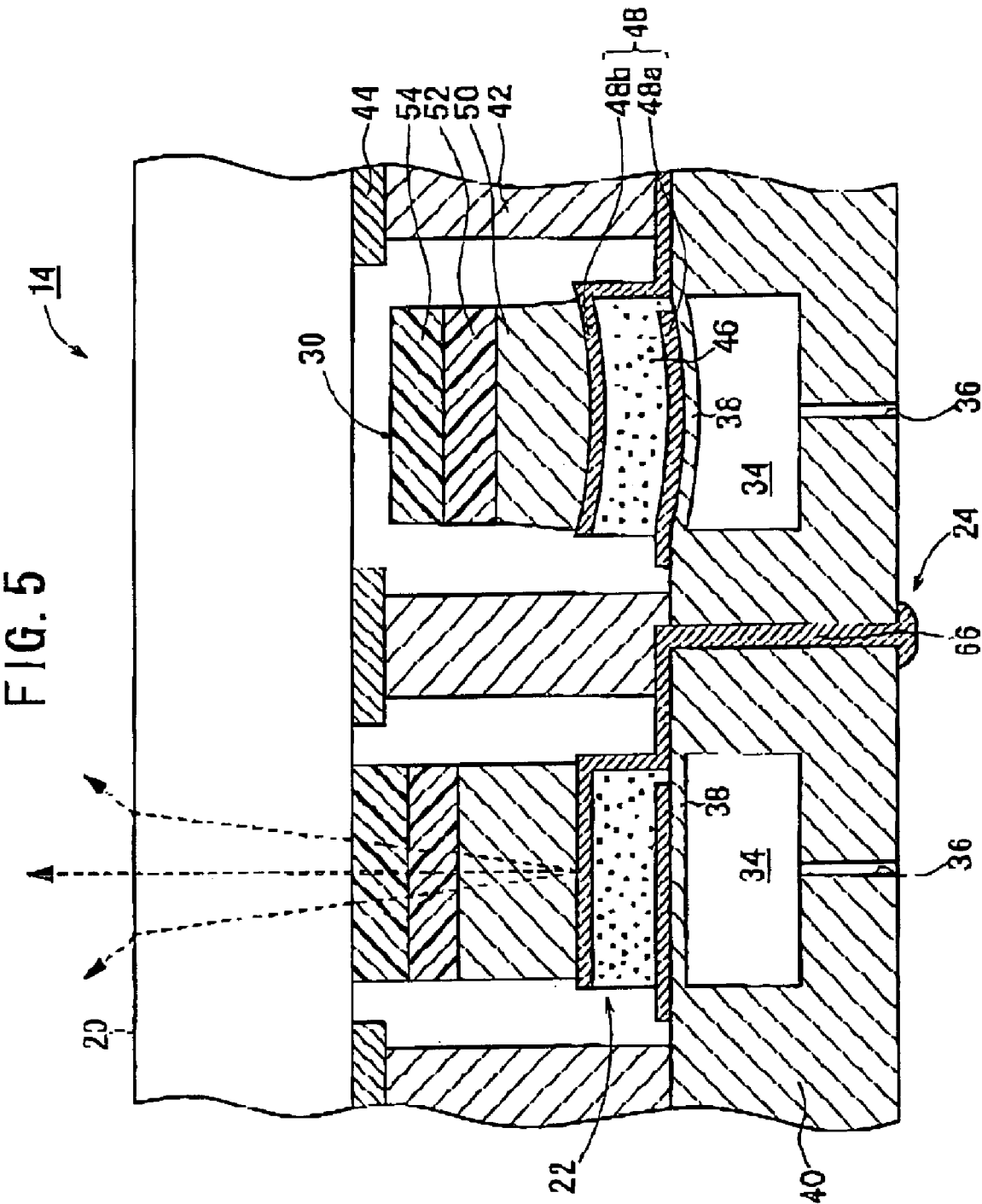
FIG. 5 is a fragmentary cross-sectional view of a specific structure of an actuator and a pixel assembly.

A specific example of the actuator 22 and the pixel assembly 30 will be described below with reference to FIG. 5. In FIG. 5, light blocking layers 44 are disposed between pillars 42, which are made of a material that is resistant to deformation under forces, and the optical waveguide panel 20.

As shown in FIG. 5, the actuator 22 has, in addition to the vibrator 38 and the stationary block 40, a piezoelectric/electrostrictive layer 46 formed directly on the vibrator 38, and a pair of electrodes 48 disposed respectively on upper and lower surfaces of the piezoelectric/electrostrictive layer 46. The electrodes 48 comprise an upper row electrode 48a and a low column electrode 48b.

The electrodes 48 may be disposed on the upper and lower surfaces and one side of the piezoelectric/electrostrictive layer 46, as shown in FIG. 5, or may be disposed on only the upper surface of the piezoelectric/electrostrictive layer 46.

If the electrodes 48 are disposed on only the upper surface of the piezoelectric/electrostrictive layer 46, then the electrodes 48 may comprise comb-shaped teeth disposed in an interdigitating relation to each other, or may be of a spiral shape or a multi-branch shape as disclosed in Japanese laid-open patent publication No. 10-78549.

Figure 6:
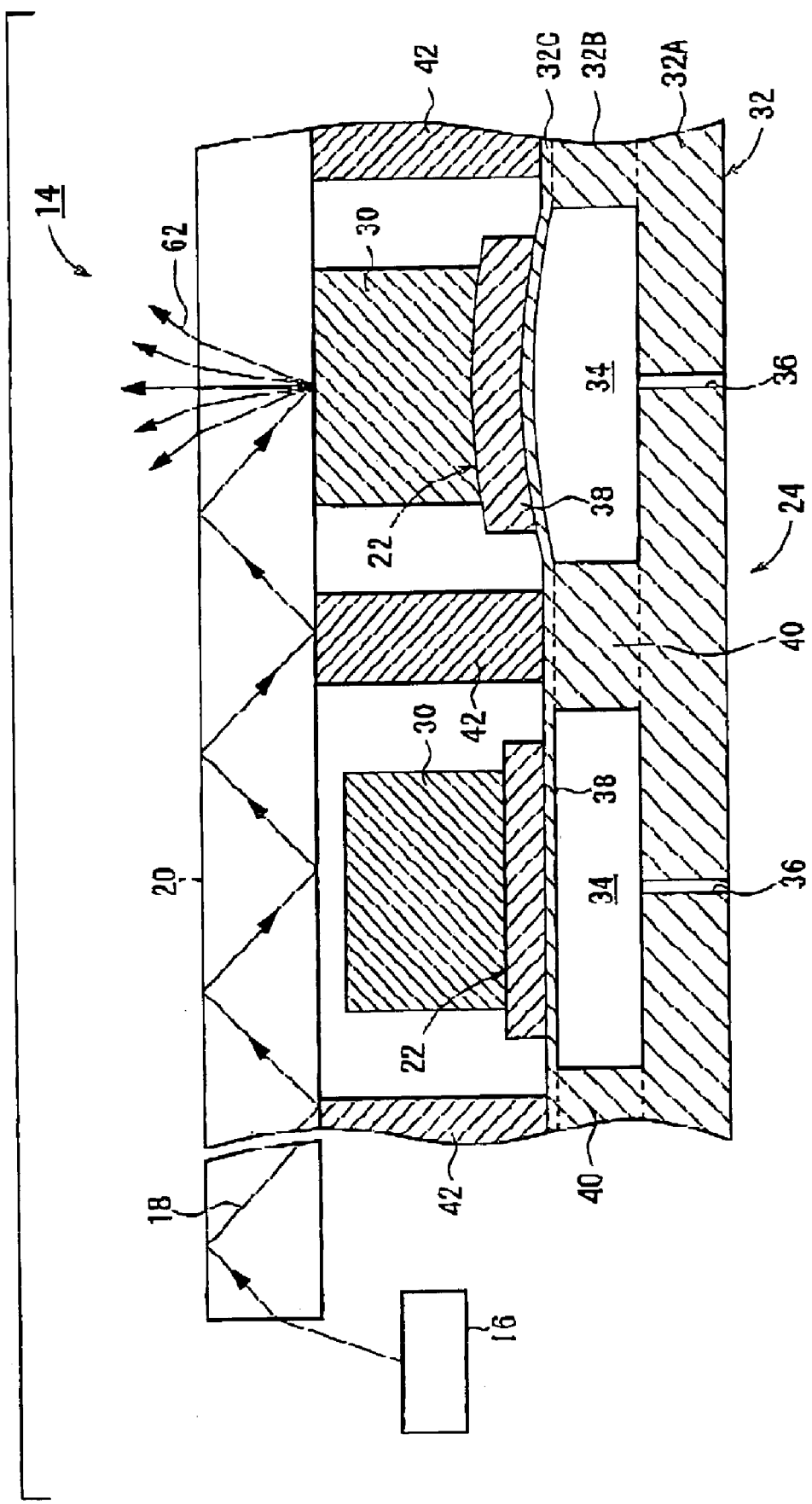
FIG. 6 is a fragmentary cross-sectional view of another arrangement of a display element.

If the lower electrode 48a is disposed on the lower surface of the piezoelectric/electrostrictive layer 46 and the upper electrode 48b is disposed on the upper surface of the piezoelectric/electrostrictive layer 46, as shown in FIG. 5, then the actuator 22 may be flexibly displaced in one direction so as to be convex toward the recess 34, as shown in FIGS. 2 and 5. Alternatively, the actuator 22 may be flexibly displaced so as to be convex toward the optical waveguide panel 20, as shown in FIG. 6. In the example shown in FIG. 6, the light blocking layers 44 (see FIG. 2) are not included.

As shown in FIG. 5, the pixel assembly 30 is constructed as a laminated body disposed as a displacement transfer element on the actuator 22 and comprising a white scattering body 50, a color filter 52, and a transparent layer 54.

The above laminated body may be modified as follows: (1) The white scattering body 50 is replaced with a light reflecting layer and an insulating layer which are laminated together. (2) The displacement transfer element disposed as the pixel assembly 30 on the actuator 22 comprises a laminated body of a colored scattering body and a transparent layer. (3) The displacement transfer element comprises a laminated body of a transparent layer, a colored scattering body, a light reflecting layer, and an insulating layer.

As shown in FIGS. 2, 5, and 6, the pillars 42 are disposed between the optical waveguide panel 20 and the actuator board 32 and positioned around the pixel assemblies 30. In the example shown in FIG. 6, the optical waveguide panel 20 is directly fixed to the upper surfaces of the pillars 42. The pillars 42 should preferably be made of a material which is resistant to deformation when subjected to heat and pressure.

Operation of the display device 10 will briefly be described below with reference to FIGS. 2 and 5. If the lower electrode 48a is used as a potential reference point (e.g., 50 V), then when a high-level drive voltage (60 V) is applied to the upper electrode 48b, a low-level voltage (10 V) is applied between the upper electrode 48b and the lower electrode 48a, and when a low-level drive voltage (0 V) is applied to the upper electrode 48b, a high-level voltage (50 V) is applied between the upper electrode 48b and the lower electrode 48a.

Light 18 is introduced into the optical waveguide panel 20 from an end thereof, for example. The optical waveguide panel 20 has its refractive index pre-adjusted to cause all the light 18 to be totally reflected within the optical waveguide panel 20 without passing through front and rear surfaces thereof while the pixel assemblies 30 are not in contact with the optical waveguide panel 20. The refractive index n of the optical waveguide panel 20 is preferably in the range from 1.3 to 1.8, and more preferably from 1.4 to 1.7.

In the present embodiment, while the actuators 22 are in their free state, since the end faces of the pixel assemblies 30 are held in contact with the rear surface of the optical waveguide panel 20 by a distance equal to or smaller than the wavelength of the light 18, the light 18 is reflected by the end faces of the pixel assemblies 30 and becomes scattered light 62. The scattered light 62 is partly reflected in the optical waveguide panel 20, but mostly passes through the front surface of the optical waveguide panel 20 without being reflected therein. All the actuators 22 are in the on state, emitting light in a color corresponding to the color of the color filters 52 and the colored scattering bodies 50 in the pixel assemblies 30. Because all the actuators 22 are in the on state, a white color is displayed on the display screen of the display device 10.

When the low level voltage of −10 V is applied as a drive voltage to the upper electrodes of the actuators, the end faces of the pixel assemblies 30 are brought into contact with the rear surface of the optical waveguide panel 20, holding the actuators 22 more reliably in the on state for stable display.

When the high-level drive voltage (60 V) is applied to the actuator 22 corresponding to a certain dot 26, the actuator 22 is flexibly displaced so as to be convex into the cavity 34, i.e., downwardly, spacing the end face of the pixel assembly 30 away from the optical waveguide panel 20, as shown in FIG. 2. The pixel corresponding to the actuator 22 is now turned off, extinguishing the light which has been omitted thereby.

Therefore, the display device 10 controls light emission (light leakage 62) on the front surface of the optical waveguide panel 20 depending on whether the pixel assemblies 30 contact the optical waveguide panel 20 or not.

Figure 7:
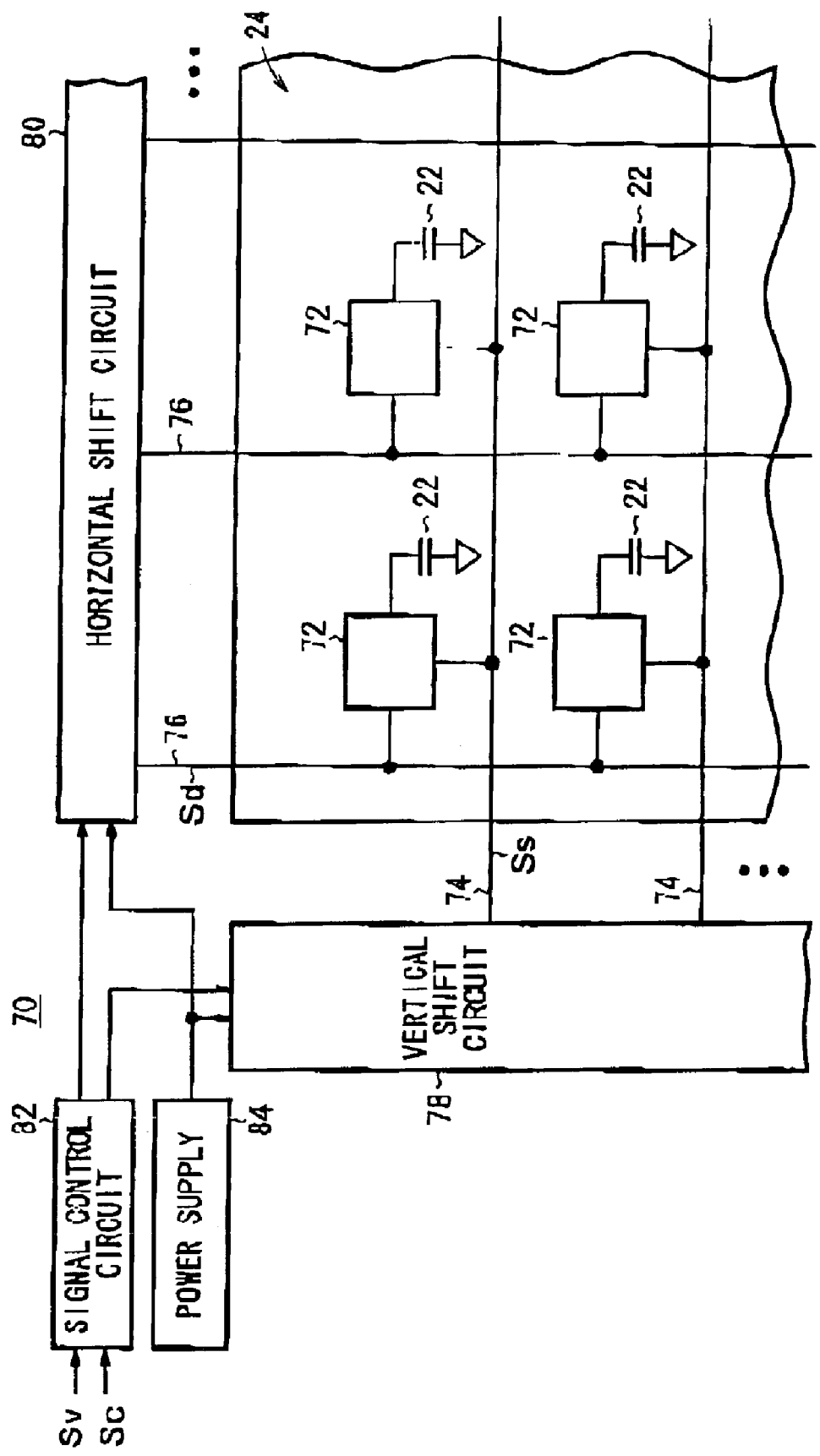
FIG. 7 is a block diagram of a drive unit according to the embodiment of the present invention.

As shown in FIG. 7, each of the display elements 14 has a drive unit 70. The drive unit 70 comprises a plurality of drive circuits 72 arrayed in association with the respective pixels (actuators 22) of the display unit 24, for driving the corresponding actuators 22, as many select lines 74 as the number of rows of pixels (actuators 22), and as many signal lines 76 as the number of columns of pixels.

The drive unit 70 also has a vertical shift circuit 78 for selectively supplying drive signals Ss to the select lines 74 for successively selecting the actuators 22 in one row at a time, a horizontal shift circuit 80 for outputting parallel data signals Sd to the signal lines 76 to supply the data signals Sd to those drive circuits 72 in rows (selected rows) selected by the vertical shift circuit 78, and a signal control circuit 82 for controlling the vertical shift circuit 78 and the horizontal shift circuit 80 based on a video signal Sv and a synchronizing signal Sc which are inputted to the signal control circuit 82. The vertical shift circuit 78 and the horizontal shift circuit 80 are supplied with a power supply voltage from a power supply 84.

Figure 8:
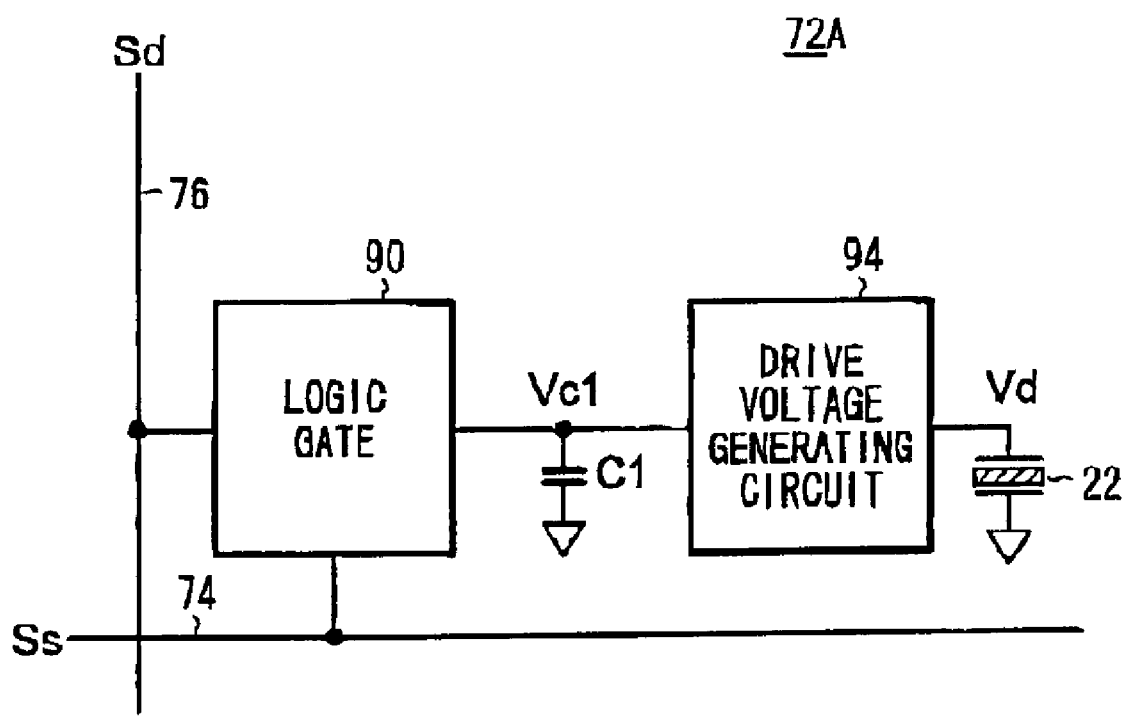
FIG. 8 is a diagram schematically showing a drive circuit according to a first embodiment of the present invention.

As shown in FIG. 8, a drive circuit 72A according to a first embodiment comprises a logic gate 90 for inhibiting the data signal Sd from being inputted from the signal line 76 when the actuator 22 is unselected and permitting the data signal Sd to be inputted from the signal line 76 when the actuator 22 is selected, based on the drive signal Ss (select voltage) supplied from the select line 74, a capacitor C1 for holding the output signal of the logic gate 90 and outputting the held output signal as a control voltage Vc when the actuator is selected, and a drive voltage generating circuit 94 for generating a drive voltage Vd to displace the actuator 22 based on the control voltage Vc from the capacitor C1.

Some specific examples of the drive circuit 72A according to the first embodiment will be described below with reference to FIGS. 9 through 26.

Figure 9:
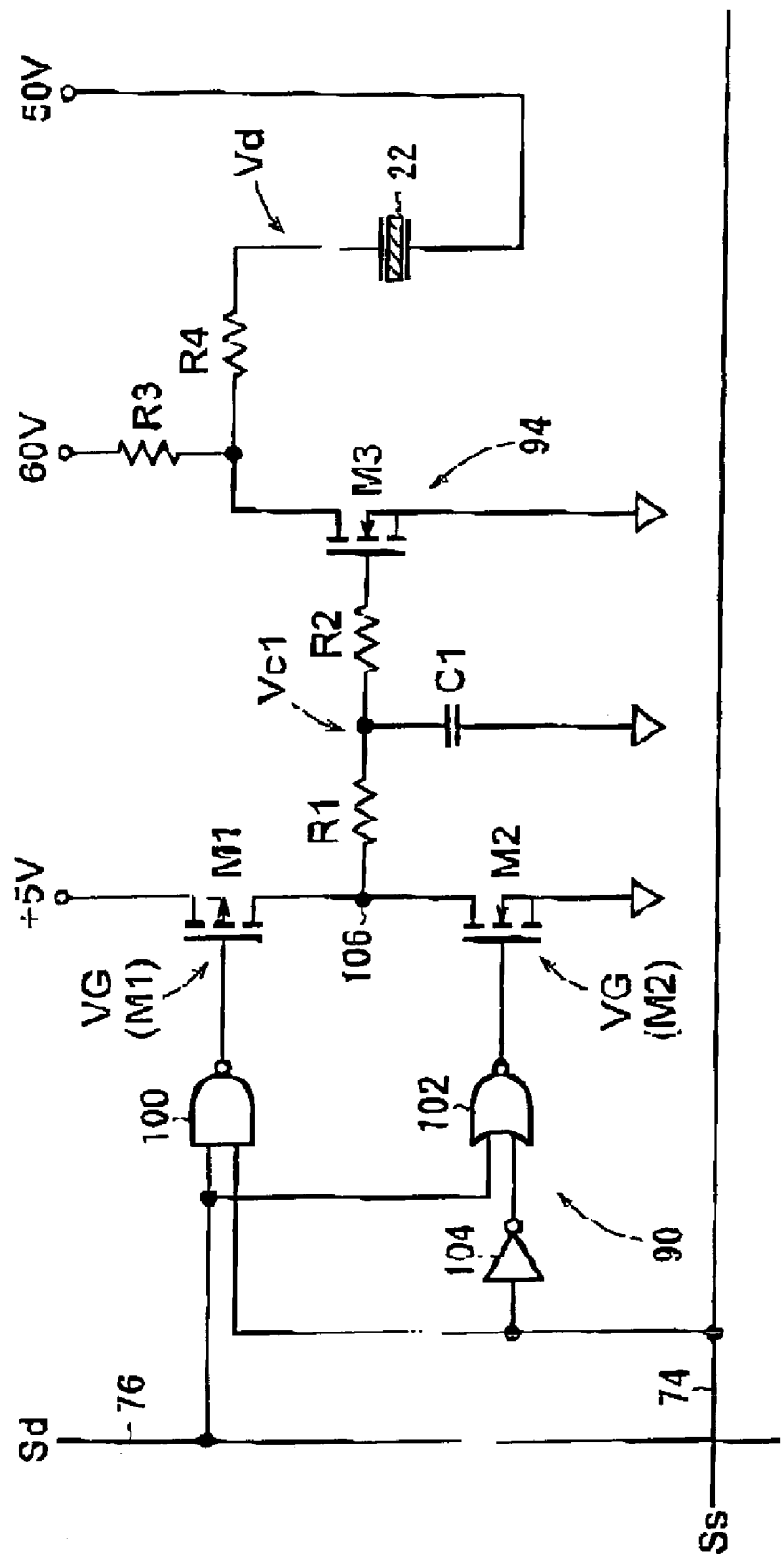
FIG. 9 is a circuit diagram of a drive circuit according to a first specific example.

First, a drive circuit 72Aa according to a first specific example will be described below with reference to FIGS. 9 through 11. The drive circuit 72Aa according to the first specific example comprises a NAND circuit 100, a NOR circuit 102, an inverter 104, a p-channel TFT (p-TFT (M1)), and an n-channel TFT (n-TFT (M2)).

The NAND circuit 100 has an input terminal connected to the select line 74 and another input terminal connected to the signal line 76. The NOR circuit 102 has an input terminal connected to the signal line 76 and another input terminal connected to the select line 74 through the inverter 104.

The p-TFT (M1) and the n-TFT (M2) have their drains connected to each other by a junction 106 from which an output voltage is extracted. A power supply voltage of 5 V is applied to the source of the p-TFT (M1), and a power supply voltage of 0 V is applied to the source of the n-TFT (M2).

The junction 106 is connected through a resistor R1 to one terminal of a capacitor C1. The power supply voltage of 0 V is applied to the other terminal of the capacitor C1.

The drive voltage generating circuit 94 has a TFT (power TFT (M3)) having a large channel width. The power TFT (M3) has a gate connected through a resistor R2 to the one terminal of the capacitor C1, and a drain connected to which a power supply voltage of 60 V is applied through a pull-up resistor R3. The drain of the power TFT (M3) is connected through a resistor R4 to the upper electrode 48b of the actuator 22.

The drive signal Ss (select voltage) supplied to the select line 74 has a high level of 5 V and a low level of 0 V. The data signal Sd (control voltage) supplied to the signal line 76 has a high level of 5 V and a low level of 0 V.

Operation of the drive circuit 72Aa according to the first specific example will be described below with reference to FIGS. 10 and 11. It is assumed that a certain potential (e.g., 50 V) is applied to the lower electrode 48a of each actuator 22. In FIG. 11, "1" represents a high level and "0" represents a low level.

Figure 10:
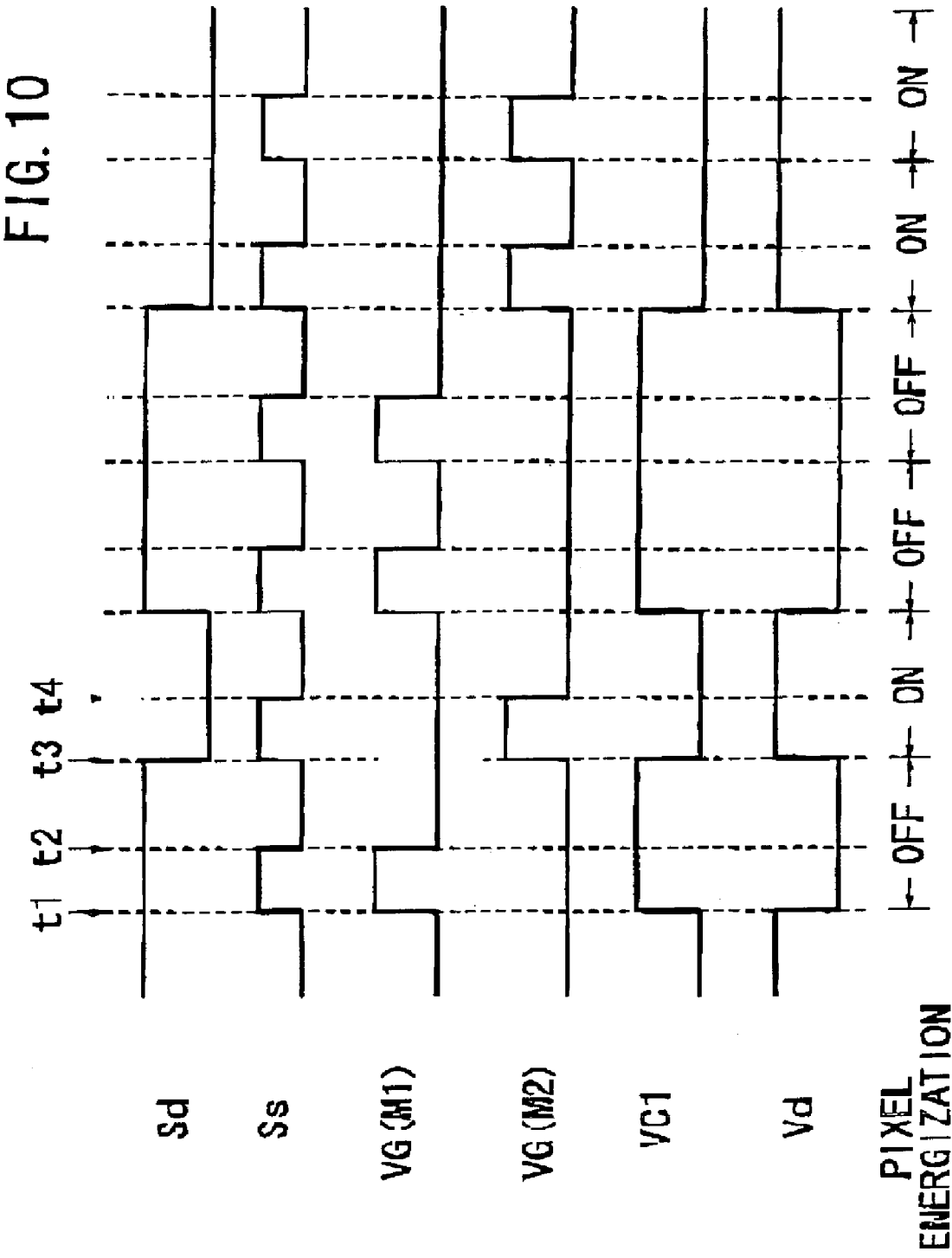
FIG. 10 is a timing chart of operation of the drive circuit according to the first specific example.

When the drive signal Sc supplied to the select line 74 is of a high level and the data signal Sd supplied to the signal line 76 is of a high level at a time t1 in FIG. 10, since a low-level voltage (0 V) is applied to the gates of the p-TFT (M1) and the n-TFT (M2) of the logic gate 90, turning on the p-TFT (M1) and turning off the n-TFT (M2). At this time, a current flows from the source of the p-TFT (M1) into the capacitor C1, accumulating charges in (charging) the capacitor C1 which holds the high-level voltage (5 V). Thus, the control voltage Vc1 outputted from the capacitor C1 is of a high level, turning on the power TFT (M3) thereby to apply a low-level drive voltage Vd (0 V) to the upper electrode 48b of the actuator 22. As a result, a high-level voltage of 50 V is applied between the electrodes 48a, 48b of the actuator 22, which is displaced downwardly to extinguish (turn off) the pixel corresponding to the actuator 22.

Thereafter at a time t2, when the drive signal Ss supplied to the select line 74 goes low in level, since a high-level voltage (5 V) and a low-level voltage (0 V) are applied to the respective gates of the p TFT (M1) and the n-TFT (M2) of the logic gate 90, turning off the p-TFT (M1) and the n-TFT (M2). As a result, the output impedance of the logic gate 90 is increased, holding the high-level voltage (5 V) across the capacitor C1. The pixel corresponding to the actuator 22 thus remains turned off.

Thereafter at a time t3, when the drive signal Ss supplied to the select line Ss goes high in level and the data signal Sd supplied to the signal line 76 goes low in level, since a high level voltage (5 V) is applied the gates of the p-TFT (M1) and the n-TFT (M2) of the logic gate 90, turning off the p-TFT (M1) and turning on the n-TFT (M2). At this time, a current flows from the capacitor C1 into the source of the n-TFT (M2) (the capacitor C1 is discharged), holding the low-level voltage (0 V) across the capacitor C1. Thus, the control voltage Vc1 outputted from the capacitor C1 is of a low level, turning off the power TFT (M3) thereby to apply a high-level drive voltage Vd (60 V) to the upper electrode 48b of the actuator 22. As a result, a low-level voltage of −10 V is applied between the electrodes 48a, 48b of the actuator

22, which is displaced upwardly to energize (turn on) the pixel corresponding to the actuator 22.

Thereafter at a time t4, when the drive signal Ss supplied the select line 74 goes low in level, since a high-level voltage (5 V) and a low-level voltage (0 V) are applied to the respective gates of the p-TFT (M1) and the n-TFT (M2) of the logic gate 90, turning off the p-TFT (M1) and the n-TFT (M2). As a result, the output impedance of the logic gate 90 is increased, holding the low-level voltage (0 V) across the capacitor C1. The pixel corresponding to the actuator 22 thus remains turned on.

In this manner, the drive circuit 72Aa according to the first specific example generates a drive voltage Vd for displacing the actuator 22 based on the control voltage Vc1 from the capacitor C1. The capacitor C1 holds the output voltage of the logic gate 90 and applies the hold output voltage as the control voltage Vc1 to the power TFT (M3).

Therefore, the power TFT (M3) for applying the drive voltage Vd to the actuator 22 can be operated at signal levels used in general logic circuits. Consequently, the withstand voltage of the gate of the power TFT (M3) may be similar to those of TFTs used as ordinary switching elements. It is not necessary to design the power TFT (M3) for a high-withstand-voltage structure for use with a voltage of 50 V or higher to be applied to the gate. The size of the power TFT (M3) may be smaller than those TFTs customized for high-withstand-voltage designs. This leads to a reduction in the size of the drive circuit system, making it possible to form a power TFT (M3) that has a high withstand voltage and a large output current within a space corresponding to the area of the actuator 22.

A drive circuit 72Ab according to a second specific example will be described below with reference to FIGS. 12 through 14. The drive circuit 72Ab according to the second specific example is similar to the drive circuit 72Aa according to the first embodiment, but has a drive voltage generating circuit 94 which differs from that of the drive circuit 72Aa as follows:

The drive voltage generating circuit 94 has a push-pull circuit comprising a p-channel power TFT (p-power TFT (M4)) and an n-channel power TFT (n-power TFT (M3)). The p-power TFT (M4) and the n-power TFT (M3) have their drains connected to each other by a junction 112 from which an output voltage is extracted.

A power supply voltage of 60 V is applied to the source of the p-power TFT (M4), and a power supply voltage of 0 V is applied to the source of the n-power TFT (M3). A protection circuit comprising a zener diode ZD, a resistor R3, and a coupling capacitor C2 is connected between the source and gate of the p-power TFT (M4).

Operation of the drive circuit 72Ab according to the second specific example will be described below with reference to FIGS. 13 and 14. In FIG. 14, "1" represents a high level and "0" represents a low level.

Figure 13:
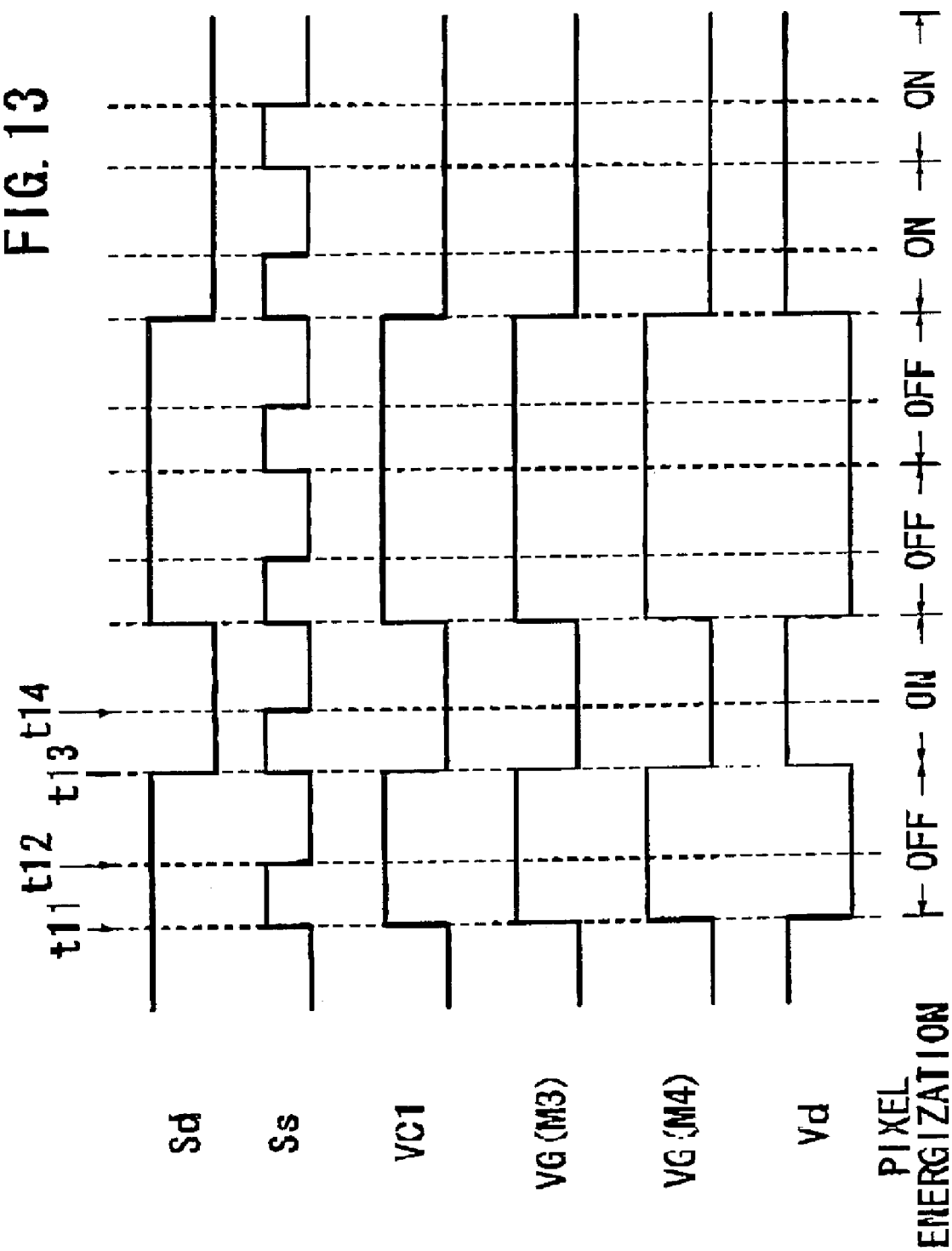
FIG. 13 is a timing chart of operation of the drive circuit according to the second specific example.

When the drive signal Ss supplied to the select line 74 is of a high level and the data signal Sd supplied to the signal line 76 is of a high level at a time t11 in FIG. 13, since the p-TFT (M1) is turned on and the n-TFT (M2) is turned off, the capacitor C1 holds the high-level voltage (5 V). Thus, the high-level voltage (5 V) is applied to the gates of the p-power TFT (M4) and the n-power TFT (M3) of the push-pull circuit 110, turning off the p-power TFT (M4) and turning on the n-power TFT (M3). At this time, a low-level drive voltage Vd (0 V) is applied to the upper electrode 48b of the actuator 22. As a result, a high level voltage of 50 V is applied between the electrodes 48a, 48b of the actuator 22, which is displaced downwardly to extinguish (turn off) the pixel corresponding to the actuator 22.

Thereafter at a time t12, when the drive signal Ss supplied to the select line 74 goes low in level, the p-TFT (M1) and the n-TFT (M2) are turned off. As a result, the high-level voltage (5 V) is held across the capacitor C1. The pixel corresponding to the actuator 22 thus remains turned off.

Thereafter at a time t13, when the drive signal Ss supplied to the select line Ss goes high in level and the data signal Sd supplied to the signal line 76 goes low in level, since the p-TFT (M1) is turned off and the n-TFT (M2) is turned on, the low-level voltage (0 V) is held across the capacitor C1. The low-level voltage (0 V) is applied to the gates of the p-power TFT (M4) and the n-power TFT (M3) of the push-pull circuit 110, turning on the p-power TFT (M4) and turning off the n-power TFT (M3). AT this time, a high-level drive voltage Vd (60 V) is applied to the upper electrode 48b of the actuator 22. As a result, a low-level voltage of −10 V is applied between the electrodes 48a, 48b of the actuator 22, which is displaced upwardly to energize (turn on) the pixel corresponding to the actuator 22.

Thereafter at a time t14, when the drive signal Ss supplied the select line 74 goes low in level, the p-TFT (M1) and the n-TFT (M2) are turned off. As a result, the low-level voltage (0 V) is held across the capacitor C1. The pixel corresponding to the actuator 22 thus remains turned on.

In the drive circuit 72Ab according to the second specific example, the p-power TFT (M4) and the n-power TFT (M3) for applying the drive voltage Vd to the actuator 22 can be operated at signal levels used in general logic circuits.

Figure 15:
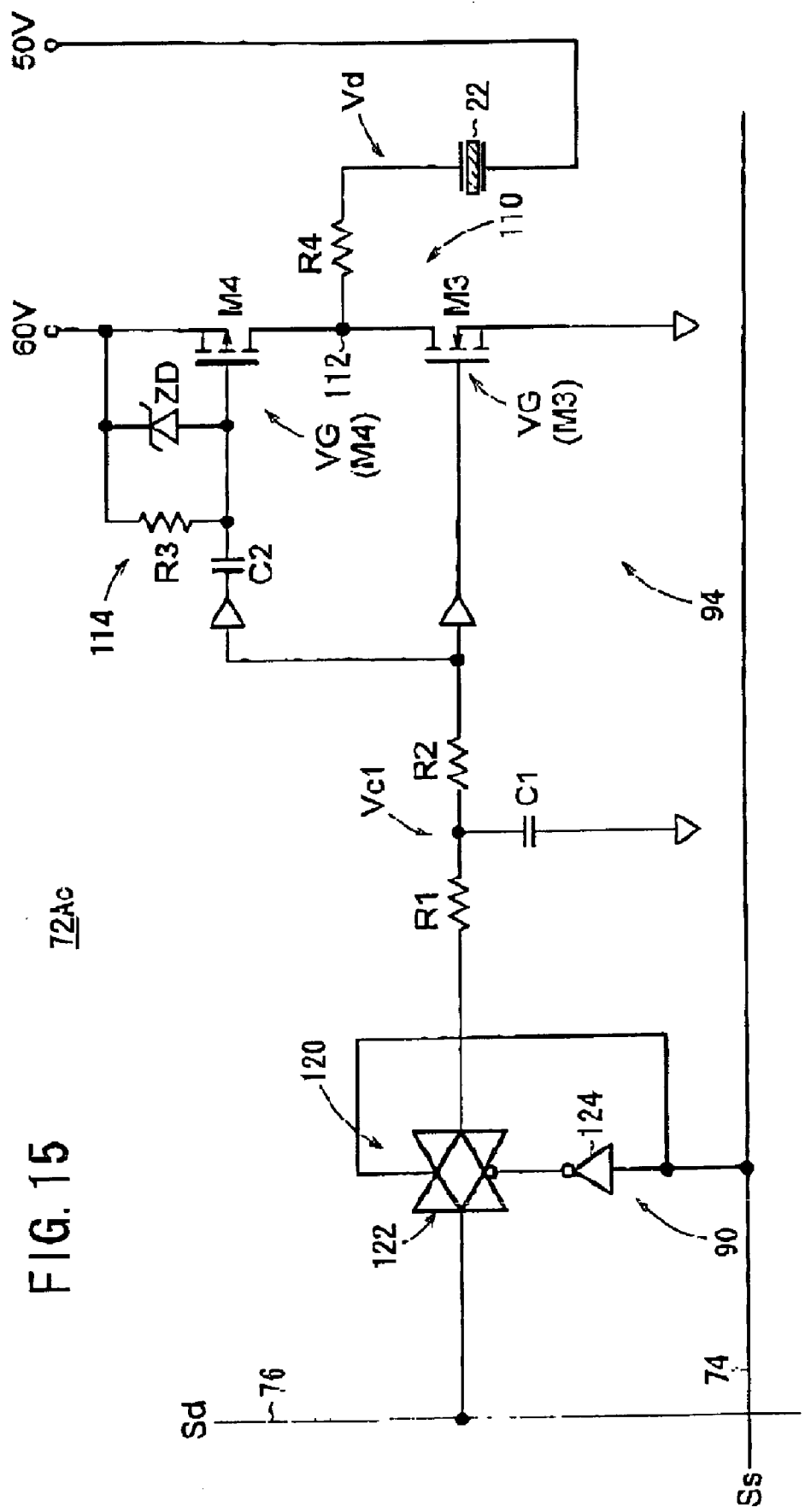
FIG. 15 is a circuit diagram of a drive circuit according to a third specific example.

A drive circuit 72Ac according to a third specific example will be described below with reference to FIGS. 15 through 17. The drive circuit 72Ac according to the third specific example is similar to the drive circuit 72Ab according to the second embodiment, but differs therefrom in that the logic gate 90 comprises an analog switch 120.

The analog switch 120 comprises a parallel-connected circuit 122 of an n-TFT and a p-TFT and an inverter 124. The select line 74 is connected through the inverter 124 to the gate of the p-TFT. The select line 74 is connected to the gate of the n-TFT. The parallel-connected circuit 122 has an input terminal connected to the signal line 76 and an output terminal connected to the one terminal of the capacitor C1.

Operation of the drive circuit 72Ac according to the third specific example will be described below with reference to FIGS. 16 and 17. In FIG. 17, "1" represents a high level and "0" represents a low level.

Figure 16:
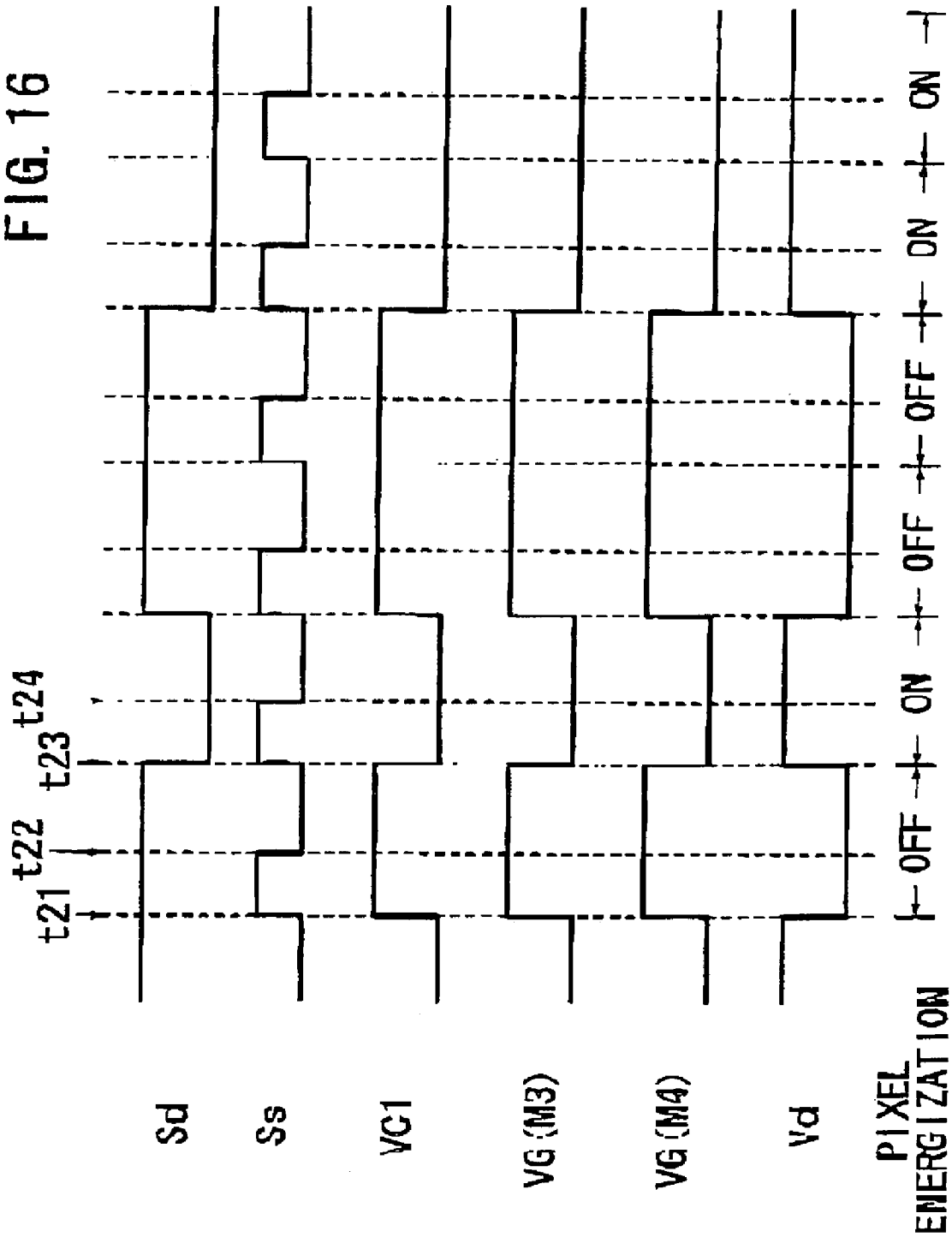
FIG. 16 is a timing chart of operation of the drive circuit according to the third specific example.

When the drive signal Ss supplied to the select line 74 is of a high level and the data signal Sd supplied to the signal line 76 is of a high level at a time t21 in FIG. 16, the analog switch 120 is turned on, holding the data signal Sd (high level: 5 V) from the signal line 76 across the capacitor C1. The p-power TFT (M4) is turned off and the n-power TFT (M3) is turned on. At this time, a low-level drive voltage Vd (0 V) is applied to the upper electrode 48b of the actuator 22. As a result, a high-level voltage of 50 V is applied between the electrodes 48a, 48b of the actuator 22, which is displaced downwardly to extinguish (turn off) the pixel corresponding to the actuator 22.

Thereafter at a time t22, when the drive signal Ss supplied to the select line 74 goes low in level, the analog switch 120 is turned off. As a result, the high-level voltage (5 V) is held across the capacitor C1. The pixel corresponding to the actuator 22 thus remains turned off.

Thereafter at a time t23, when the drive signal Ss supplied to the select line Ss goes high in level and the data signal Sd supplied to the signal line 76 goes low in level, since the analog switch 120 is turned on, the low-level voltage (0 V) is held across the capacitor C1. The p-power TFT (M4) is turned on the n-power TFT (M3) is turned off. At this time, a high-level drive voltage Vd (60 V) is applied to the upper electrode 48b of the actuator 22. As a result, a low-level voltage of −10 V is applied between the electrodes 48a, 48b of the actuator 22, which is displaced upwardly to energize (turn on) the pixel corresponding to the actuator 22.

Thereafter at a time t24, when the drive signal Ss supplied to the select line 74 goes low in level, the analog switch 120 is turned off. As a result, the low-level voltage (0 V) is held across the capacitor C1. The pixel corresponding to the actuator 22 thus remains turned on.

In the drive circuit 72Ac according to the third specific example, the p-power TFT (M4) and the n-power TFT (M3) for applying the drive voltage Vd to the actuator 22 can be operated at signal levels used in general logic circuits.

Particularly, because the analog switch 120 is used as the logic gate 90 in the drive circuit 72Ac according to the third specific example, the number of TFTs used is reduced. Specifically, each of the drive circuit 72Aa according to the first specific example and the drive circuit 72Ab according to the second specific example has the NAND circuit 100 which needs four TFTs, the NOR circuit 102 which needs four TFTs, the inverter 104 which needs two TFTs, the single p-TFT (M1), and the single n-TFT (M2), and hence requires a total of 12 TFTs.

According to the third specific example, the number of TFTs used is greatly reduced because the logic gate 90 is in the form of the analog switch 120 which comprises four TFTs. The third specific example is thus effective in reducing the area in which the circuit is formed.

Figure 18:
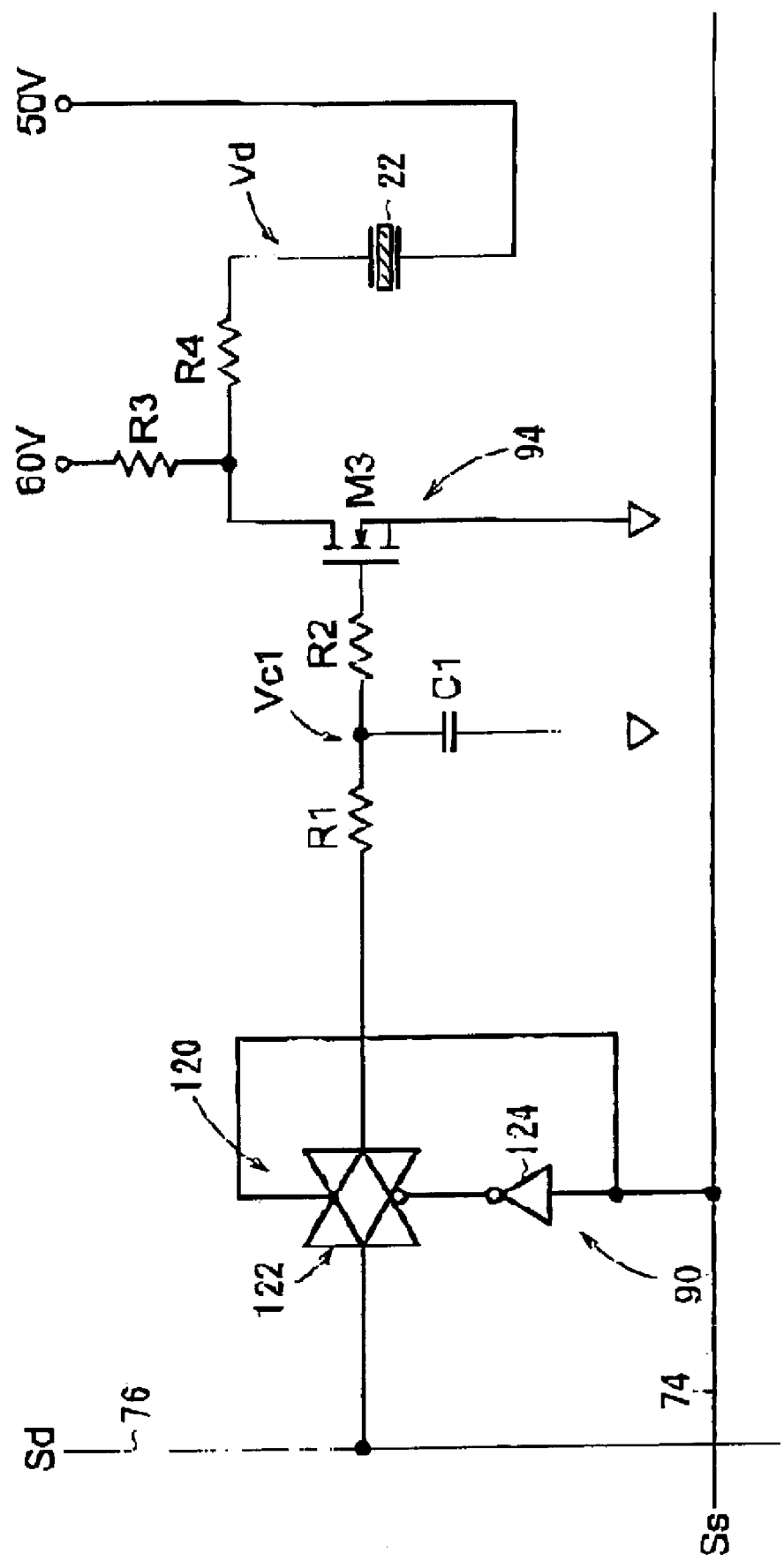
FIG. 18 is a circuit diagram of a drive circuit according to a fourth specific example.

A drive circuit 72Ad according to a fourth specific example will be described below with reference to FIG. 18. The drive circuit 72Ad according to the fourth specific example is similar to the drive circuit 72Aa according to the first specific example, but differs therefrom in that the logic gate 90 comprises the analog switch 120 used in the drive circuit 72Ac according to the third specific example.

In the drive circuit 72Ad according to the fourth specific example, the drive voltage generating circuit 94 uses a single power TFT (M3) and the logic gate 90 uses the analog switch 120. Therefore, the number of TFTs used in the drive circuit 72Ad according to the fourth specific example is smaller than the number of TFTs used in the drive circuit 72Ac according to the third specific example.

For driving the actuators 22 of the display unit 24 with the drive circuits 72Aa through 72Ad according to the first through fourth specific examples, all the rows are successively selected in the period of one frame, and the parallel data signals Sd are outputted from the signal lines 76 to the group of pixels in the successively selected rows. The light waveguide panel 20 now displays an image on its surface.

Figure 19:
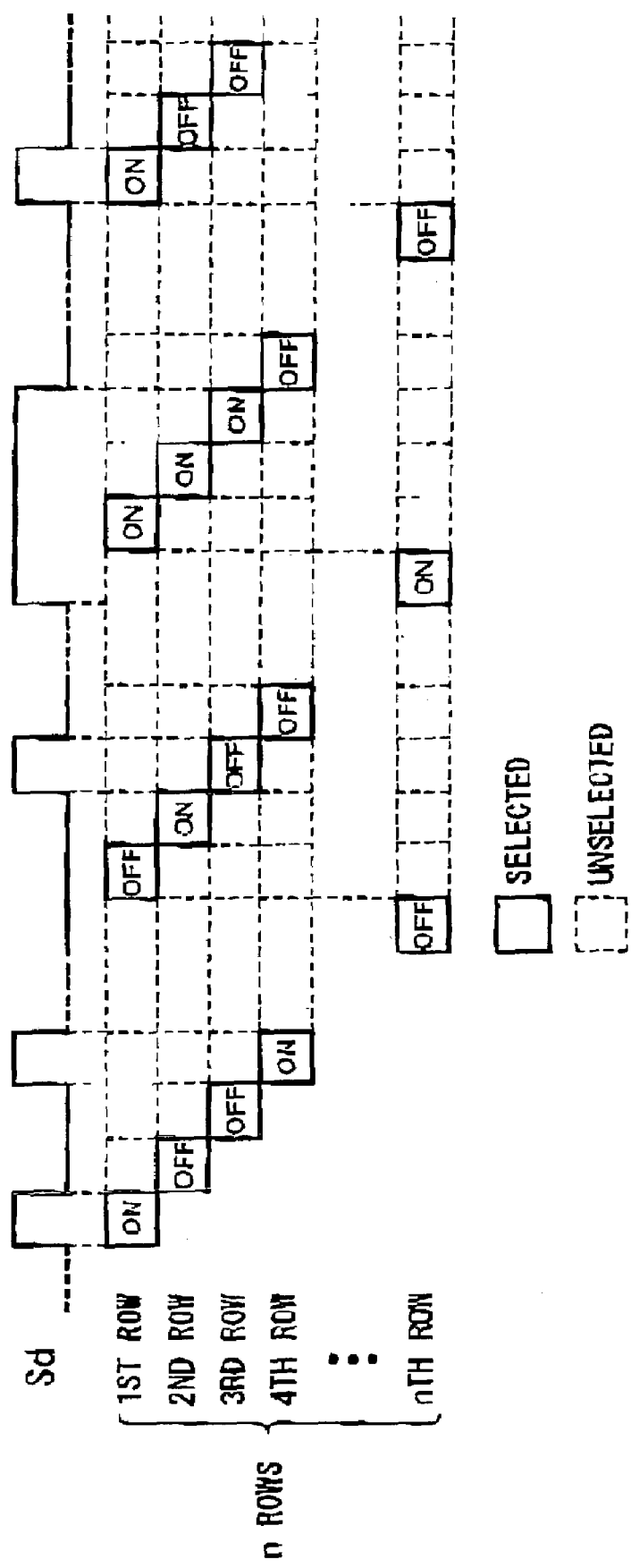
FIG. 19 is a diagram showing a drive pattern for a group of pixels in a first column.
Figure 20:
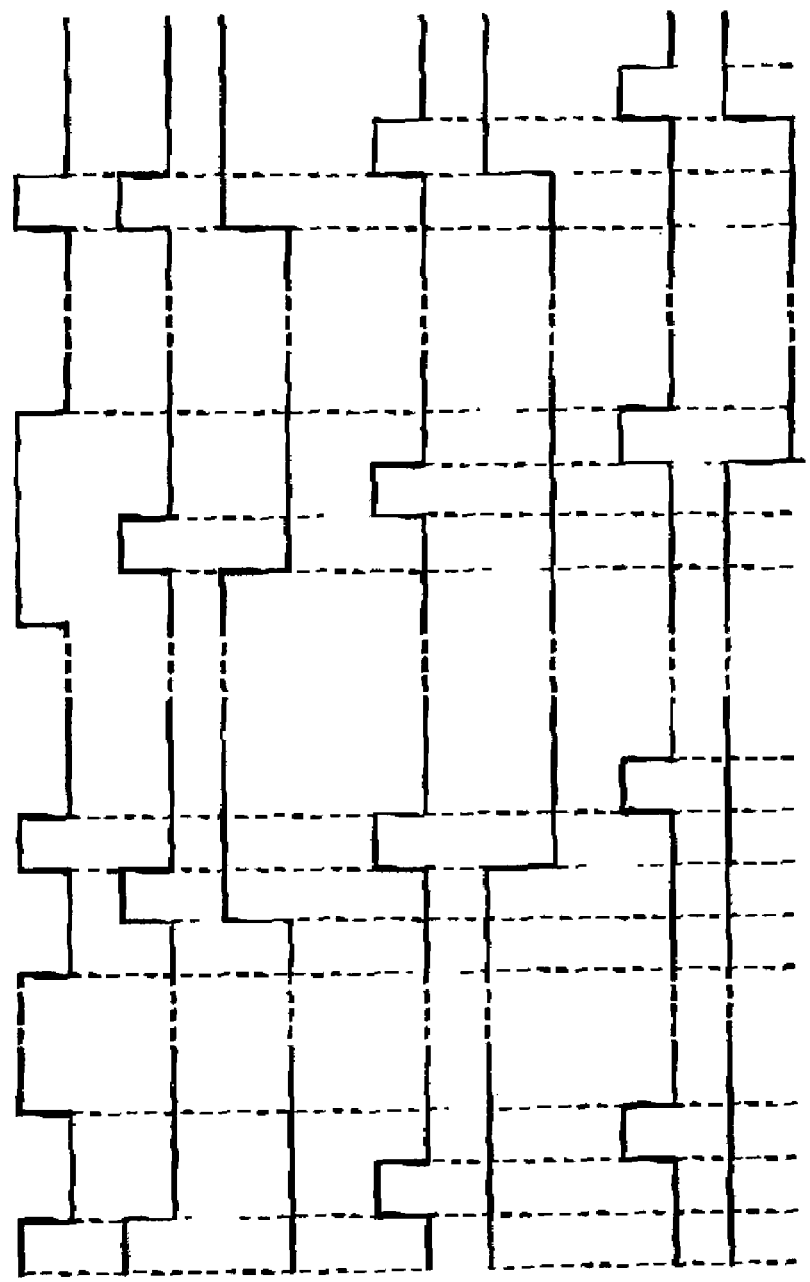
FIG. 20 is a diagram showing the waveforms of a data signal and drive signals for achieving the drive pattern shown in FIG. 19 and the waveforms of drive voltages produced by the data signal and the drive signals.

For example, a first column of pixels will be considered below. As shown in FIGS. 19 and 20, in order to successively select first, second, . . . , nth rows in timed relation to a horizontal synchronizing signal, the select lines 74 successively output high-level pulse signals (drive signals Ss), and the signal lines 76 output a data signal Sd for the first, second, . . . , nth rows. FIG. 20 shows the waveforms of the data signal Sd and the drive signals Ss for achieving the drive pattern shown in FIG. 19, and the waveforms of drive voltages Vd produced by the data signal Sd and the drive signals Ss. FIG. 20 particularly shows the behaviors of the first through third rows.

In FIG. 19, in a first frame, the pixel in the first row and the first column is turned on, the pixel in the second row and first column is turned off, the pixel in the third row and first column is turned off, the pixel in the fourth row and first column is turned on, and the pixel in the nth row and first column is turned off. In a second frame, the pixel in the first row and the first column is turned off, the pixel in the second row and first column is turned on, the pixel in the third row and first column is turned off, the pixel in the fourth row and first column is turned off, and the pixel in the nth row and first column is turned on.

The packaging of the drive unit 70 will be described below. For packaging the drive unit 70 on the display element 14, it may be mounted on the surface of the actuator board 32 on which the actuators 22 are disposed. However, such a packaging design possibly fails to provide a sufficient area for the actuators 22 on the actuator board 32 which are directly involved in the aperture ratio of the pixels. If the drive unit 70 is to be installed on the surface of the actuator board 32 which is free of the actuators 22, then it is difficult for the actuator board 32 to provide a required installation space for the drive unit 70, and the packaging process is complex, tending to result in a reduction in the yield of the actuator board 32.

Figure 21:
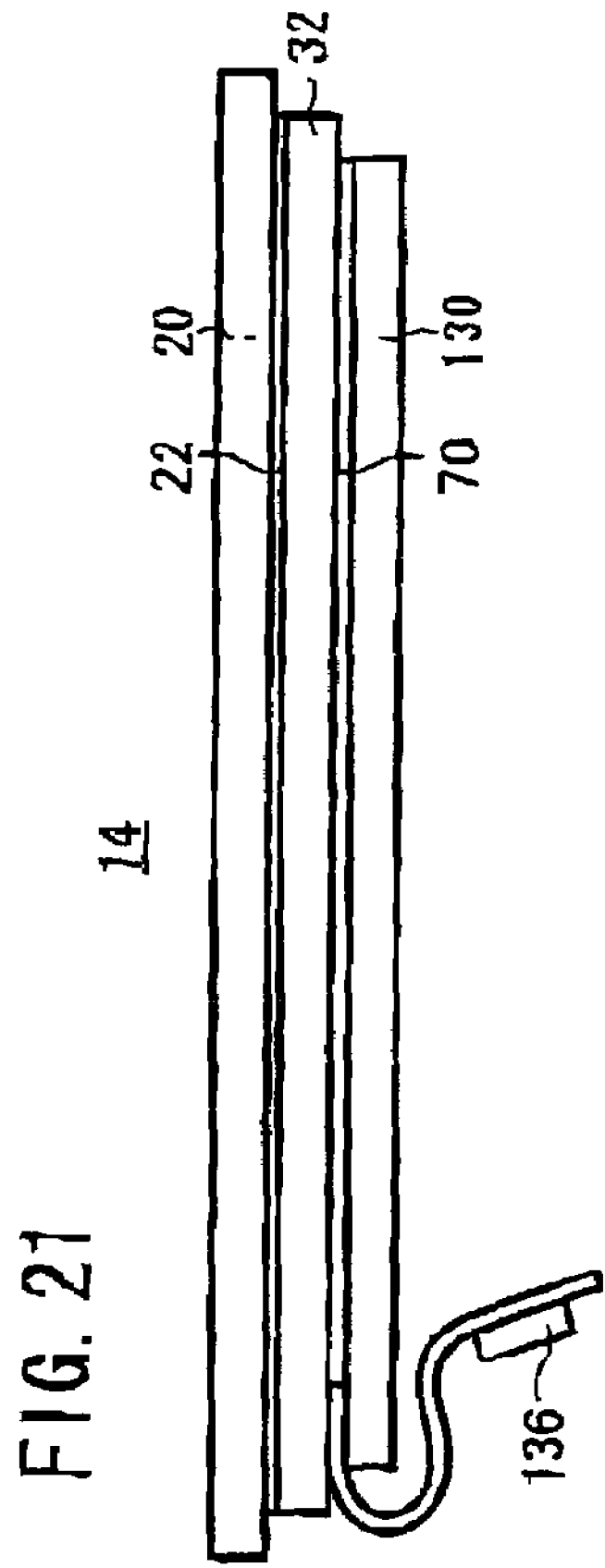
FIG. 21 is an elevational view of a display element according to the embodiment of the present invention.

According to the present embodiment, as shown in FIG. 21, a matrix of actuators 22 associated with respective pixels is formed on the actuator board 32, and the drive unit 70 is fabricated on a separate circuit board 130. The light waveguide panel 20 and the actuator board 32 are bonded to each other, and the circuit board 130 is bonded to the reverse side of the actuator board 32.

Figure 22:
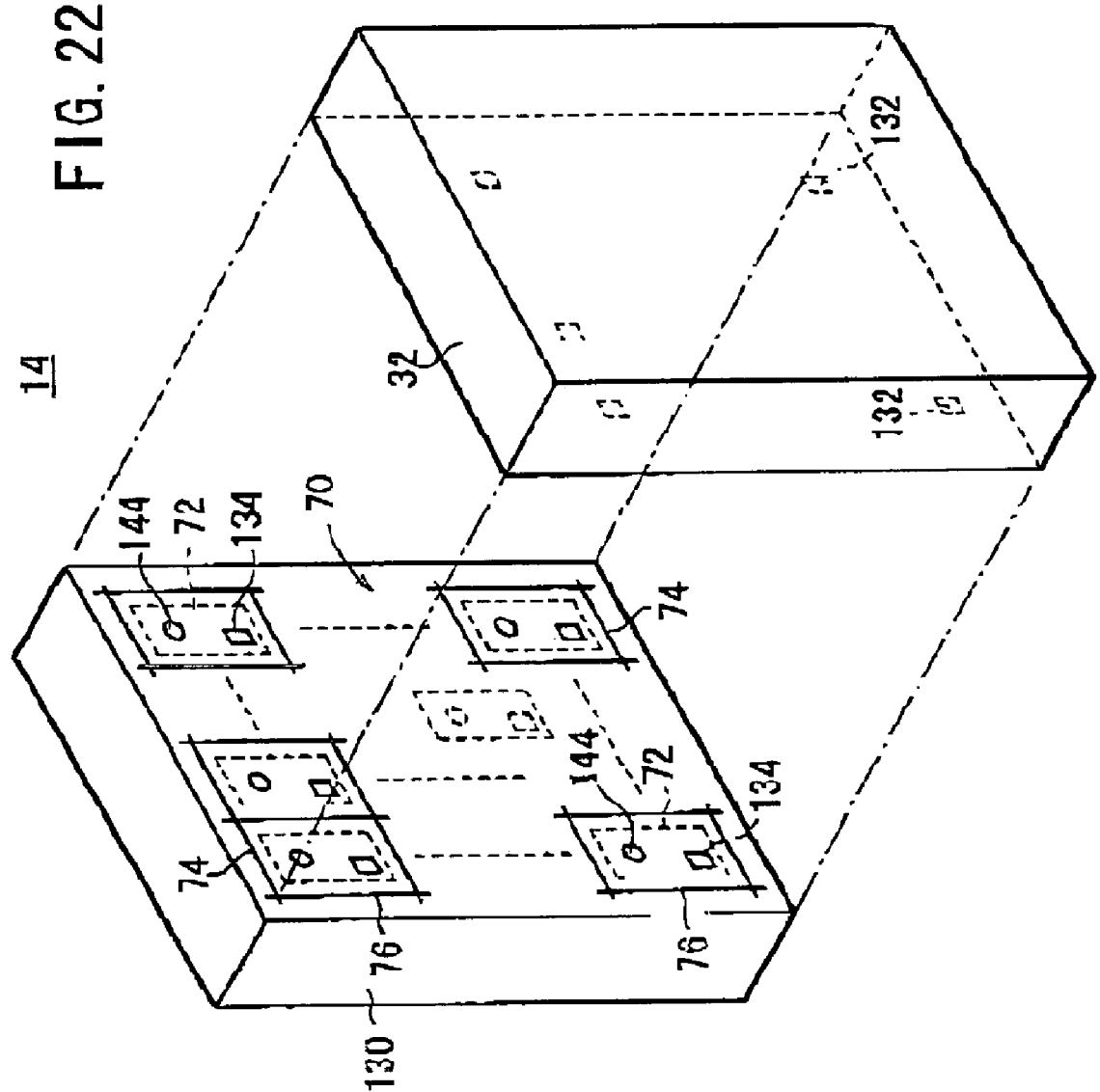
FIG. 22 is an exploded perspective view of an actuator board and a circuit board among the components of the display element according to the embodiment of the present invention.

Specifically, as shown in FIG. 22, the circuit board 130 with drive circuits 72 arrayed on a principal surface thereof (within ranges indicated by the broken lines) is prepared in addition to the actuator board 32 with a number of actuators 22 (not shown) arrayed on a principal surface thereof. A number of through holes 66 (see FIG. 5) are defined in the actuator board 32 in alignment with the respective actuators 22, the through holes 66 extending from one principal surface to the other of the actuator board 32. Electrode pads 132 are formed on the other principal surface of the actuator board 32 in alignment with the respective through holes 66. Therefore, the electrode pads 132 are positioned in alignment with the respective actuators 22 which are disposed on the one principal surface of the actuator board 32.

The circuit board 130 has output pads 134 of the respective drive circuits 72 which are positioned in alignment with the respective electrode pads 132 when the circuit board 130 is bonded to the reverse side of the actuator board 32. The electrode pads 132 and the output pads 134 are electrically connected to each other, thus electrically connecting the drive circuits 72 on the circuit board 130 to the respective actuators 22 on the actuator board 22.

The actuator board 32 and the circuit board 130 are bonded to each other by mating the reverse side of the actuator board 32 (on which the electrode pads 132 are formed) with the one principal surface of the circuit board 130, and joining the electrode pads 132 on the actuator board 32 and the output pads 134 on the circuit board 130 to each other by a solder or an electrically conductive resin, for example. With the actuator board 32 and the circuit board 130 being thus bonded to each other, one of the electrodes (e.g., the upper electrode 48b) of each of the actuators 22 and the output terminal of the corresponding drive circuit 72 are electrically connected to each other.

With this arrangement, the actuators 22 which are directly involved in the aperture ratio of the pixels can be formed in an array without taking into account the area in which the drive circuits 72 are formed, and the drive circuits 72 can be formed in an array without taking into account the area in which the actuators 22 are formed.

Accordingly, the aperture ratio of the pixels can greatly be increased, and the layout of the drive circuits 72 can freely be established, resulting in an increase in the selectivity of circuit components and an increase in the freedom of design. These advantages lead to a reduction in the cost of manufacture of the display device 10 and an ability to fabricate the display device 10 in a wide variety of arrangements depending on modes of use of the display device 10 (environments in which the display device 10 is installed and purposes for which the display device 10 is used).

In the present embodiment, as shown in FIG. 22, the select lines 74 and the signal lines 76, in addition to the drive circuits 72, are formed on the one principal surface of the circuit board 130. When the select lines 74 and the signal lines 76 are to be formed on the actuator board 32 with the actuators 22 formed thereon, it is necessary to position the select lines 74 and the signal lines 76 along tortuous paths between the actuators 22, and such a tortuous layout of the select lines 74 and the signal lines 76 tends to lower the freedom of interconnection design and produce parasitic inductances and parasitic resistances.

According to the present embodiment, the select lines 74 and the signal lines 76, together with the drive circuits 72, are formed on the circuit board 130. Since the select lines 74 and the signal lines 76 can freely be laid out and formed irrespective of the layout of the actuators 22, the freedom of interconnection design is increased, and it is expected that parasitic inductances and parasitic resistances can be reduced.

The circuit board 130 may be made of ceramics, glass, plastic (in the form of a plate or film), or the like. If the circuit board 130 is made of glass, then it should preferably be highly resistant to heat and contain few of small surface defects. Commercially available glass includes Eagle2000, Code1737 manufactured by Corning Incorporated, NA35 manufactured by Nippon Sheet Glass, and AN635 manufactured by Asahi Glass.

If the circuit board 130 is made of plastic, then it is advantageous in that it is lightweight, strong, soft, and can be manufactured according to a roll-to-roll process which is advantageous as to cost. Since plastic suffers heat resistance problems, TFTs should be fabricated at low temperatures.

Figure 23:
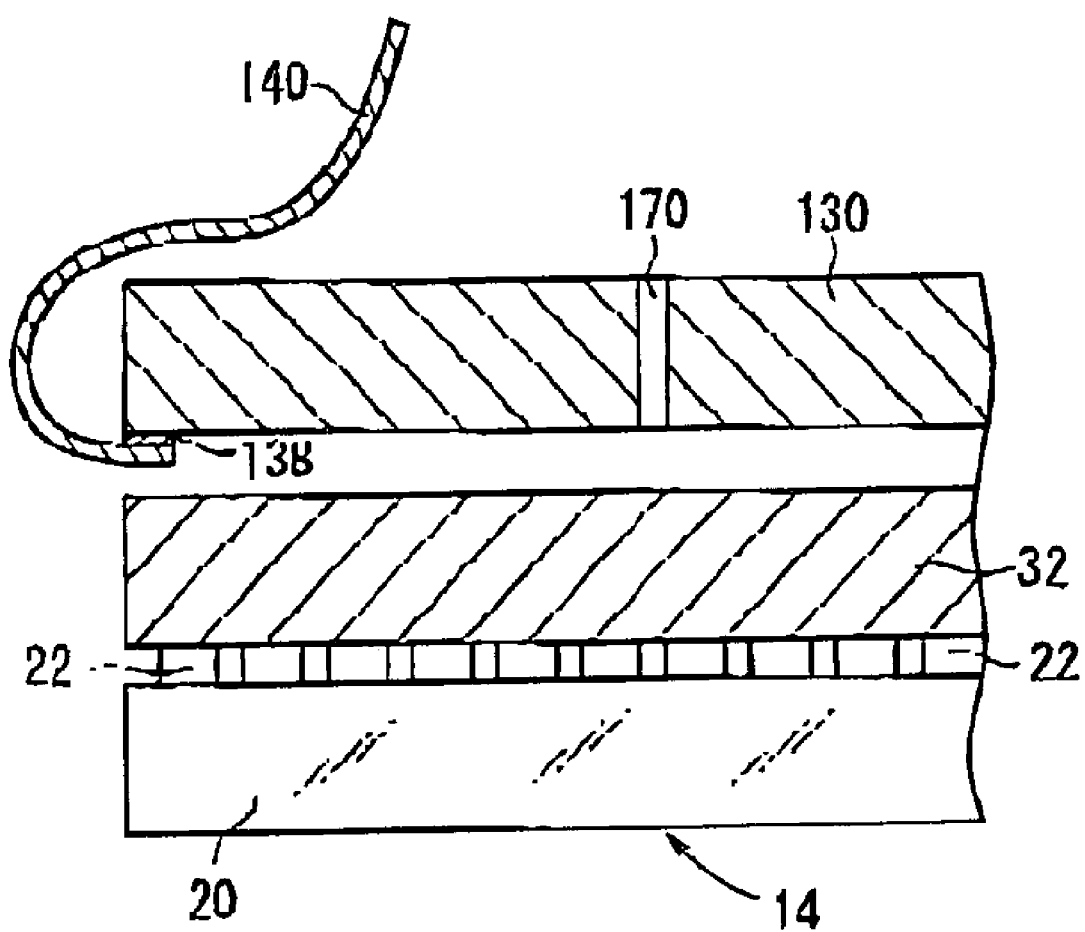
FIG. 23 is a view showing an example in which a number of wires from a drive unit on a principal surface of the circuit board extend out of the circuit board.

As shown in FIG. 21, a low-voltage logic IC 136 may be used to supply the drive signals Ss to the select line 74, the data signal Sd to the signal lines 76, and the electric power to the logic gate 90. In this case, a number of lines from the drive unit 70 on the principal surface of the circuit board 130 need to be extended out of the circuit board 130. As shown in FIG. 23, the circuit board 130 may be connected to the low voltage logic IC 136 (see FIG. 21) from a bonded region between the actuators 22 and the circuit board 130 directly through an ACF (Anisotropic Conductive Film) 138 and a cable 140 comprising an FPC (Flexible Printed Circuit) or a TAB (Tape Automated Bonding) circuit.

However, since there needs a space for accommodating the cable 140 therein, the gaps at the junctions between the display elements 14 become large in a large-size display device 10 which is made up of a number of display elements 14 as shown in FIG. 1.

Figure 24:
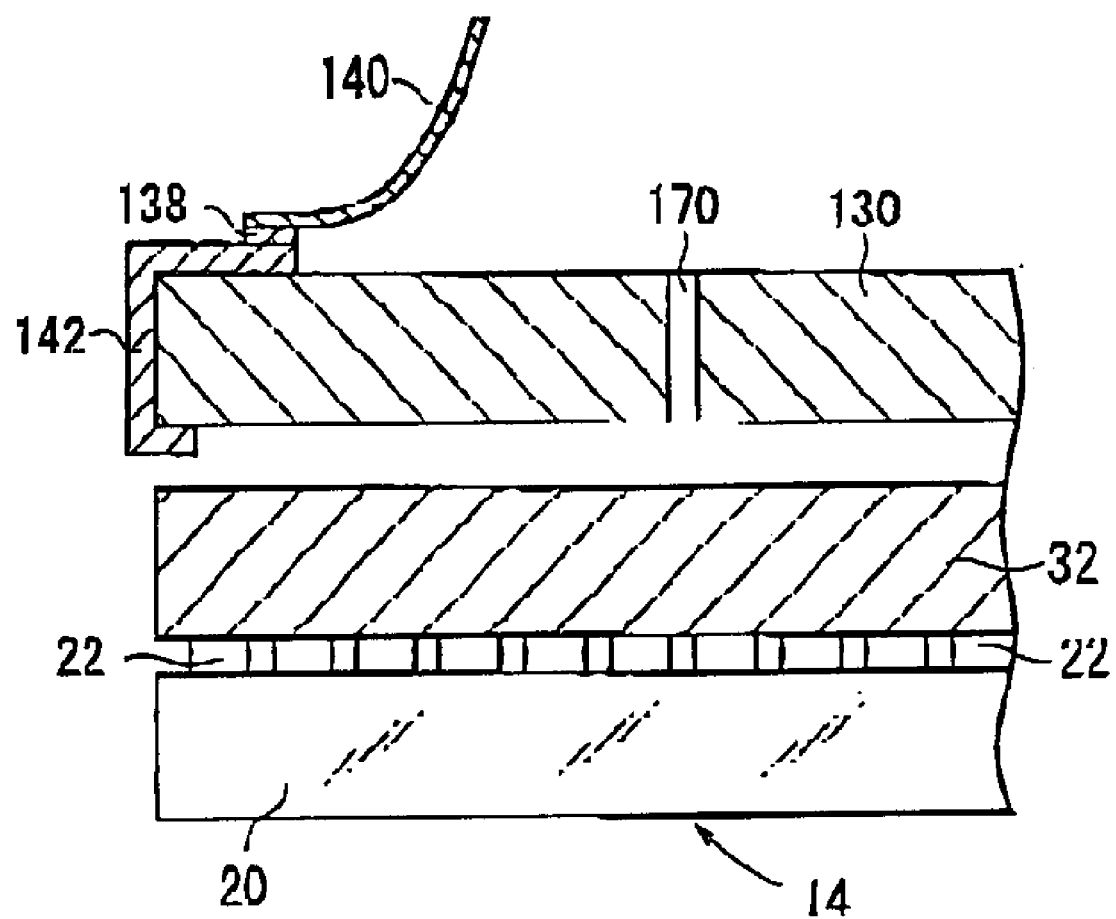
FIG. 24 is a view showing another example in which a number of wires from a drive unit on a principal surface of the circuit board extend out of the circuit board.

According to the present embodiment, if the circuit board 130 is made of glass, then, as shown in FIG. 24, a wiring pattern 142 is printed from one principal surface of the circuit board 130 across an end thereof to the reverse side of the circuit board 130 (end face printing), where the wiring pattern 142 is connected to the low-voltage logic IC 136 (see FIG. 21) through the ACF 138 and the cable 140.

If the circuit board 130 is made of plastic or ceramics, then, as shown in FIG. 22, the through holes 144 are formed in the circuit board 130 in alignment with the respective drive circuits 72, and wires may extend through the through holes 144.

With the above arrangements, the gaps at the junctions between the display elements 14 are so minimized that the joints between the display elements 14 are made visually less distinctive for displaying images of increased quality.

Figure 25:
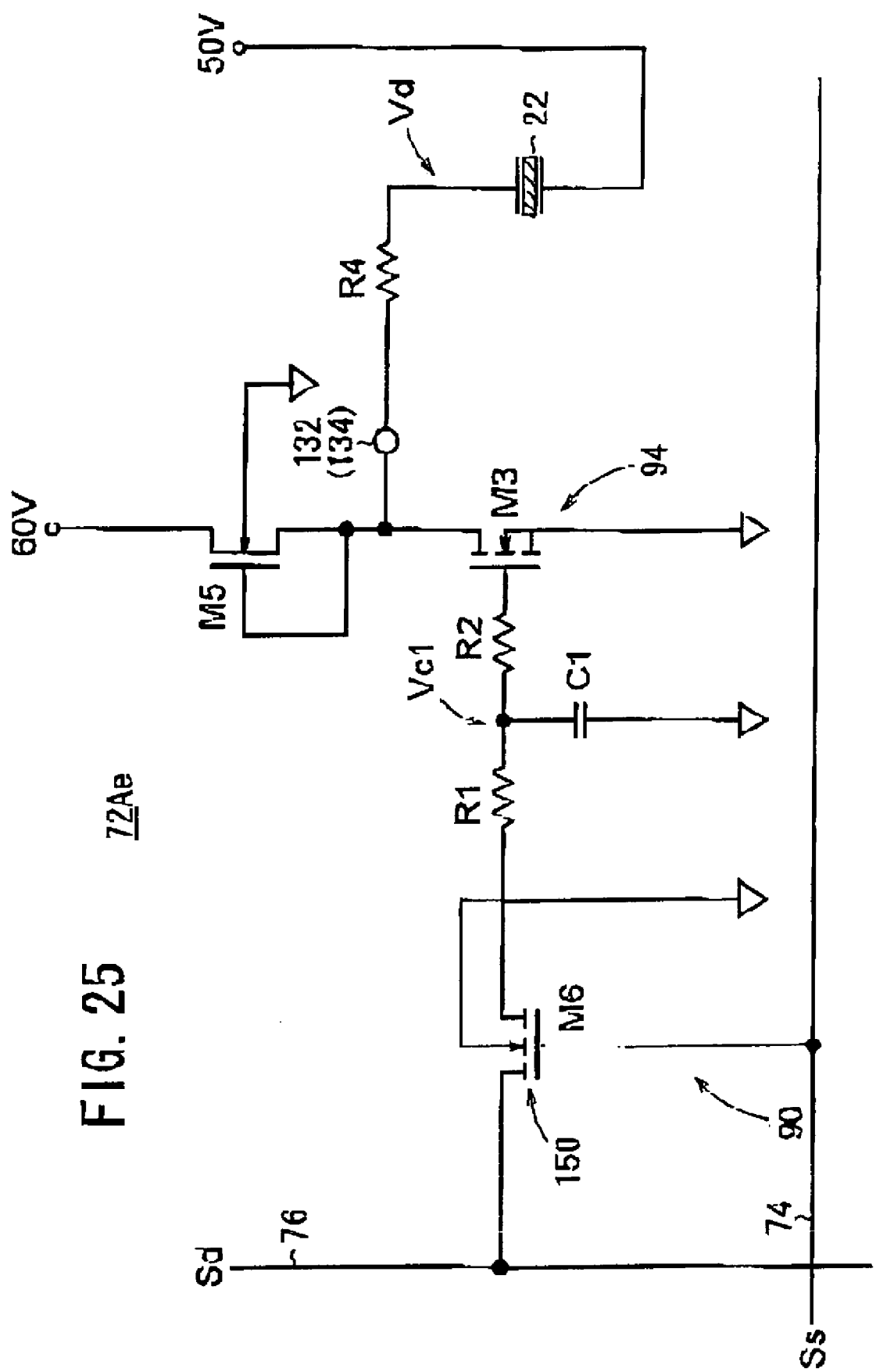
FIG. 25 is a circuit diagram of a drive circuit according to a fifth specific example.

A drive circuit 72Ae according to a fifth specific example will be described below with reference to FIG. 25. The drive circuit 72Ae according to the fifth specific example is similar to the drive circuit 72Aa according to the first specific example, but differs therefrom in that the logic gate 90 comprises a transfer gate 150 and the drive voltage generating circuit 94 has a depletion n-TFT (M5) connected in place of the voltage-drop resistor connected between the drain of the power TFT (M3) and the power supply. The power TFT (M3) comprises an enhancement n-TFT.

Moreover, the power TFT (M5) has the bias terminal connected to the semiconductor substrate. This bias terminal is electrically separated from the source. That is, the power TFT (M5) has four terminals. Therefore, the gate voltage of the power TFT (M5) is controllable based on the bias voltage Vsg (fixed voltage) supplied to a semiconductor substrate. Furthermore, as for the power TFT (M5), the gate and the source are connected electrically. In addition, the above-mentioned bias voltage Vsg is the grounding voltage Vss.

The transfer gate 150 comprises an n-TFT (M6), for example, which has a gate connected to the select line 74, an input terminal connected to the signal line 76, and an output terminal connected to one terminal of the capacitor C1 through a resistor R1. The resistors R1, R2 shown in FIG. 25 may not necessarily be included, and the capacitor C1 may not necessarily be included. A resistor R4 is connected between the drain of the power TFT (M3) and the upper electrode 48b of the actuator 22. In this example, the drain of the power TFT (M3) and the resistor R4 are connected to each other through an electrode pad 132 and an output pad 134 (see FIG. 22).

Here, operation of drive circuit 72Ae is explained. During the OFF of the power TFT (M3), the source voltage of the power TFT (M5) serves as a power supply voltage level. This source voltage is supplied to the gate of the power TFT (M5). The drain current Id of the power TFT (M5) increases. That is, the resistance Rds between the drain and the source of the power TFT (M5) becomes low. Therefore, the time constant of CR by the capacity of the actuator 22 and the resistance Rds of the power TFT (M5) becomes small. The Charging of the actuator 22 is performed at high speed.

On the other hand, the source voltage of the power TFT (M5) is set to the source voltage level (for example, grounding voltage level) of the power TFT (M3) during the ON of the power TFT (M3). This voltage is applied to the gate of the power TFT (M5). The drain current Id of the power TFT (M5) decreases. That is, the resistance Rds of the power TFT (M5) becomes high. The power TFT (M5) functions as a pull-up resistance. In this case, the potential of one electrode of the actuator 22 turns into source potential (for example, grounding potential) of the power TFT (M3) by a voltage-drop in the power TFT (M5). That is, the power consumption by the power supply voltage supplied to the power TFT (M5) becomes low.

If the drive voltage generating circuit 94 employs a push-pull circuit 110 as with the drive circuit 72Ab according to the second specific example, then it can provide an area where the power TFT (M3) is to be formed, but requires two conductivity types, i.e., a p channel and an n channel. If the drive voltage generating circuit 94 comprises a single power TFT (M3) and a voltage-drop resistor R3 (see FIG. 9) connected between the drain of the power TFT (M3) and the power supply, then the drive voltage generating circuit 94 needs only one conductivity type, but may fail to provide an area where the power TFT (M3) is to be formed because a thin-film resistor for use as the resistor R3 requires a large area.

With the drive circuit 72Ae according to the fifth specific example, the depletion n-TFT (M5) used in place of the resistor R3 allows all the TFTs to be constructed of one conductivity type (e.g., an n channel), making it possible to use a material such as a CdSe material which can produce an n channel only.

With the drive circuit 72Ae according to the fifth specific example, furthermore, the number of TFTs used is greatly reduced because the logic gate 90 is in the form of the transfer gate 150 which comprises a single n-TFT (M6).

Next, it explains, referring to FIG. 26A–FIG. 29B about some modifications of drive circuit 72Ae. FIG. 26A, FIG. 27A, FIG. 28A, and FIG. 29A show only the portion of the drive voltage generating circuit 94 for simplification. And each of these modifications is types which apply fixed voltage to the gate of the power TFT (M5).

Figure 26A:
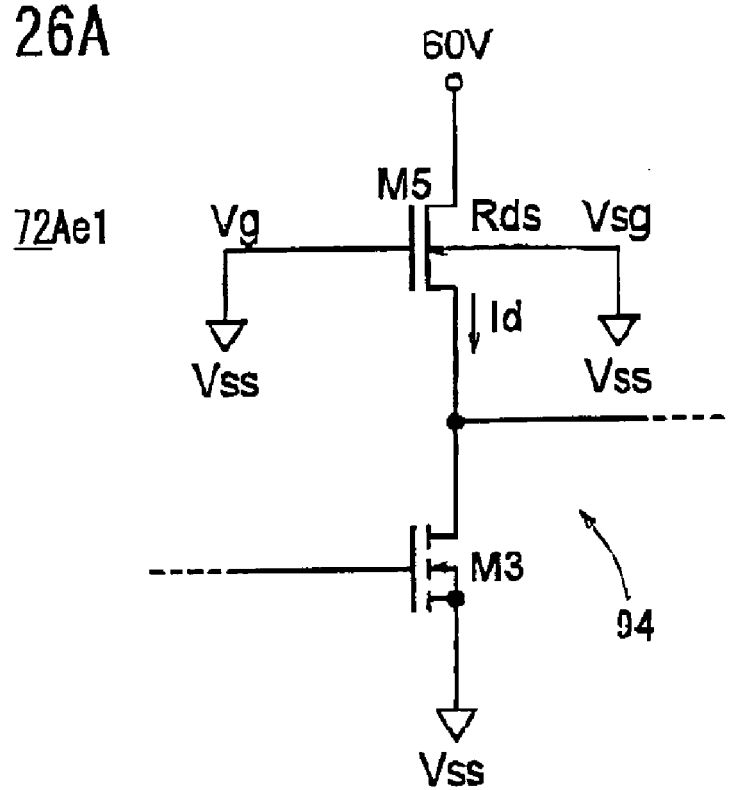
FIG. 26A is a circuit diagram showing a part of the first modification of the drive circuit according to the fifth specific example.
Figure 26B:
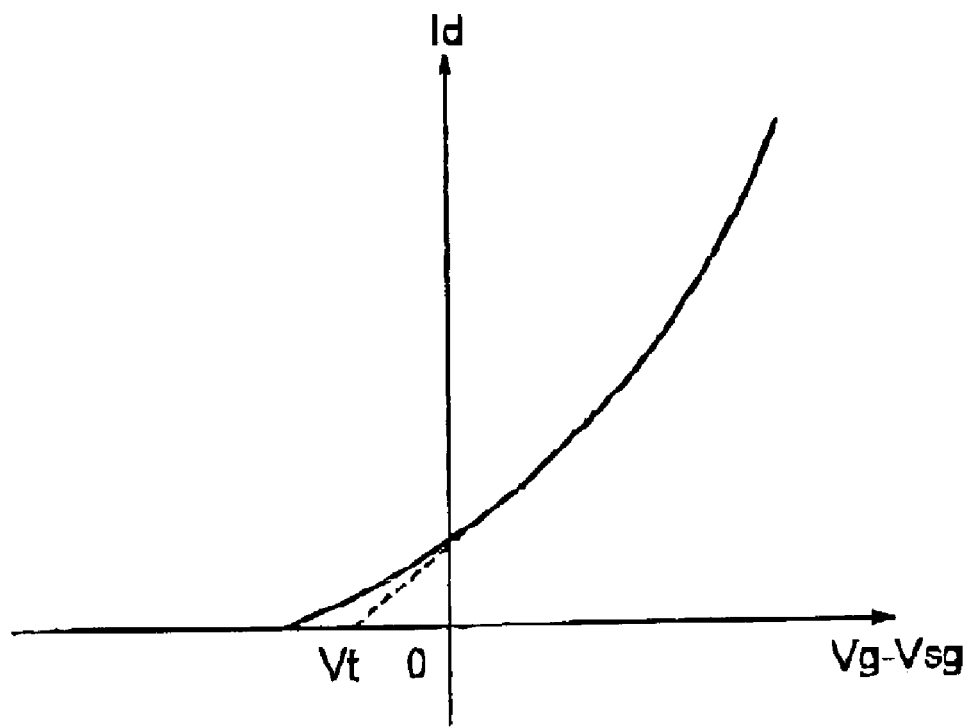
FIG. 26B is the figure showing the input-and-output characteristic of the power TFT (M5) concerning the first modification.

As shown in FIG. 26A, the power TFT (M5) of the drive circuit 72Ae1 is a n-channel depletion mode FET. This power TFT (m5) of the drive circuit 72Ae1 functions as a pull-up resistance. The conditions of the voltage (threshold voltage) Vt required in order to pass drain current are Vg–Vsg>Vt (negative voltage) from the input-and-output characteristic of FIG. 26B, the Vg is the gate voltage of the power TFT (M5), and the Vsg is the bias voltage of the semiconductor substrate. Therefore, if the gate voltage Vg is enlarged, the resistance Rds of the power TFT (M5) become small.

In the drive circuit 72Ae1, if it is Vg=Vsg=Vss (grounding voltage), it is not necessary to prepare a new power supply line. The design of a display becomes easy. The manufacture cost of a display is also reduced.

Figure 27A:
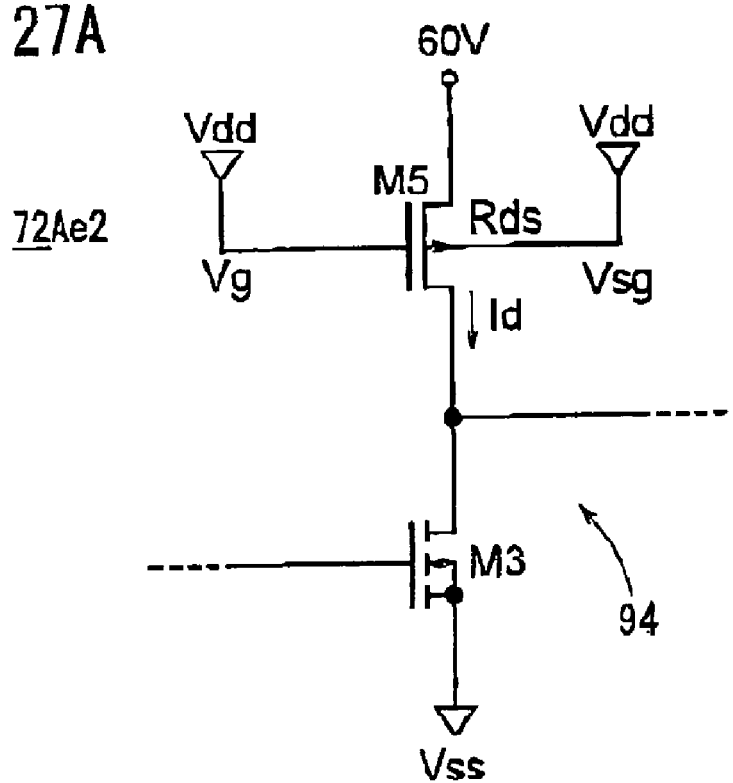
FIG. 27A is a circuit diagram showing a part of the second modification of the drive circuit according to the fifth specific example.
Figure 27B:
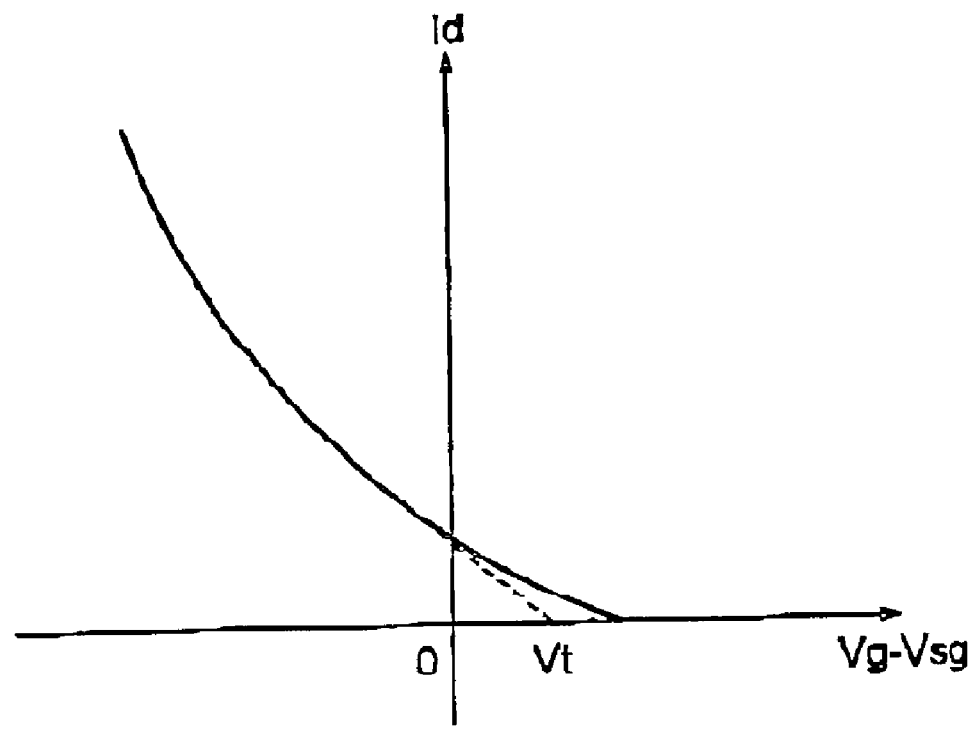
FIG. 27B is the figure showing the input-and-output characteristic of the power TFT (M5) concerning the second modification.

As shown in FIG. 27A, the power TFT (M5) of the drive circuit 72Ae2 is p-channel depletion mode TFT. This power TFT (M5) of the drive circuit 72Ae2 functions as a pull-up resistance. The conditions of the voltage Vt are Vg–Vsg<Vt (positive voltage) from the input-and-output characteristic of FIG. 27B. Therefore, if the gate voltage Vg is made small, the resistance Rds of the power TFT (M5) become small. In the drive circuit Ae2, if it is Vg–Vsg–Vss (logic voltage of a high level), it is not necessary to prepare a new power supply line.

Figure 28A:
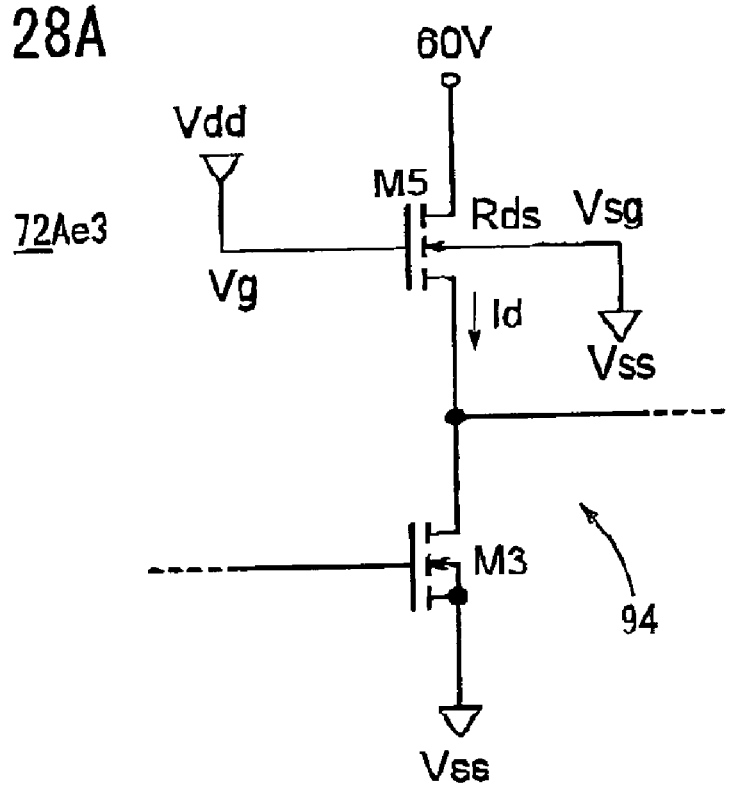
FIG. 28B is the figure showing the input-and-output characteristic of the power TFT (M5) concerning the third modification.
Figure 28B:
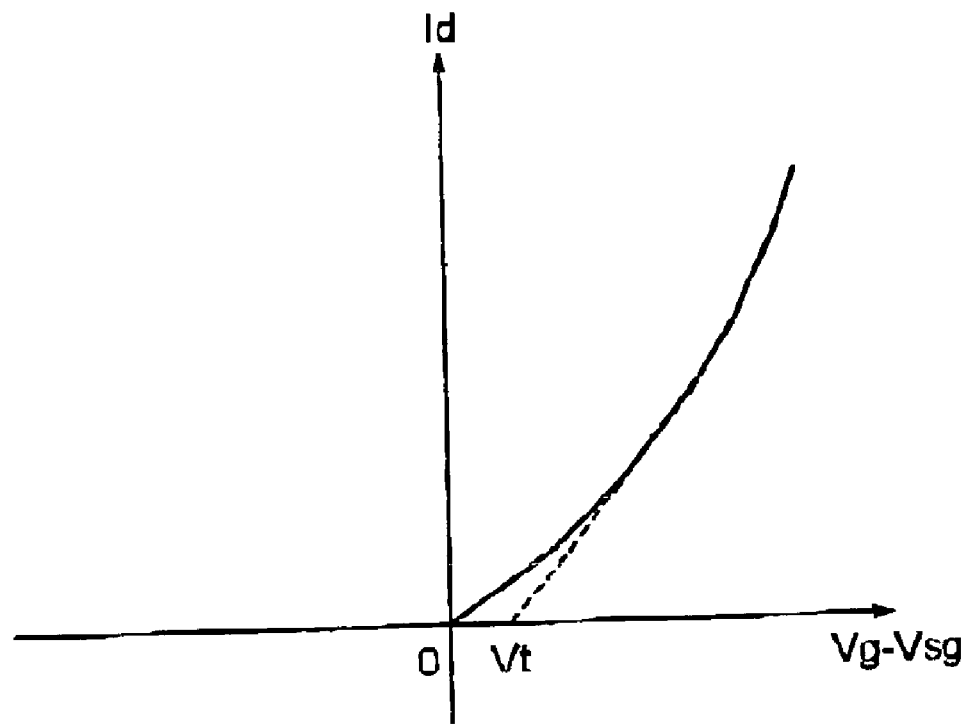

As shown in FIG. 28A, the power TFT (M5) of the drive circuit 72Ae3 is n-channel enhancement mode TFT. This power TFT (M5) of the drive circuit 72Ae3 functions as a pull-up resistance. The conditions of the voltage Vt are Vg–Vsg>Vt (positive voltage) from the input-and-output characteristic of FIG. 28B. Therefore, if the gate voltage Vg is made small, the resistance Rds of the power TFT (M5) become small. In the drive circuit Ae3, if it is Vg=Vdd and Vsg=Vss, it is not necessary to prepare a new power supply line.

Figure 29A:
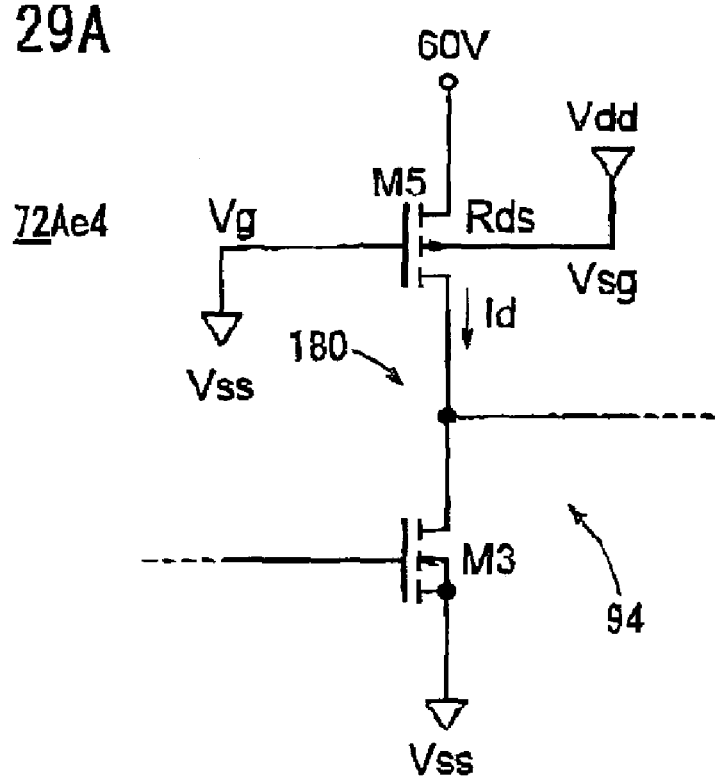
FIG. 29A is a circuit diagram showing a part of the forth modification of the drive circuit according to the fifth specific example.
Figure 29B:
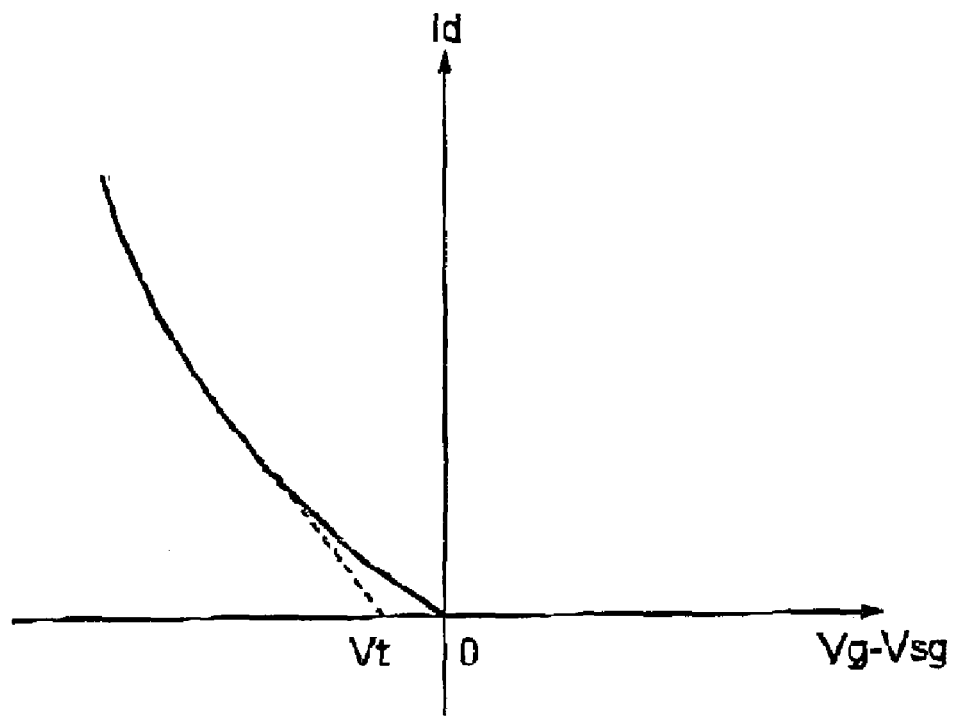
FIG. 29B is the figure showing the input and output characteristic of the power TFT (M5) concerning the forth modification.

As shown in FIG. 29A, the power TFT (M5) of the drive circuit 72Ae 4 is p-channel enhancement mode TFT. This power TFT (M5) of the drive circuit 72Ae 4 functions as a pull-up resistance. The conditions of the voltage Vt are Vg–Vsg<Vt (negative voltage) from the input-and-output characteristic of FIG. 29B. Therefore, if the gate voltage Vg is made small, the resistance Rds of the power TFT (M5) become small. In the drive circuit Ae3, if it is Vg=Vdd and Vsg=Vss, it is not necessary to prepare a new power supply line.

A drive circuit 72Af according to a sixth specific example will be described below with reference to FIG. 30. The drive circuit 72Af according to the sixth specific example is similar to the drive circuit 72Ae according to the fifth specific example, but has a drive voltage generating circuit 94 which differs from that of the drive circuit 72Ae as follows:

That is, the drive voltage generating circuit 94 of the drive circuit 72Af has the push pull circuit 180. This push pull circuit 180 has the power TFT (M3) and the power TFT (M5). The control voltage Vc1 is applied to the gate of the power TFT (M5) and to the gate of the power TFT (M3). The power TFT (M5) has the bias terminal connected to a semiconductor substrate like the drive circuit 72Ae. This bias terminal is electrically separated from the source. That is, the power TFT (M5) has four terminals. This power TFT (M5) of the drive circuit 72Af is a n-channel enhancement mode FET. Therefore, the control voltage Vc1 is applied to the gate of the power TFT (M5) through an inverter 182 and resistance R3. In addition, the resistance R1-R3 shown in FIG. 30 is not indispensable. Moreover, The capacity Cgs between the gate and the source of the power TFT (M3) can substitute a capacitor C1. The bias voltage Vsg is the grounding voltage Vss.

Figure 12:
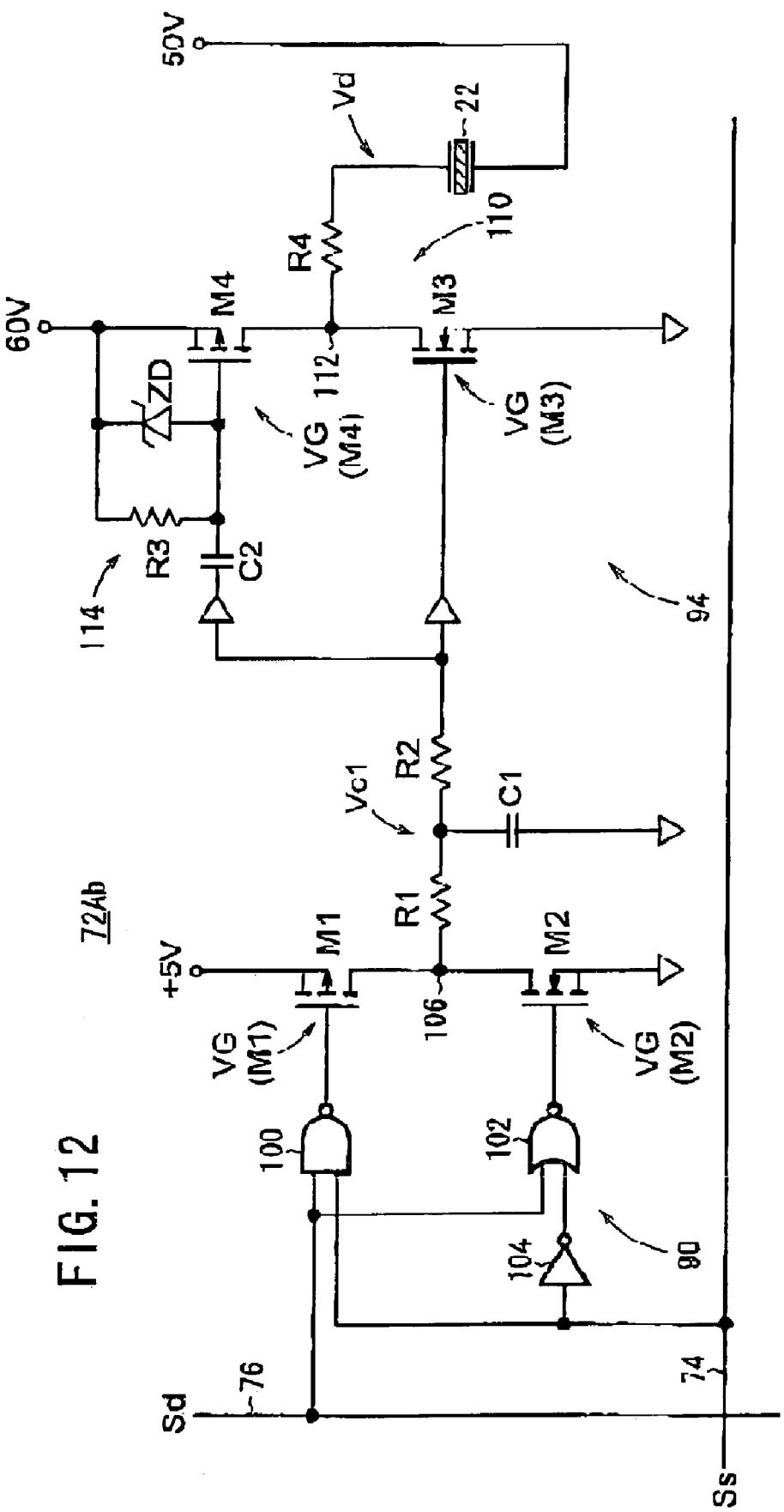
FIG. 12 is a circuit diagram of a drive circuit according to a second specific example.

For example, as shown in FIG. 12, a push pull circuit usually has the circuit where the p channel thin film transistor (the power TFT (M4)) and the n-channel thin film transistor (the power TFT (M3)) were connected in series. The push pull circuit obtains an output from the common drain. In this case, the source of the power TFT (M4) is connected to the power supply of the high voltage. The source of the power TFT (M3) is connected to the power supply of the low voltage. And a voltage more than the high voltage is applied to the gate of the power TFT (M4). Therefore, in the gate of the power TFT (M4), it is desirable to connect a protection circuit 114. However, since this protection circuit 114 has a capacitor C2, a zener diode ZD, etc., it is complicated.

Figure 30:
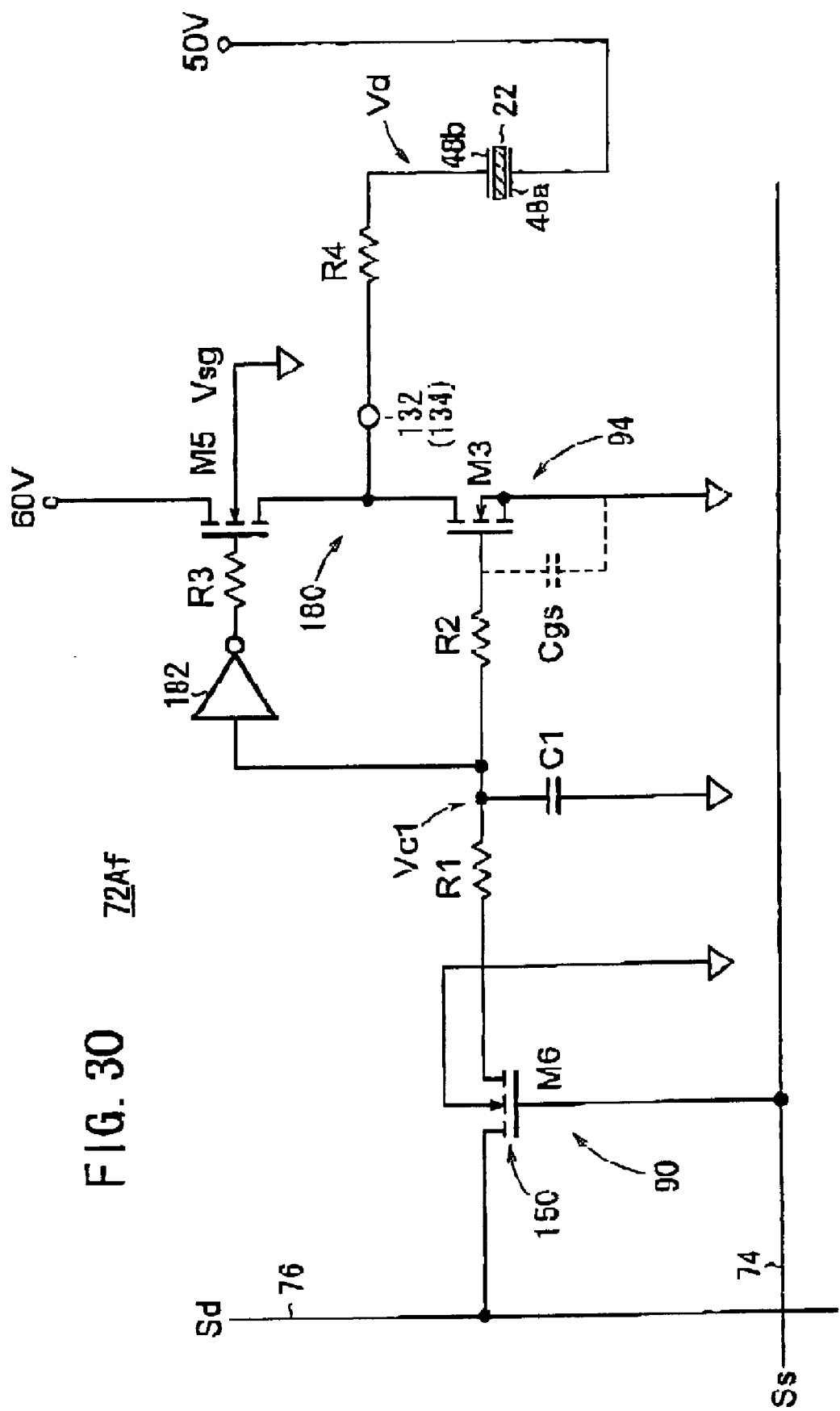
FIG. 30 is a circuit diagram of the drive circuit according to the sixth specific example.

On the other hand, as shown in FIG. 30, the power TFT (M5) of the drive circuit 72Af has the bias terminal connected to the semiconductor substrate. This bias terminal is electrically separated from the source. That is, the power TFT (M5) has four terminals. Therefore, the gate voltage of the power TFT (M5) is controllable based on the bias voltage (independent fixed voltage) applied to the semiconductor substrate.

Therefore, a voltage which is unrelated to the high voltage can be applied to the gate of the ower TFT (M5). That is, the signal level used for the usual logic circuit can be applied to the gate of the power TFT (M5). Therefore, a protection circuit is omissible. The circuit using the push pull circuit is simple.

The power TFT (M3) is a n-channel thin film transistor or a p-channel thin film transistor. The power TFT (M5) is a n-channel thin film transistor or a p-channel thin film transistor. In the drive circuit Af, the power TFT (M3) and the power TFT (M5) are n-channel thin film transistor, respectively. In this case, a control voltage is applied to the gate of the power TFT (M5) through an inverter.

Figure 31:
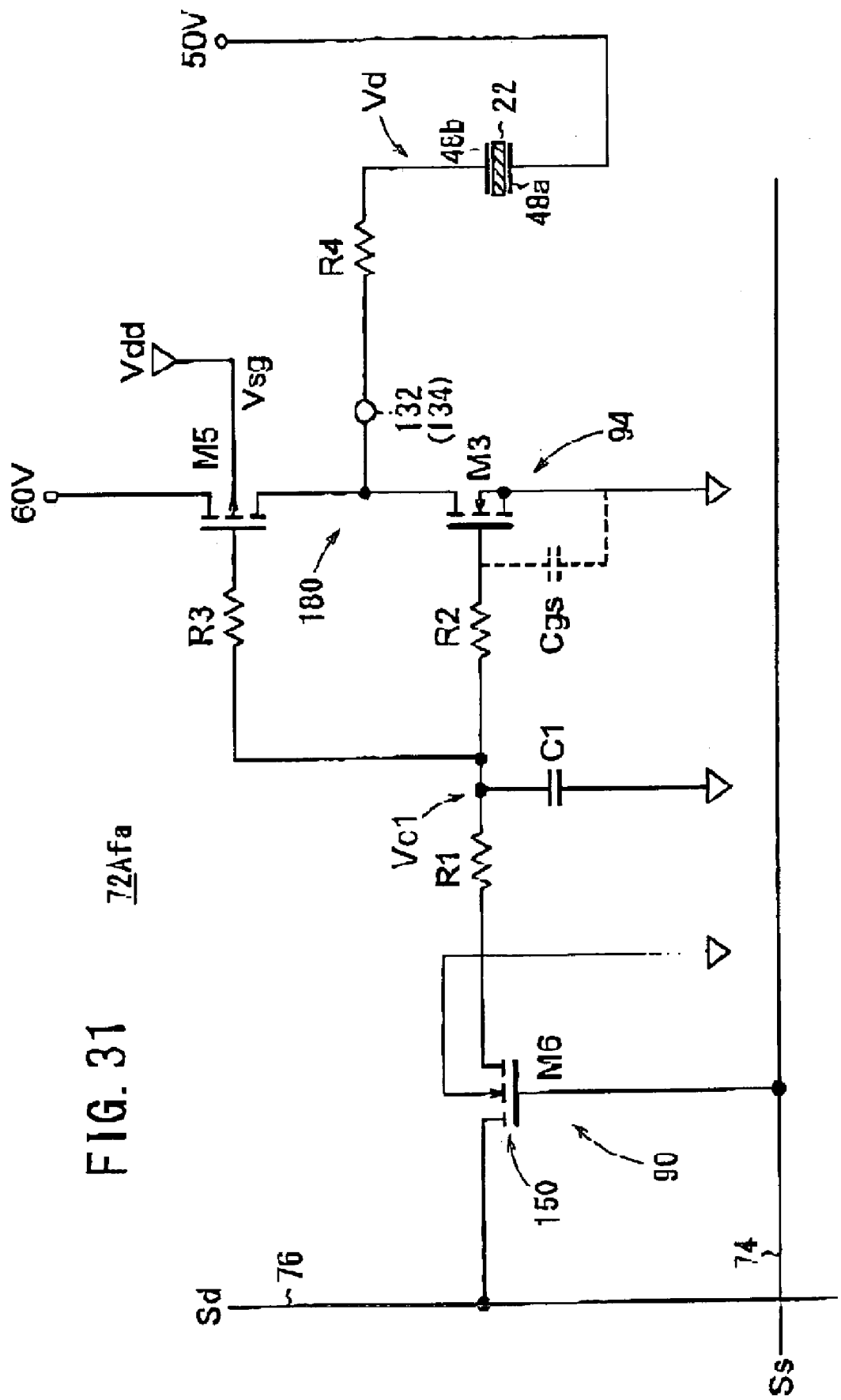
FIG. 31 is a circuit diagram showing a modification of the drive circuit according to the sixth specific example.

Next, the power TFT (M5) of the drive circuit 72Af shown in FIG. 31 is a p-channel enhancement mode FET. The bias voltage Vsg is the logic voltage (Vdd) of a high level.

In this case, the control voltage Vc1 can be directly applied to the gate of the power TFT (M5), without using the inverter 182 (referring to FIG. 30). Therefore, the drive circuit 72Afa is simple.

Figure 32:
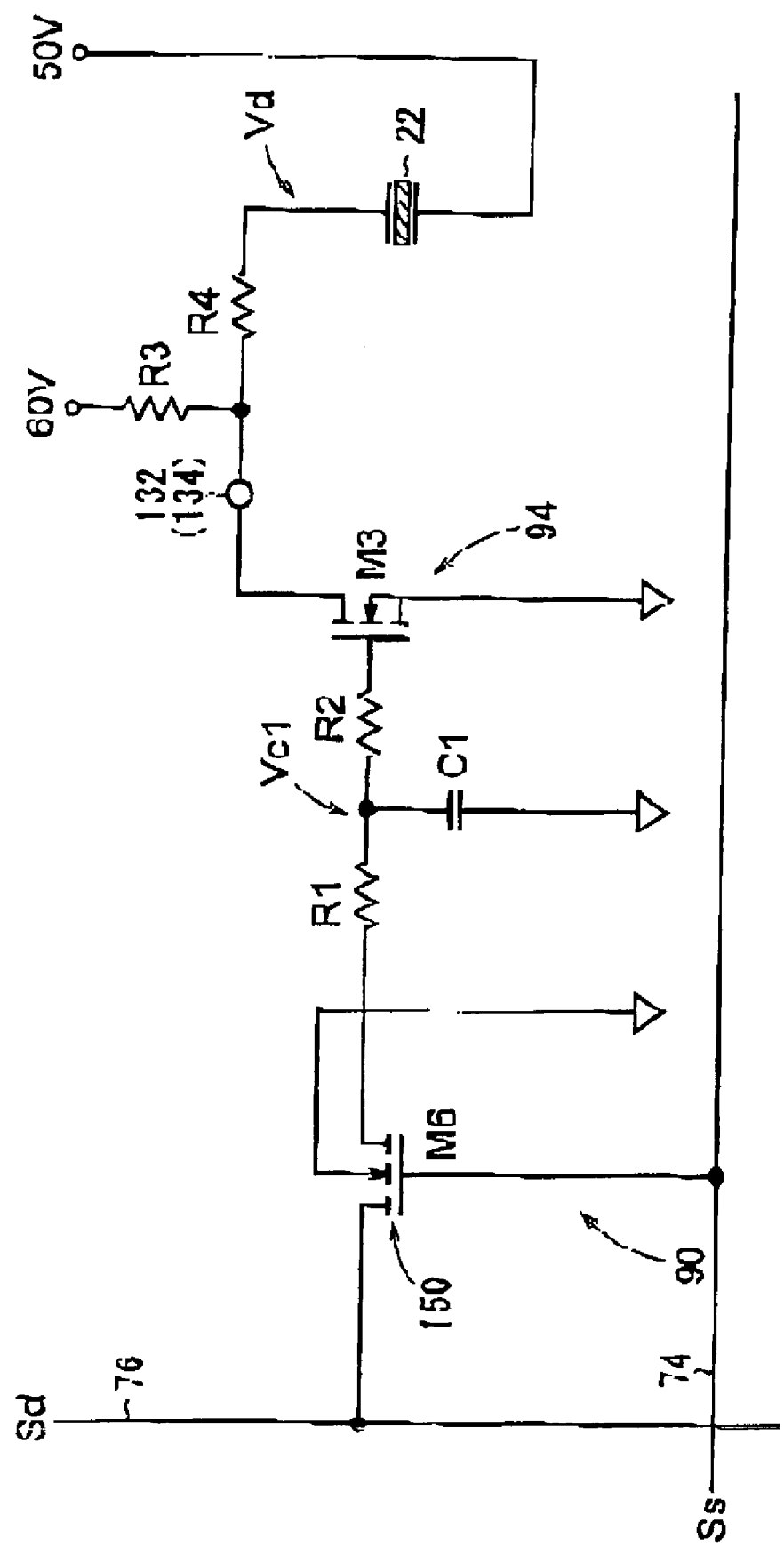
FIG. 32 is a circuit diagram of the drive circuit according to the seventh specific example.

A drive circuit 72Ag according to a seventh specific example will be described below with reference to FIG. 32. The drive circuit 72Ag according to the sixth specific example is similar to the drive circuit 72Ae according to the fifth specific example, but differs therefrom in that the power TFT (M3) in the drive voltage generating circuit 94 is of an open-drain circuit arrangement, and the pull-up resistor R3 which is one of the components of the drive voltage generating circuit 94 is formed on the actuator board 32.

The drive circuit 72Ag according to the seventh specific example, which is formed on the circuit board 130, requires only two TFTs, i.e., the n-TFT (M6) as the transfer gate 150 and the power TFT (M3) which is one of the components of the drive voltage generating circuit 94. Therefore, the number of TFTs formed on the circuit board 130 is greatly reduced.

Each of the TFTs may be made of copper sulfide, amorphous silicon, polycrystalline silicon, CdSe, or CdS formed on an insulating substrate such as a glass substrate, a plastic substrate, or the like, or may be made of organic materials, which include an electrically conductive polymer, an organic solvent, and an alcohol-base solvent used as electrodes, semiconductor layers, and insulating layers, formed on an insulating substrate such as a glass substrate, a plastic substrate, or the like.

The TFTs may be fabricated by a thin film fabrication process based on a combination of sputtering film growth, lithography, and etching (RTE or the like), a thick film printing process, or an ink jet process for an interconnection forming step, and a thin film fabrication process based on a combination of CVD, lithography, and etching (RIE or the like), a thick film printing process, or an ink jet process for a TFT forming step.

Since the drive circuit 72Ag formed the pull-up resistance R3 in the actuator board 32, it can acquire the following effects. That is, when adjusting the resistance of the pull-up resistance R3 to the resistance which suits the electrostatic capacity of the actuator 22, it can carry out regardless of the circuit manufacture process of the drive circuit 72 prepared in the circuit board 130.

Therefore, in the circuit manufacture to the circuit board 130, the troublesomeness of changing the pattern of the pull-up resistance R3 separately is lost. The circuit which communalized specification to the electrostatic capacity of the actuator 22 can be manufactured. The design of the display device 10 becomes easy. The manufacture cost of the display device 10 is also reduced.

A drive circuit 72B according to a second embodiment of the present invention will be described below with reference to FIG. 33.

Figure 33:
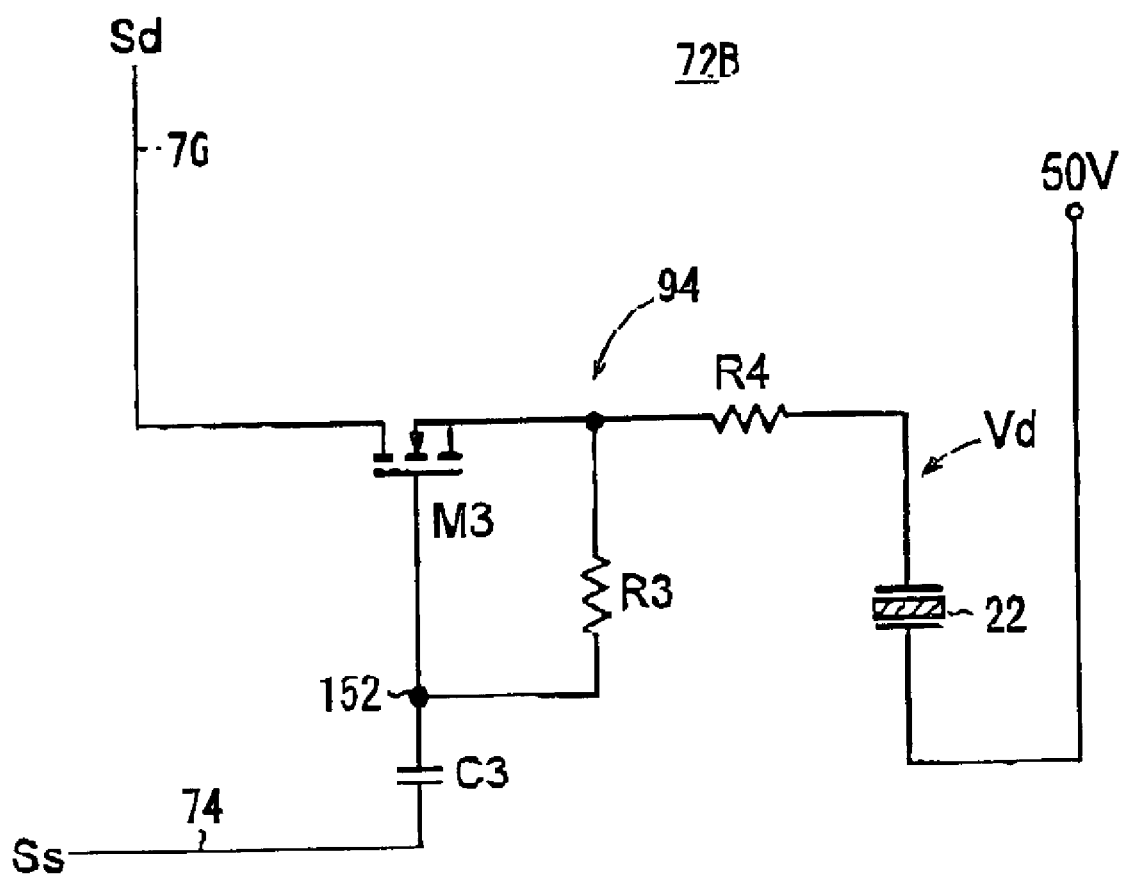
FIG. 33 is a circuit diagram of a drive circuit according to a second embodiment of the present invention.

As shown in FIG. 33, the drive circuit 72B according to the second embodiment has an n-channel power TFT (M3), a capacitor C3, and a resistor R5.

Specifically, the power TFT (M3) has a drain connected to the signal line 76 and a gate connected to the select line 74 through a capacitor C3 (for AC coupling). A resistor R3 is connected between a junction 152 between the gate of the power TFT (M3) and the capacitor C3 and the source of the power TFT (M3). The source of the power TFT (M3) is connected to the upper electrode 48b of the actuator 22 through a resistor R4.

The drive signal Ss (select voltage) supplied to the select line 74 has a high level of 5 V and a low level of 0 V. The data signal Sd (control voltage) supplied to the signal line 76 has a high level of 60 V and a low level of 0 V.

Operation of the drive circuit 72B according to the second embodiment will be described below with reference to FIG. 34. It is assumed that a certain potential (e.g., 50 V) is applied to the lower electrode 48a of each actuator 22.

Figure 34:
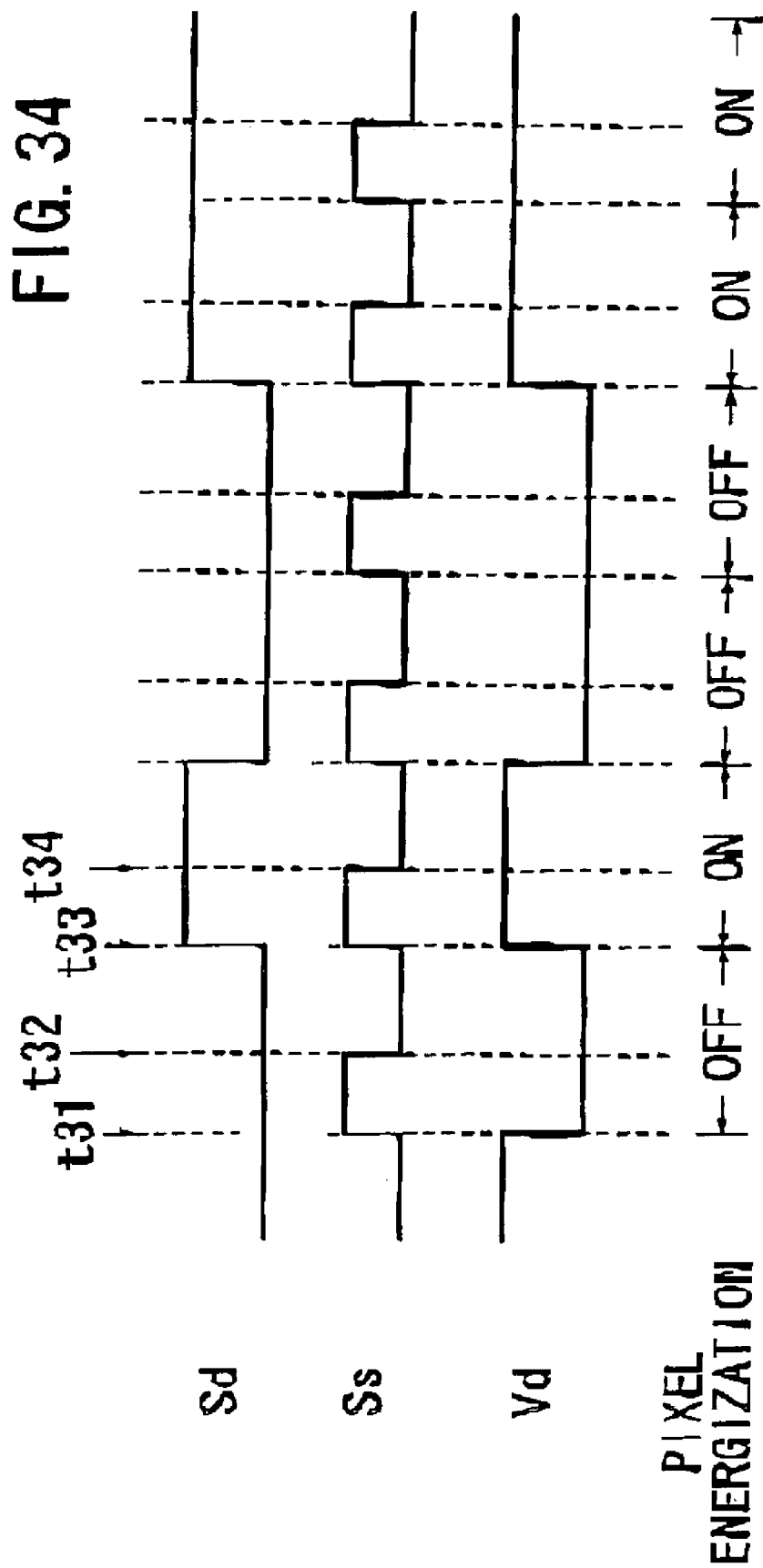
FIG. 34 is a timing chart of operation of the drive circuit according to the second embodiment.

When the data signal Sd supplied to the signal line 76 is of a low level and the drive signal Ss supplied to the select line 74 is of a high level at a time t31 in FIG. 34. since a voltage which is the sum of a source voltage (60 V at this stage) and a high-level voltage (5 V) is applied to the gate of the power TFT (M3), the power TFT (M3) is turned on. At this time, a current flows from the upper electrode 48b of the actuator 22 into the signal line 76 (discharging) until the potential of the upper electrode 48b becomes a low level (0 V). As a result, a high-level voltage (50 V) is applied between the electrodes 48a, 48b of the actuator 22, which is displaced downwardly to extinguish (turn off) the pixel corresponding to the actuator 22.

Thereafter at a time t32, when the drive signal Ss supplied to the select line 74 goes low in level (0 V), a source voltage (0 V) is applied to the gate of the power TFT (M3). Because there is no potential difference between the gate and source of the power TFT (M3), the power TFT (M3) is turned off. As a result, the impedance at the junction 152 is increased, holding the high-level voltage (50 V) across the actuator 22. The pixel corresponding to the actuator 22 thus remains turned off.

Thereafter at a time t33, when the drive signal Ss supplied to the select line 74 goes high in level and the data signal Sd supplied to the signal line 76 goes high in level, since a voltage which is the sum of a source voltage (0 V at this stage) and a high-level voltage (5 V) is applied to the gate of the power TFT (M3), the power TFT (M3) is turned on. AT this time, a current flows from the signal line 76 into the upper electrode 48b of the actuator 22 (charging) until the potential of the upper electrode 48b becomes a high level (60 V). As a result, a low-level voltage (−10 V) is applied between the electrodes 48a, 48b of the actuator 22, which is displaced upwardly to energize (turn on) the pixel corresponding to the actuator 22.

Thereafter at a time t34, when the drive signal Ss supplied to the select line 74 goes low in level (0 V), a source voltage (60 V) is applied to the gate of the power TFT (M3). Because there is no potential difference between the gate and source of the power TFT (M3), the power TFT (M3) is turned off. As a result, the impedance at the junction 152 is increased, holding the low-level voltage (−10 V) across the actuator 22. The pixel corresponding to the actuator 22 thus remains turned on.

Inasmuch as the gate of the power TFT (M3) and the select line 74 are Ac-coupled to each other by the capacitor C3, the voltage of the source is reflected in the gate by the resistor R3 connected between the junction 152 between the gate of the power TFT (M3) and the capacitor C3 and the source of the power TFT (M3). Consequently, the voltage supplied to the select line 74 may be a binary output of a low logic voltage irrespective of the voltage applied to the source of the power TFT (M3).

Furthermore, since the withstand voltage of the gate of the power TFT (M3) may be considered based on the low logic voltage, the size of a drive circuit system may be reduced, offering an advantage for the fabrication of the power TFT (M3) in a space corresponding to the area of the actuator 22.

In the drive circuits 72A, 72B according to the first and second embodiments, if the power TFT (M3) is used as the drive voltage generating circuit 94, then the channel length of the power TFT (M3) determines the withstand voltage, and the channel width thereof determines the drain current.

As the actuator 22 is electrostatically capacitive, it is important to supply a large drain current for charging and discharging the actuator 22 at a high speed. To supply a large drain current, it is necessary to increase the channel width, resulting in a need for a power TFT having a channel width which is extremely large as compared with its channel length.

This suggests that there is a limitation on the formation of a power TFT (M3) in a limited space with a prescribed aspect ratio, in view of the fact that the aspect ratio of the planar shape of the actuator 22 as the pixel is prescribed.

Figure 35:
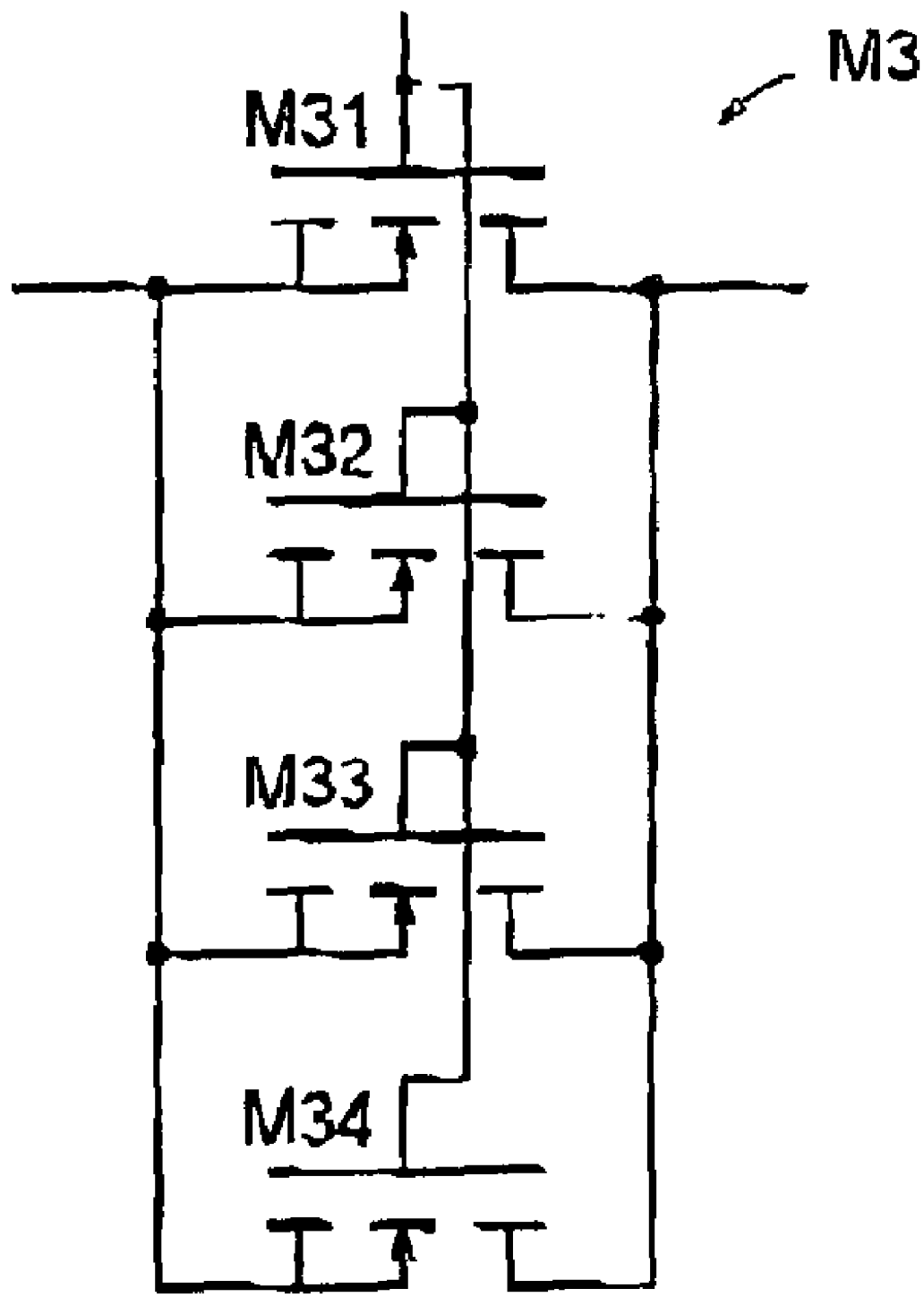
FIG. 35 is a circuit diagram of a power (TFT)(M3) made up of a combination of small-size(M31–M34) TFTs.

As shown in FIG. 35, the power TFT (M3) comprises an array of small-size TFTs (M31 through M34) whose sources and drains are connected in common, and is constructed as one module for performing switching operation with a common gate signal.

Specifically, the single module comprising an array of small-size transistors (M31 through M34) each having a small channel width is used as the power TFT (M3) of the drive voltage generating circuit 94. These small-size TFTs (M31 through M34) have their sources and drains connected in common (current paths of the drains and the sources are parallel to each other), and are energized by a common gate signal.

With this arrangement, it is possible to make flexible the layout of the area where the power TFT (M3) is to be formed.

A drive circuit 72C according to a third embodiment of the present invention will be described below with reference to FIGS. 36 through 44.

Figure 36:
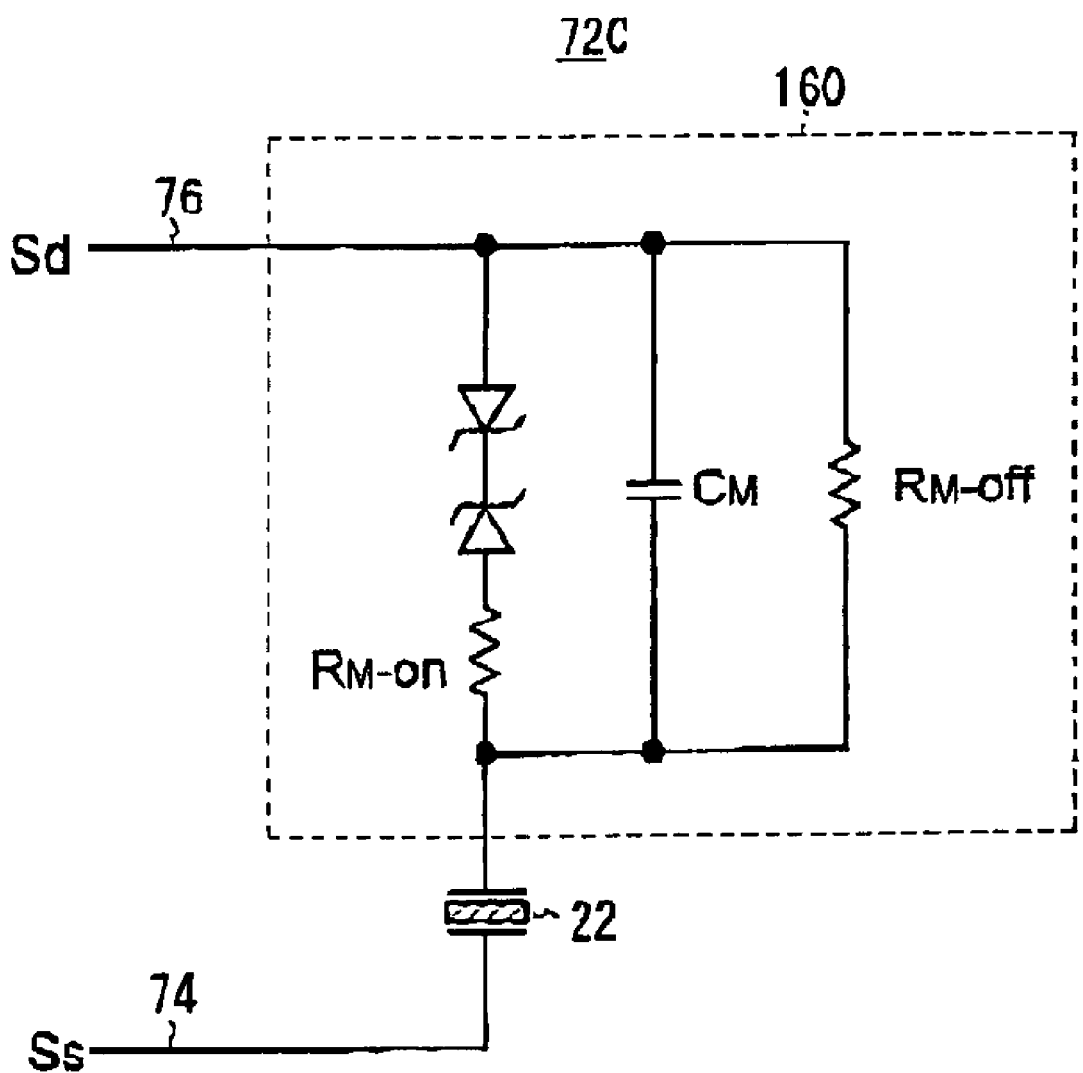
FIG. 36 is a circuit diagram of a drive circuit according to a third embodiment of the present invention.

As shown in FIG. 36, the drive circuit 72C according to the third embodiment has an MIM (Metal-Insulator-Metal) device 160, for example, which is a two-terminal nonlinear device. The select line 74 is connected to the lower electrode 48a of the actuator 22, and the signal line 76 is connected to the upper electrode 48b of the actuator 22 through the MIM device 160. In FIG. 36, a region indicated by the broken line represents an equivalent circuit of the MIM device 160.

Figure 39:
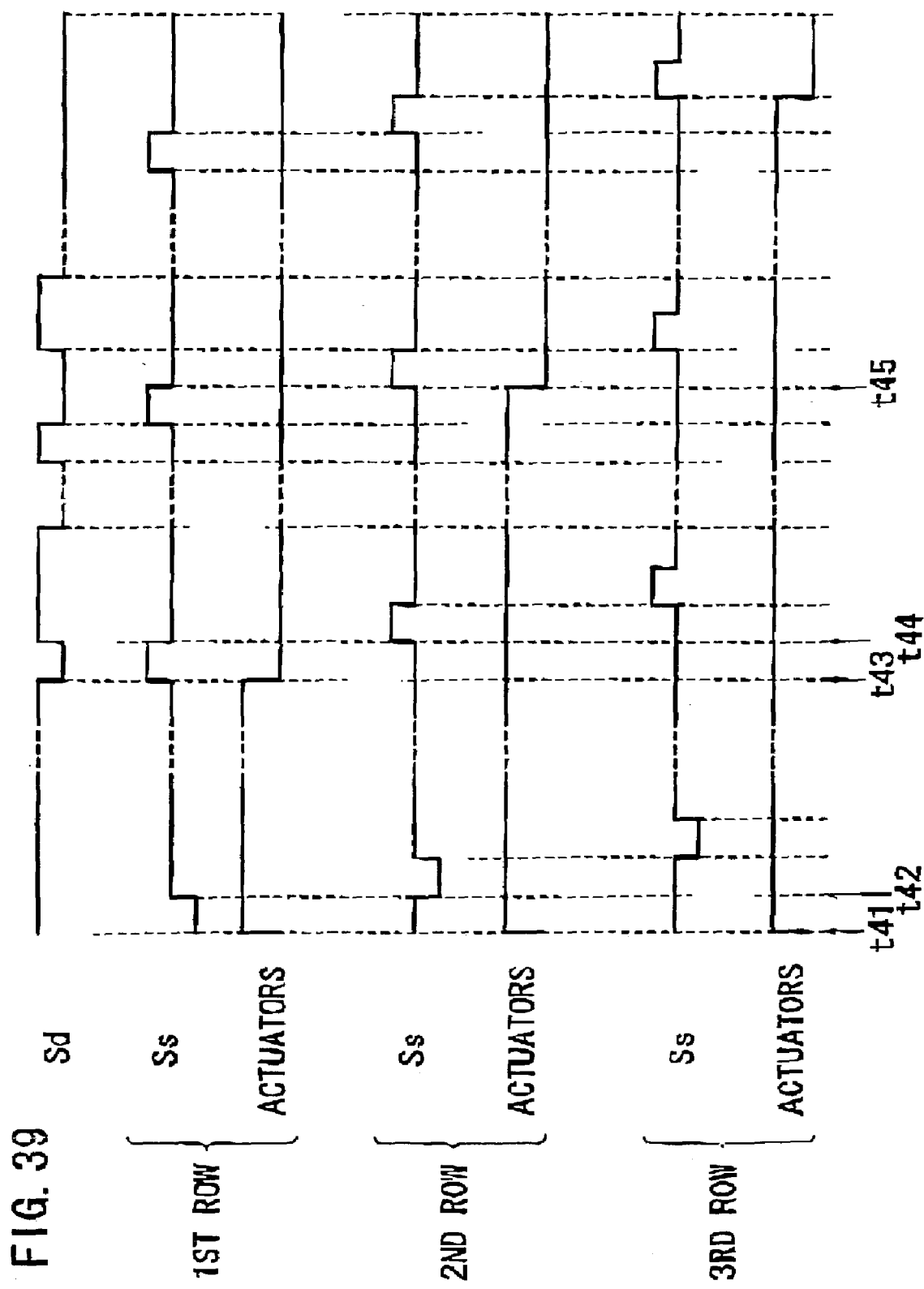
FIG. 39 is a diagram showing the waveforms of a data signal and drive signals for achieving the drive pattern shown in FIG. 37 and the waveforms of voltages applied to actuators by the data signal and the drive signals.

In a display element 14 which employs the drive circuit 72C according to the third embodiment, the drive signal Ss outputted from the select line 74 has three-valued levels which include, as shown in FIG. 39, a reset level (e.g., −70 V), a select level (e.g., 70 V), and an unselect level (e.g., 0 V). When the drive signal Ss is of a reset level, each pixels is reset, i.e., extinguished.

The data signal Sd outputted from the signal line 76 has an ON level of −10 V, for example, and an OFF level of 50 V, for example.

Figure 38:
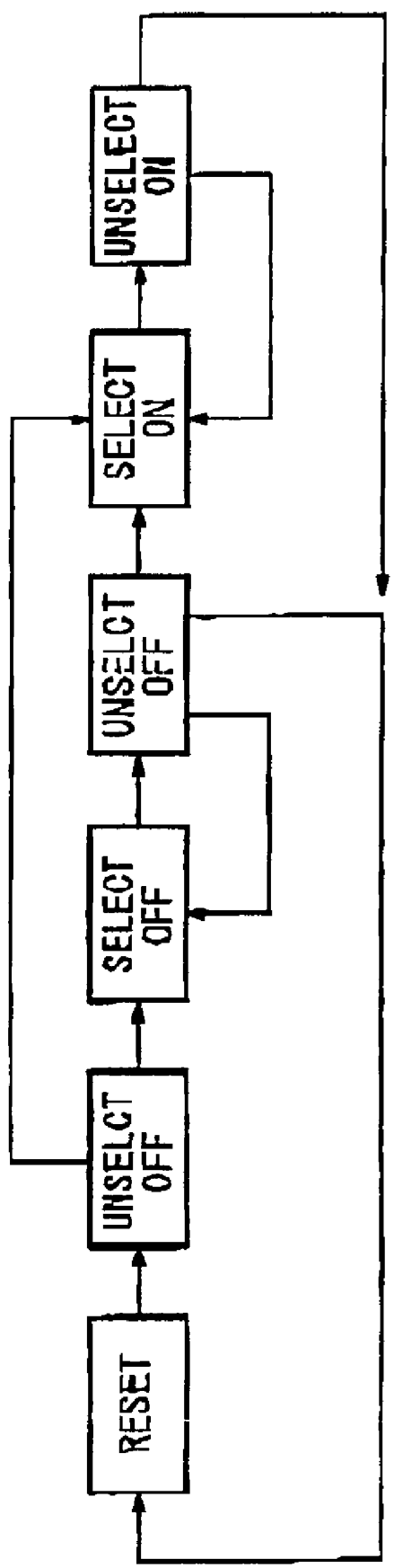
FIG. 38 is a diagram showing operation transitions in the drive circuit according to the third embodiment.

In the third embodiment, as shown in FIG. 38, the drive circuit operates in five modes, i.e., a reset mode (OFF), a select mode (ON), a select mode (OFF), an unselect mode (ON), and an unselect mode (OFF), based on some regularity, depending on the levels of the drive signal Ss from the select line 74 and the levels (ON/OFF) of the data signal Sd from the signal line 76.

Specifically, all the rows are extinguished by successively resetting all the rows and outputting parallel data signals (OFF) through the signal lines 76 to the groups of pixels in the reset rows.

Thereafter, an image can be displayed on the surface of the light waveguide panel 20 by successively selecting all the rows and outputting parallel data signals Sd through the signal lines 76 to the groups of pixels in the reset rows.

Figure 37:
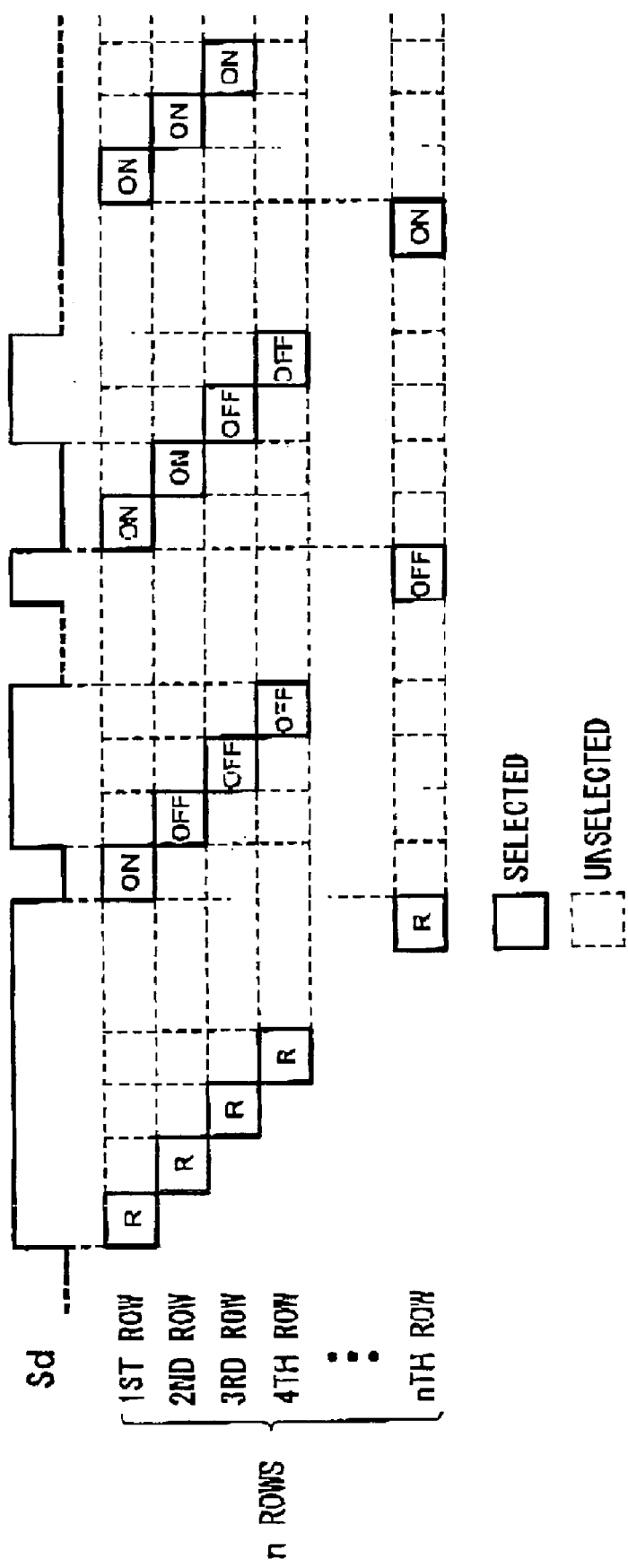
FIG. 37 is a diagram showing a drive pattern for a group of pixels in a first column in the drive circuit according to the third embodiment.

For example, a first column of pixels will be considered below. As shown in FIGS. 37 and 39, in order to successively reset first, second, . . . , nth rows in timed relation to a horizontal synchronizing signal, the select lines 74 successively output low-level pulse signals (drive signals Ss), and the signal lines 76 output a data signal Sd (OFF) for the first, second, . . . , nth rows.

Then, in order to successively select first, second, . . . , nth rows in timed relation to a horizontal synchronizing signal, the select lines 74 successively output high-level pulse signals (drive signals Ss), and the signal lines 76 output a data signal Sd for the first, second, . . . , nth rows.

The above operation will be described in detail below with reference to FIGS. 39 through 44. FIG. 39 shows the waveforms of the data signal Sd and the drive signals Ss and the waveforms of drive voltages Vd produced by the data signal Sd and the drive signals Ss and applied to the actuators 22, with respect to the pixels in the first column, for example. FIG. 39 particularly shows the behaviors of the first through third rows.

Figure 40:
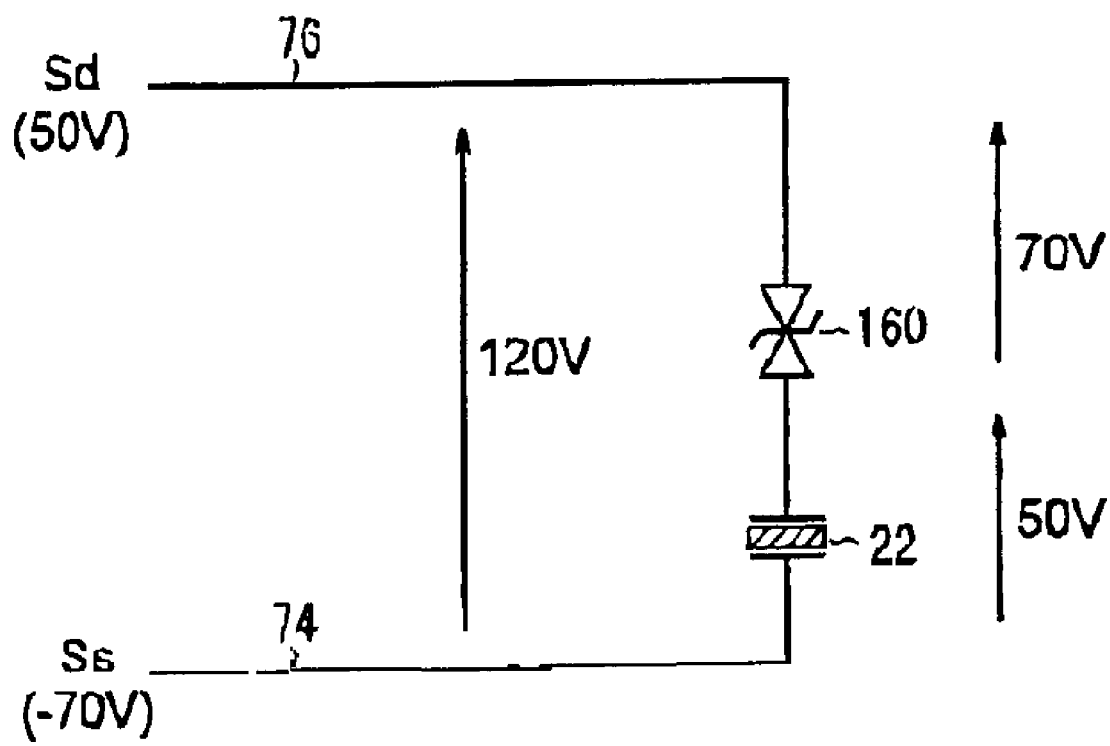
FIG. 40 is a circuit diagram showing the relationship between a voltage between a signal line and a select line, a voltage in an MIM element, and a voltage in an actuator, when an actuator is reset.

When the data signal Sd from the signal line 76 is an OFF level (50 V) and the drive signal Ss from the select line 74 is of a reset level (−70 V) at a time t41 (the first row in FIG. 39, the voltage between the signal line 76 and the select line 74 becomes 120 V as shown in FIG. 40. If the MIM device 160 has breakdown voltages of −70 V and 70 V, then since the MIM device 160 is turned on, i.e., the voltage across the MIM device 160 becomes a breakdown voltage of 70 V, the actuator 22 is displaced downwardly to extinguish (turn off) the pixel corresponding to the actuator 22.

Figure 41:
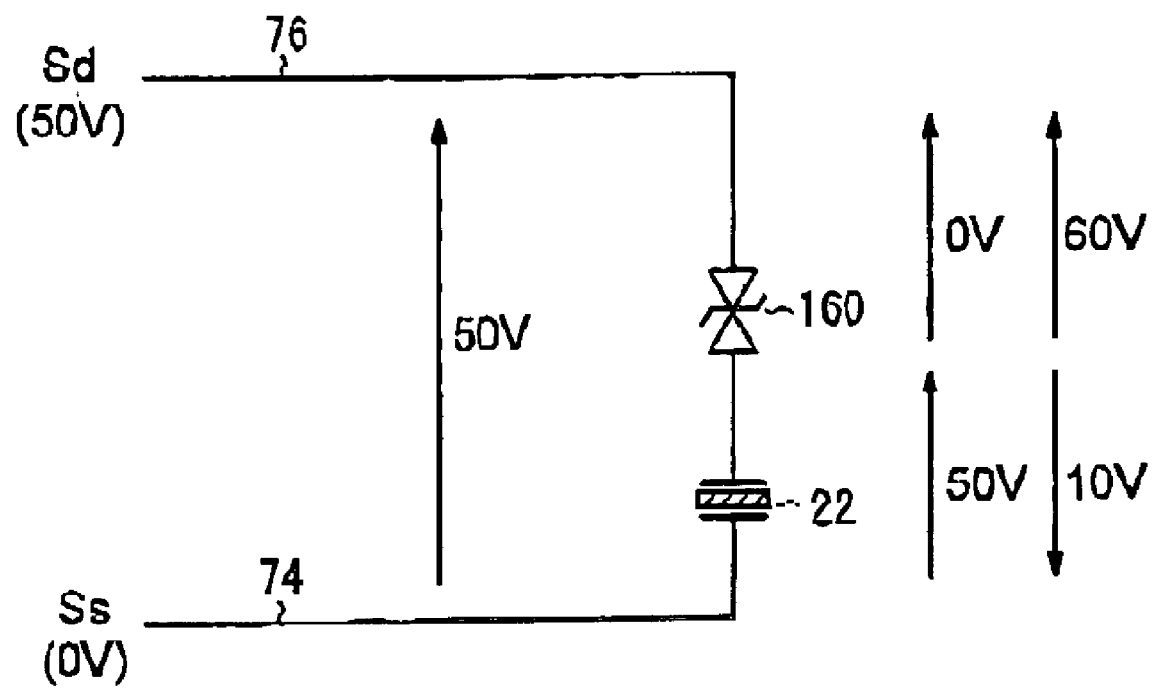
FIG. 41 is a circuit diagram showing the relationship between a voltage between a signal line with a data signal at an OFF level and a select line, a voltage in an MIM element, and a voltage in an actuator, when an actuator is unselected.

Thereafter at a time t42 (the first row) in FIG. 39, when the drive signal Ss from the select line 74 is of an unselect level (0 V), the voltage between the signal line 76 and the select line 74 becomes 50 V as shown in FIG. 41. At this time, since the MIM device 160 is turned off, i.e., the voltage across the MIM device 160 becomes 0 V, a high level voltage (50 V) is held across the actuator 22. The pixel corresponding to the actuator 22 thus remains turned off.

Figure 42:
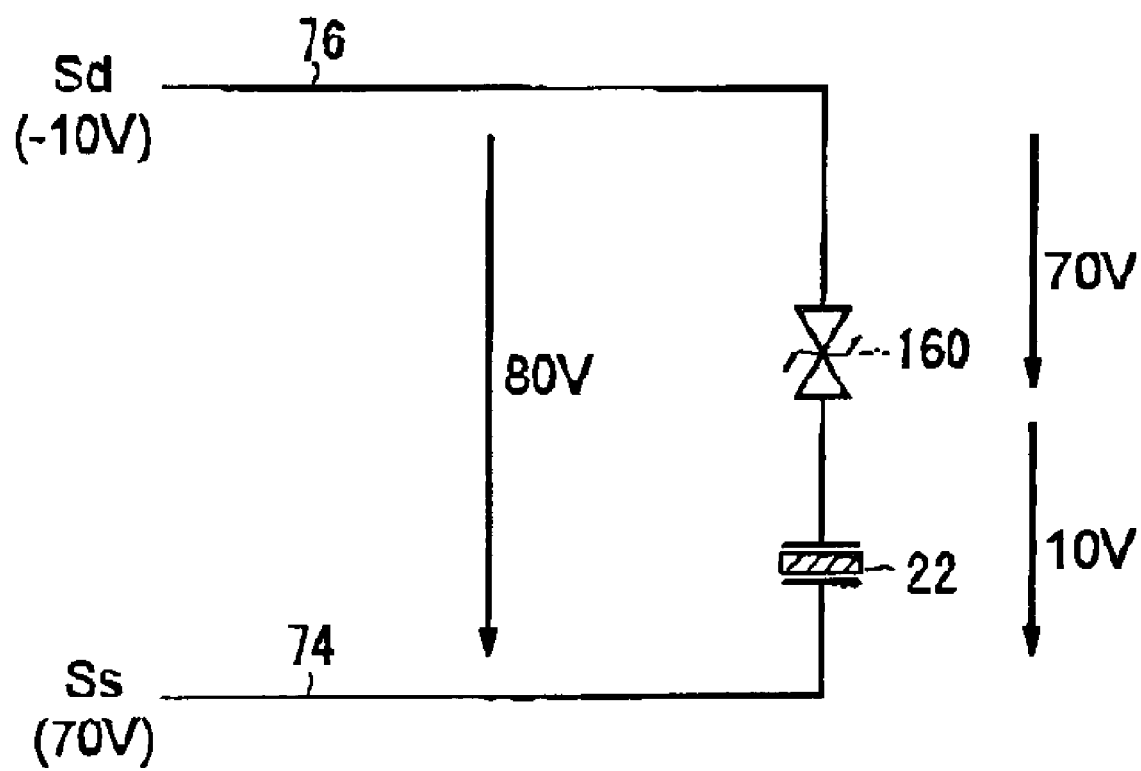
FIG. 42 is a circuit diagram showing the relationship between a voltage between a signal line with a data signal at an ON level and a select line, a voltage in an MIM element, and a voltage in an actuator, when an actuator is selected.

Thereafter at a time t43 (the first row) in FIG. 39, when the data signal Sd from the signal line 76 is of an ON level (−10 V) and the drive signal Ss from the select line 74 is of a select level (70 V), the voltage between the signal line 76 and the select line 74 becomes −80 V as shown in FIG. 42. At this time, since the MIM device 160 is turned on, i.e., the voltage across the MIM device 160 becomes a breakdown voltage of −70 V, a voltage of −10 V is applied to the actuator 22, which is displaced upwardly to energize (turn on) the pixel corresponding to the actuator 22.

Thereafter at a time t44 (the first row) in FIG. 39, when the data signal Sd from the signal line 76 is of an OFF level (50 V) and the drive signal Ss from the select line 74 is of an unselect level (0 V), the voltage between the signal line 76 and the select line 74 becomes 50 V as shown in FIG. 41. At this time, since the MIM device 160 is turned off, i.e., the voltage across the MIM device 160 becomes 60 V, a low-level voltage (−10 V) is held across the actuator 22. The pixel corresponding to the actuator 22 thus remains turned on.

Thereafter at a time t45 (the first row) in FIG. 39, when the data signal Sd from the signal line 76 is of an ON level (−10 V) and the drive signal Ss from the select line 74 is of an unselect level (0 V), the voltage between the signal line 76 and the select line 74 becomes −10 V as shown in FIG.

43. At this time, since the MIM device 160 is turned off, i.e., the voltage across the MIM device 160 becomes 0 V, a low-level voltage (−10 V) is held across the actuator 22. The pixel corresponding to the actuator 22 thus remains turned on.

Figure 44:
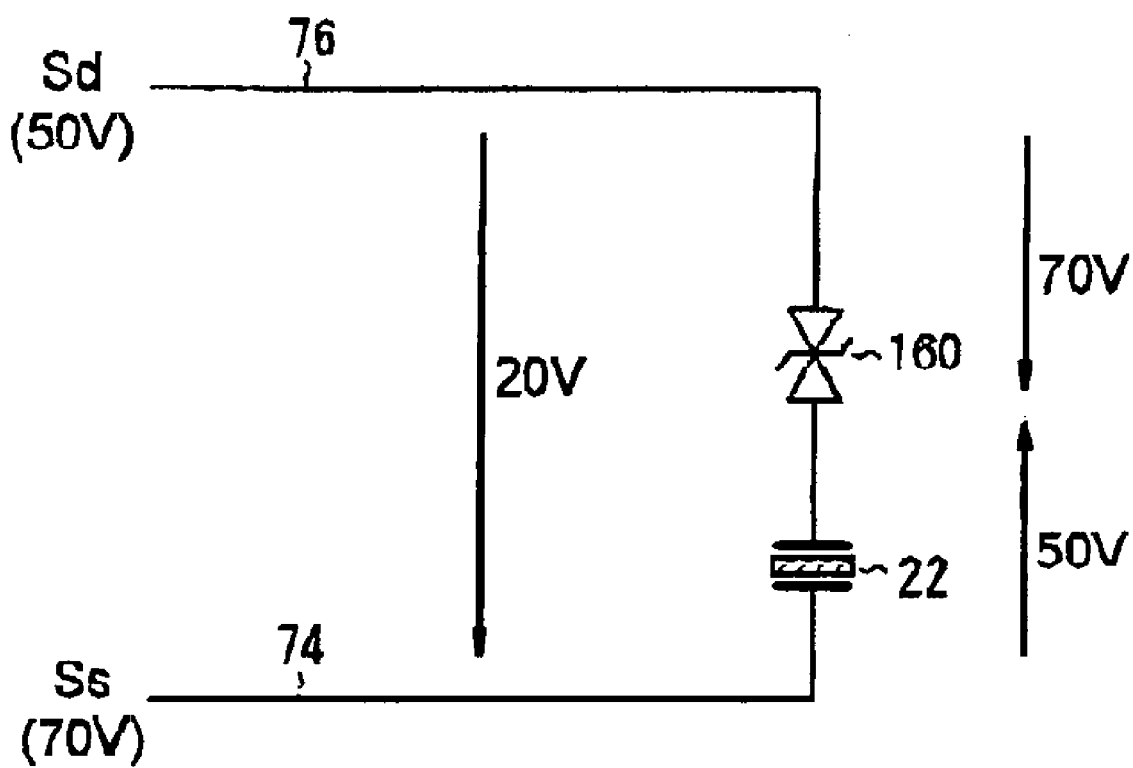
FIG. 44 is a circuit diagram showing the relationship between a voltage between a signal line with a data signal at an OFF level and a select line, a voltage in an MIM element, and a voltage in an actuator, when an actuator is selected.
Figure 46:
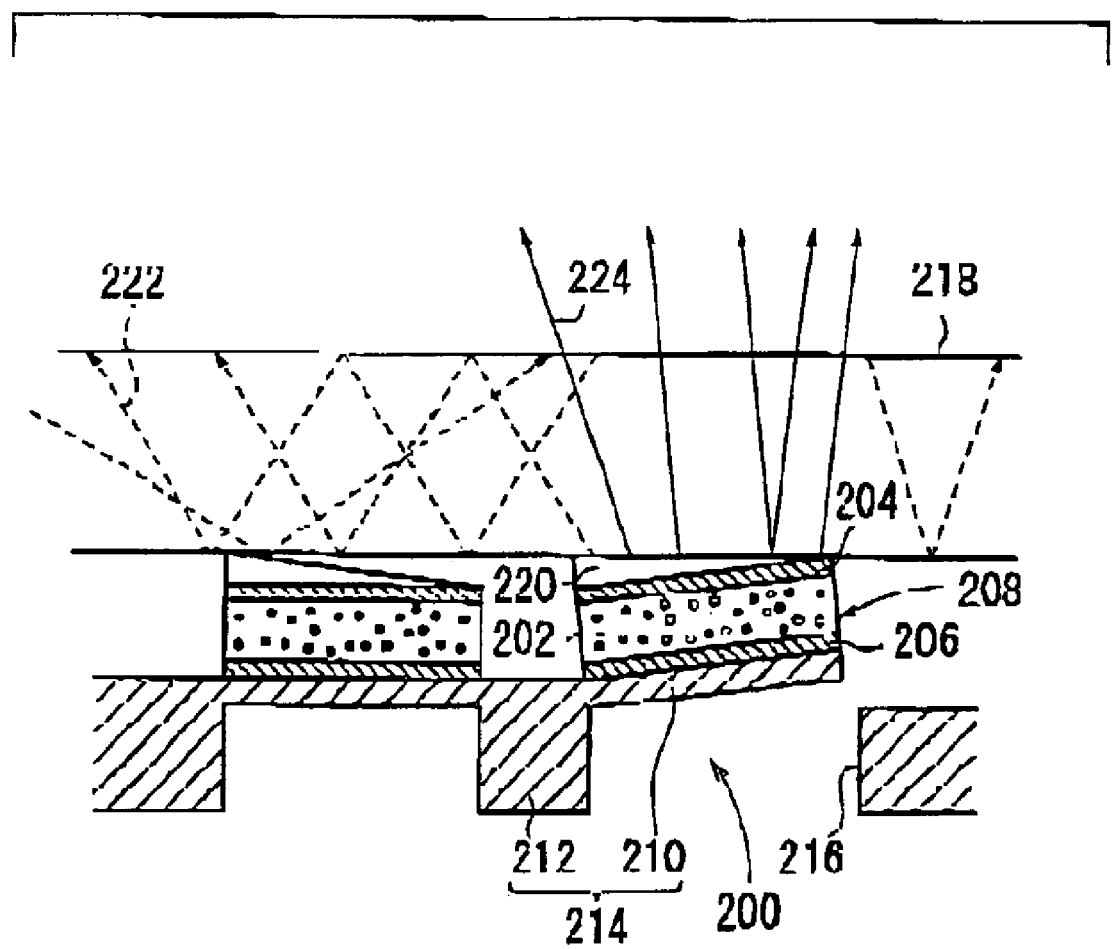
FIG. 46 is a view showing a proposed display device.
Figure 47:
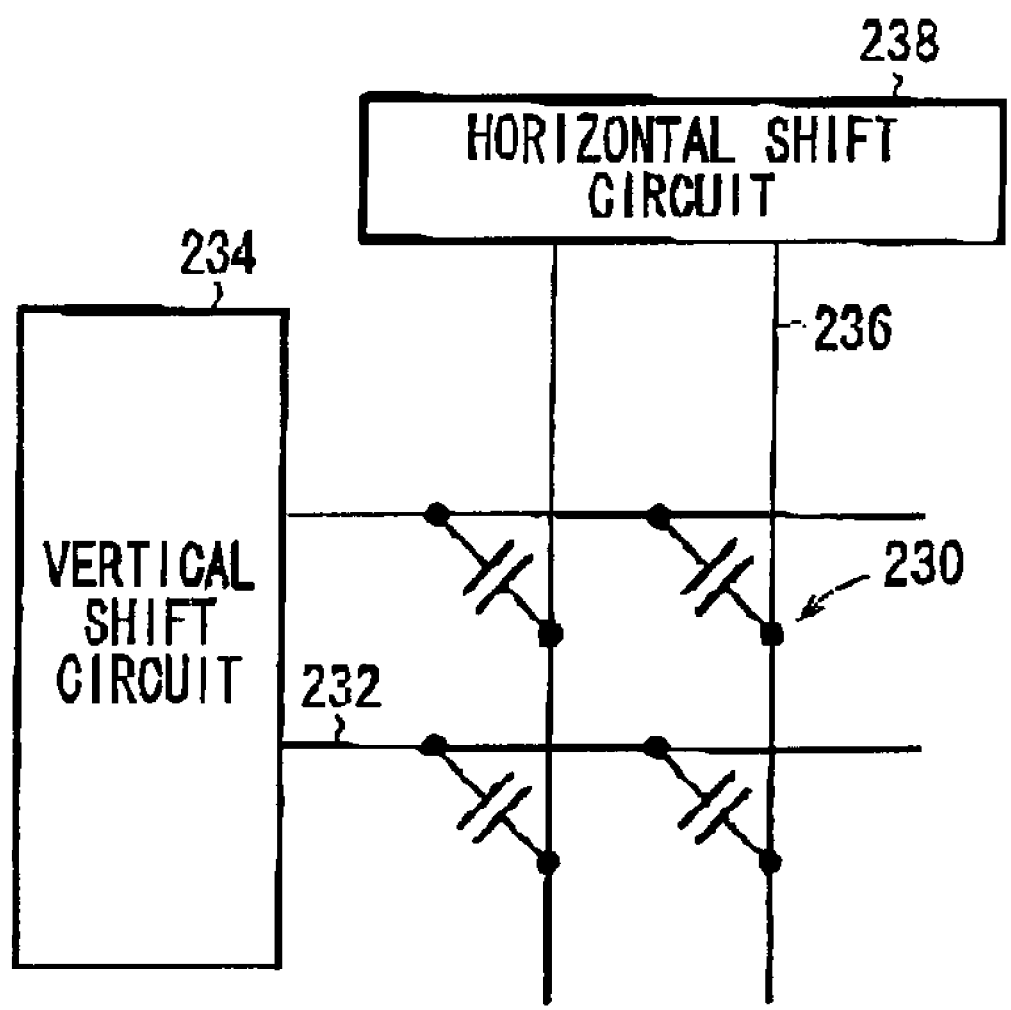
FIG. 47 is a block diagram showing peripheral circuits of the proposed display device.
Figure 48:
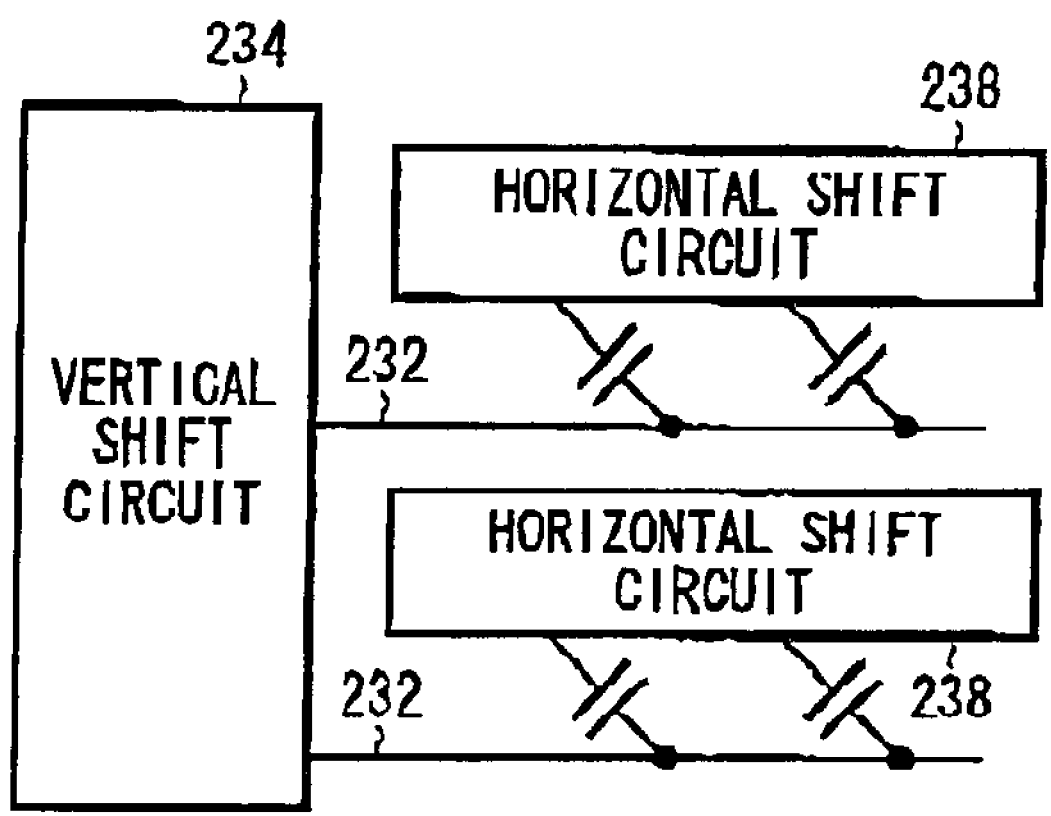
FIG. 48 is a block diagram showing other peripheral circuits of the proposed display device.
Figure 49:
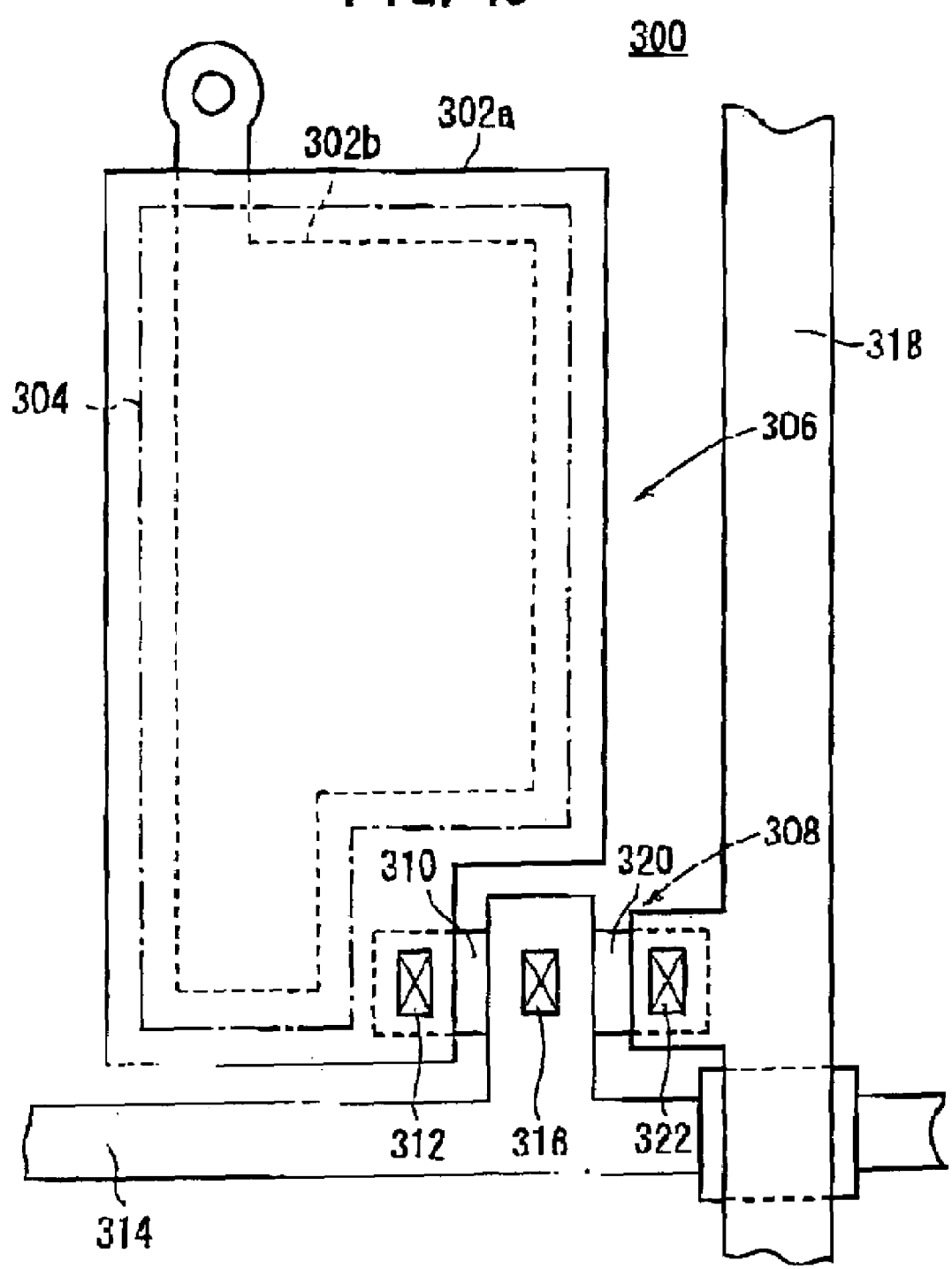
FIG. 49 is a plan view showing an actuator and its peripherals of another proposed display device.

At the time t44 (the second row) in FIG. 39, when the data signal Sd from the signal line 76 is of an OFF level (50 V) and the drive signal Ss from the select line 74 is of a select level (70 V), the voltage between the signal line 76 and the select line 74 becomes −20 V as shown in FIG. 44. At this time, since the MIM device 160 is turned on, i.e., the voltage across the MIM device 160 becomes a breakdown voltage of −70 V, the voltage of 50 V which was applied when previously reset is held across the actuator 22. The pixel corresponding to the actuator 22 thus remains turned off.

Figure 43:
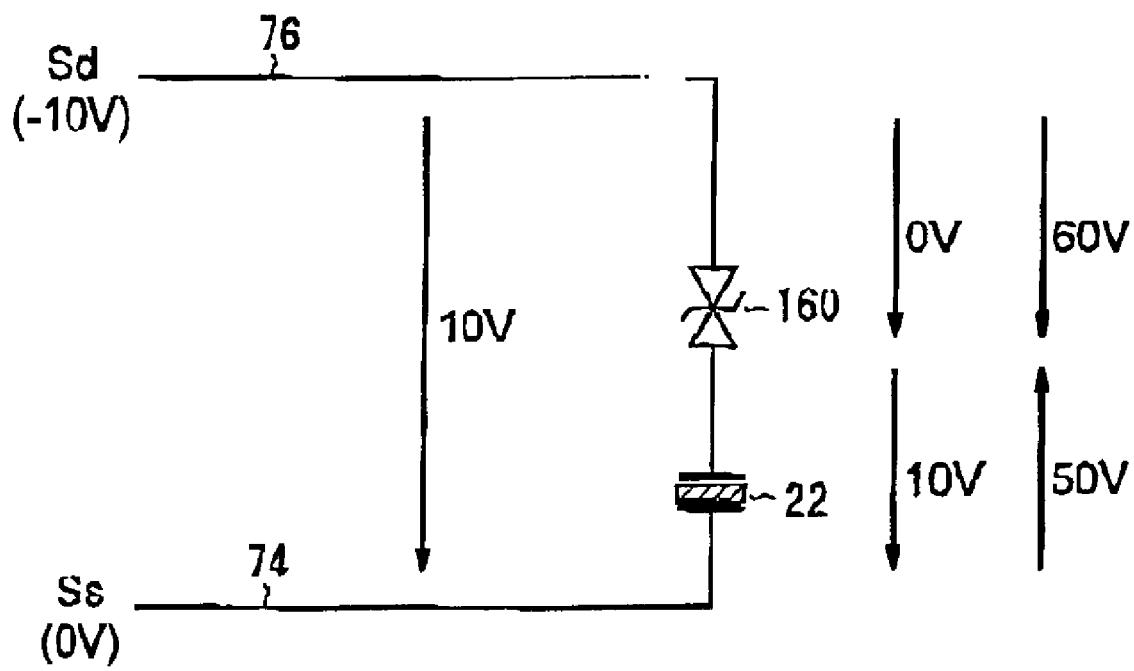
FIG. 43 is a circuit diagram showing the relationship between a voltage between a signal line with a data signal at an ON level and a select line, a voltage in an MIM element, and a voltage in an actuator, when an actuator is unselected.

At the time t45 (the third row) in FIG. 39, when the data signal Sd from the signal line 76 is of an ON level (−10 V) and the drive signal Ss from the select line 74 is of an unselect level (0 V), the voltage between the signal line 76 and the select line 74 becomes 10 V as shown in FIG. 43. AT this time, since the MIM device 160 is turned off, i.e., the voltage across the MIM device 160 becomes −60 V, the voltage of 50 V which was applied when previously selected is held across the actuator 22. The pixel corresponding to the actuator 22 thus remains turned off.

If a certain pixel which was turned on when previously selected is to be turned off when selected next time, then at least the pixel has to be reset (turned off), then unselected (turned off), and selected (turned off) in a state prior to the selection, resulting in a timing misalignment.

To avoid the above shortcoming, the continuation of an energized state following the continuation of an extinguished state may be carried out as a gradation expressing process for each frame as by (1) resetting the pixels in each frame to express a gradation starting from the reset state, i.e., the extinguished state, and (2) controlling the timing to change from the unselected (turned off) state to the selected (turned on) state depending on the gradation, and once the pixels are energized when selected (turned on), the energization is maintained until the pixels are reset.

If the drive unit 70 is fabricated on the circuit board 130, it is preferable, as shown in FIGS. 23 and 24, to form one or more ventilation holes 170 in the circuit board 130. The vent hole or holes 170 serve to increase the durability of the actuators 22 and the durability of the display elements 14 and the display device 10.

The actuator 22 may have its displacement capability (a displacement to be achieved under a given voltage) lowered due to usage over a long period of time, possibly failing to display an image properly. It has become clear that the reduction of the displacement capability is accelerated in the presence of moisture. It is generally known in the semiconductor and packaging technology that various defects are produced by moisture. In the display element 14 based on the displacement control of the actuator 22, various defects such as insulation failures or interconnection breaks due to a peel-off between the electrodes 48a, 48b and the piezoelectric/electrostrictive layer 46, cracks in the piezoelectric/electrostrictive layer 46, and a migration of the electrodes 48a, 48b, the generation of leakage currents, and internal pressure changes and shape changes due to heating, electrolysis and chemical combination.

In order to reduce defects caused due to moisture, it is also generally practiced to use a vacuum seal and a seal in the presence of an inactive gas or nitrogen as effective methods. The vent holes 170 can be used as a simple and highly effective method if it is difficult to use the above methods (using a vacuum seal and a seal in the presence of an inactive gas or nitrogen) or if it is difficult to achieve a complete seal.

One experiment will be described below. In this experiment, leakage currents with respect to a drive time (a continued displayed time from the start of the experiment) and the growth ratio of defective display elements 14 were observed with respect to a comparative example and an inventive example. In the comparative example, the circuit board 130 had no vent holes 170. In the inventive example, the circuit board 130 had two vent holes 170.

The results of the experiment are shown in FIG. 45. It will be seen from FIG. 45 that the leakage current of the comparative example was 2000 mA when the drive time reached 52 hours, and 6700 mA when the drive time reached 64 hours. The experiment on the comparative example was finished when the drive time reached 64 hours as it was impossible to continue the experiment further. The defective element growth rate at that time was 16%.

The leakage current of the inventive example was about 196 mA upon elapse of 451 hours and the defective element growth rate at that time was 1.3%. It can be understood that the durability of the inventive example was much greater than the durability of the comparative example.

It will be seen from the advantages of the display device and the display elements 14 according the present embodiment that the drive circuits 72 of the actuators 22 are more effective for designing the display device 10 for a higher definition capability than if the actuators were driven by a number of driver ICs having a high withstand voltage and a large output current.

In the above embodiments, a color pixel system has been described in which the pixels of the display elements 14 are arranged as dots of three colors of R, G, B (six actuators), as shown in FIG. 3, for example, for expressing colors with pixels of three primary colors. The present embodiment is effective not only for making a high definition display device according to the color pixel system, but also for making a high definition display device according to a light source switching system.

The light source switching system is a system for expressing colors by assigning a single pixel (white) to one actuator, dividing one frame into three subframes, and energizing/de-energizing the light sources of R, G, B in synchronism with the subframes.

A high definition display device according to the light source switching system requires a driver IC to have one output for one actuator though a drive IC may heretofore have one output for one dot (two actuators). Therefore, the cost of driver ICs and the packaging cost of driver ICs are large, and it is difficult to achieve a packaging space for driver ICs.

According to the present embodiment, since switching elements having a high withstand voltage and a large output current, such as TFTs, are formed integrally with a separate board (the circuit board 130) in a compact configuration, the display device is more advantageous from the standpoints of the cost and the freedom of panel design.

The display 10 can apply the active-matrix drive system which used the thin film transistor etc. Even when the pixel of the display unit does not have a memory effect, the state of the pixel can be maintained in the period which has not selected the pixel. The state of the pixel is in a luminescence state or the state which is not luminescence. Therefore, the display unit which has switching elements, such as the thin film transistor, for every pixel can be driven as the display unit with the memory effect, even if the pixel does not have the memory effect.

Moreover, although the above-mentioned example showed the case where the capacitive element was applied to the actuator part 22, it is also applicable to a liquid crystal cell or a PDP cell.

The display device according to the present invention is not limited to the above embodiments, but may be modified into various structures without departing from the scope of the invention.

What is claimed is:

1. A display device comprising:
   a display unit having capacitive elements arrayed at respective pixels and displaceable for turning on and off the corresponding pixels;
   a plurality of select lines for supplying instructions to select and unselect the pixels;
   a plurality of signals lines for supplying pixel signals to the pixels which have been selected; and
   a drive unit having drive circuits arrayed at respective pixels each for driving the corresponding capacitive element in response to an instruction from one of the select lines and a signal from one of the signal lines;
   each of said drive circuits having:
   a logic gate for inhibiting the inputting of a signal from said signal line when unselected and permitting the inputting of a signal from said signal line when selected, based on a select voltage applied from one of said select lines;
   a capacitor for holding the output of said logic gate when selected and outputting the held output as a control voltage; and
   a drive voltage generating circuit for generating a drive voltage for displacing said capacitive element based on said control voltage.

2. A display device according to claim 1, wherein a binary output of a low logic voltage is used as said control voltage and said select voltage.

3. A display device according to claim 1, wherein each of said capacitive elements has a capacitive structure having a pair of electrodes, and said drive voltage generating circuit has a thin film transistor having a gate to which said control voltage is applicable and a drain connected to one of the electrodes of said capacitive element.

4. A display device according to claim 1, wherein each of said capacitive elements has a capacitive structure having a pair of electrodes, and said drive voltage generating circuit comprises a push-pull circuit having a first thin film transistor and a second thin film transistor having respective gates to which said control voltage is applicable and connected in series to each other at a junction which is connected to one of the electrodes of said capacitive element.

5. A display device according to claim 4, wherein said first thin film transistor and said second thin film transistor are connected in series between a power supply of a high voltage, and a power supply of a low voltage,
   said second thin film transistor have four terminals,
   said power supply of said high voltage is connected to said second thin film transistor,
   a bias terminal is connected to the semiconductor substrate of said second thin film transistor, and
   the bias terminal is electrically separated from the source of said second thin film transistor.

6. A display device according to claim 1, wherein said drive voltage generating circuit has a first thin film transistor and a second thin film transistor,
   a control voltage is supplied to the gate of said first thin film transistor,
   said second thin film transistor controls a output current supplied to the capacitive element.

7. A display device according to claim 6, wherein said second thin film transistor have four terminals,
   a bias terminal is connected to the semiconductor substrate of said second thin film transistor, and
   the bias terminal is electrically separated from the source of said second thin film transistor.

8. A display device according to claim 7, wherein a gate and a source of said second thin film transistor are connected electrically.

9. A display device according to claim 1, wherein said logic gate comprises an analog switch.

10. A display device according to claim 1, wherein said logic gate comprises a transfer gate.

11. A display device according to claim 1, wherein at least said capacitive elements are disposed on a first board and at least said drive unit is disposed on a second board, said first board and said second board being bonded to each other.

12. A display device according to claim 11, wherein said select lines and said signal lines are disposed on said second board.

13. A display device according to claim 11, wherein said drive voltage generating circuit has an open-drain circuit arrangement and has a pull-up resistor disposed on said first substrate.

14. A display device according to claim 1, wherein said display unit has a light waveguide panel for introducing therein light from a light source, and has a function to display an image depending on an image signal inputted thereto on said light waveguide panel by controlling said capacitive elements to be displaced into contact with and away from said light waveguide panel depending on an attribute of said image signal, thereby to control leakage light from regions of said light waveguide panel.

15. A display device according to claim 1, wherein said capacitive element is an actuator.

16. A display device comprising:
    a plurality of capacitive elements arrayed at respective pixels and displaceable for turning on and off the corresponding pixels;
    a plurality of select lines for supplying select and unselect signals to the pixels;
    a plurality of signals lines for supplying pixel signals to the pixels which have been selected; and
    a drive unit having drive circuits arrayed at respective pixels each for driving the corresponding capacitive element in response to an instruction from one of the select lines and a signal from one of the signal lines;
    each of said drive circuits having:
    a transistor having a drain for being supplied with a signal from one of said signal lines and a gate for being supplied with a signal from one of said select lines, for applying a drive voltage to displace said capacitive element;
    a capacitor for keeping said drive voltage when unselected at a constant level, said gate of the transistor and said select line being AC-coupled by said capacitor; and
    a resistor connected between a junction between said gate of the transistor and said capacitor and the source of said transistor.

17. A display device according to claim 16, wherein each of said thin film transistors comprises an array of small-size transistors, said small-size transistors having respective sources and drains connected in common and constructed as a single module for performing switching operation with a common gate signal.

18. A display device comprising:
- a plurality of capacitive elements arrayed at respective pixels and displaceable for turning on and off the corresponding pixels;
- a plurality of select lines for supplying reset, select, and unselect signals to the pixels;
- a plurality of signals lines for supplying pixel signals to the pixels which have been selected; and
- a drive unit having drive circuits arrayed at respective pixels each for driving the corresponding capacitive element in response to an instruction from one of the select lines and a signal from one of the signal lines;
- each of said capacitive elements having a capacitive structure having a pair of electrodes, one of said electrodes being connected to one of the select lines;
- each of said drive circuits having a two-terminal nonlinear device connected between the other electrodes of one of said capacitive elements and one of the signal lines.

19. A display device comprising:
- a display unit disposed on a first board and having capacitive elements arrayed at respective pixels and displaceable for turning on and off the corresponding pixels; and
- a drive unit disposed on a second board and having drive circuits arrayed at respective pixels each for driving the corresponding capacitive element in response to an input signal;
- said first board and said second board being bonded to each other;
- said second board having at least one vent hole defined therein.

* * * * *